(12) United States Patent
Tsukiji et al.

(10) Patent No.: US 6,782,028 B2
(45) Date of Patent: Aug. 24, 2004

(54) SEMICONDUCTOR LASER DEVICE FOR USE IN A SEMICONDUCTOR LASER MODULE AND AN OPTICAL AMPLIFIER

(75) Inventors: Naoki Tsukiji, Chiyoda-ku (JP); Junji Yoshida, Chiyoda-ku (JP); Masaki Funabashi, Chiyoda-ku (JP); Toshio Kimura, Chiyoda-ku (JP); Takeshi Aikiyo, Chiyoda-ku (JP); Takeo Shimizu, Chiyoda-ku (JP); Toshiro Yamamoto, Chiyoda-ku (JP); Tomoaki Toratani, Chiyoda-ku (JP); Hiroshi Matsuura, Chiyoda-ku (JP); Mieko Konishi, Chiyoda-ku (JP); Masashi Nakae, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/015,656

(22) Filed: Dec. 17, 2001

(65) Prior Publication Data

US 2002/0097766 A1 Jul. 25, 2002

(30) Foreign Application Priority Data

Dec. 15, 2000 (JP) .................................. 2000-381936
Jul. 2, 2001 (JP) .................................. 2001-201513
Oct. 23, 2001 (JP) .................................. 2001-325706

(51) Int. Cl.$^7$ ............................................... H01S 5/00
(52) U.S. Cl. ........................................ 372/50; 372/75
(58) Field of Search ........................ 372/29.016, 29.01, 372/29.02, 98–108, 50

(56) References Cited

U.S. PATENT DOCUMENTS

| 4,805,977 | A | | 2/1989 | Tamura et al. |
| 4,822,151 | A | | 4/1989 | Tatsuno et al. |
| 5,291,571 | A | | 3/1994 | Kunikane et al. |
| 5,428,695 | A | * | 6/1995 | Ohta .............................. 385/14 |
| 5,533,152 | A | | 7/1996 | Kessler |
| 5,606,439 | A | * | 2/1997 | Wu .............................. 349/117 |
| 5,692,082 | A | | 11/1997 | Fukushima |
| 5,812,716 | A | * | 9/1998 | Ohishi .......................... 385/92 |
| 5,845,030 | A | * | 12/1998 | Sasaki et al. .................. 385/88 |
| 5,930,039 | A | * | 7/1999 | Li et al. ....................... 359/484 |
| 6,115,401 | A | * | 9/2000 | Scobey et al. .............. 372/100 |
| 6,282,025 | B1 | * | 8/2001 | Huang et al. ................ 359/495 |
| 6,285,699 | B1 | * | 9/2001 | Naito et al. .................. 372/46 |
| 6,362,919 | B1 | * | 3/2002 | Flanders ...................... 359/497 |
| 6,404,542 | B1 | * | 6/2002 | Ziari et al. ................. 359/341.3 |
| 6,429,964 | B1 | * | 8/2002 | Delavaux et al. ......... 359/337.3 |
| 2003/0007534 | A1 | | 1/2003 | Kanemaru et al. |

FOREIGN PATENT DOCUMENTS

| EP | 0 312 652 | 4/1989 |
| EP | 1 085 622 | 3/2001 |
| JP | 63-115145 | 5/1988 |
| JP | 1-291480 | 11/1989 |
| JP | 3-135511 | 6/1991 |

(List continued on next page.)

OTHER PUBLICATIONS

Y. Emori, et al., Furukawa Review, No. 19, pp. 59–62, "Demonstration of Broadband Raman Amplifiers: A Promising Application of High–Power Pumping Unit", 2000.

Primary Examiner—Paul Ip
Assistant Examiner—Tuan Nguyen
(74) Attorney, Agent, or Firm—Oblon, Spivak, McClelland, Maier & Neustadt, P.C.

(57) ABSTRACT

A single semiconductor laser device used in a semiconductor laser module of an optical amplifier and having a first light emitting stripe with a diffraction grating and at least one other light emitting stripe with a diffraction grating and which are aligned to respectively emit a first laser beam and at least one other laser beam through one edge surface.

35 Claims, 35 Drawing Sheets

FOREIGN PATENT DOCUMENTS

| | | |
|---|---|---|
| JP | 4-180282 | 6/1992 |
| JP | 4-369888 | 12/1992 |
| JP | 5-53082 | 3/1993 |
| JP | 5-121838 | 5/1993 |
| JP | 7-72426 | 3/1995 |
| JP | 7-99477 | 4/1995 |
| JP | 8-248259 | 9/1996 |
| JP | 8-254668 | 10/1996 |
| JP | 9-162490 | 6/1997 |
| JP | 9-214022 | 8/1997 |
| JP | 10-62720 | 3/1998 |
| JP | 10-062720 | * 3/1998 ........... G02B/27/28 |
| JP | 2001-59925 | 3/2001 |

* cited by examiner

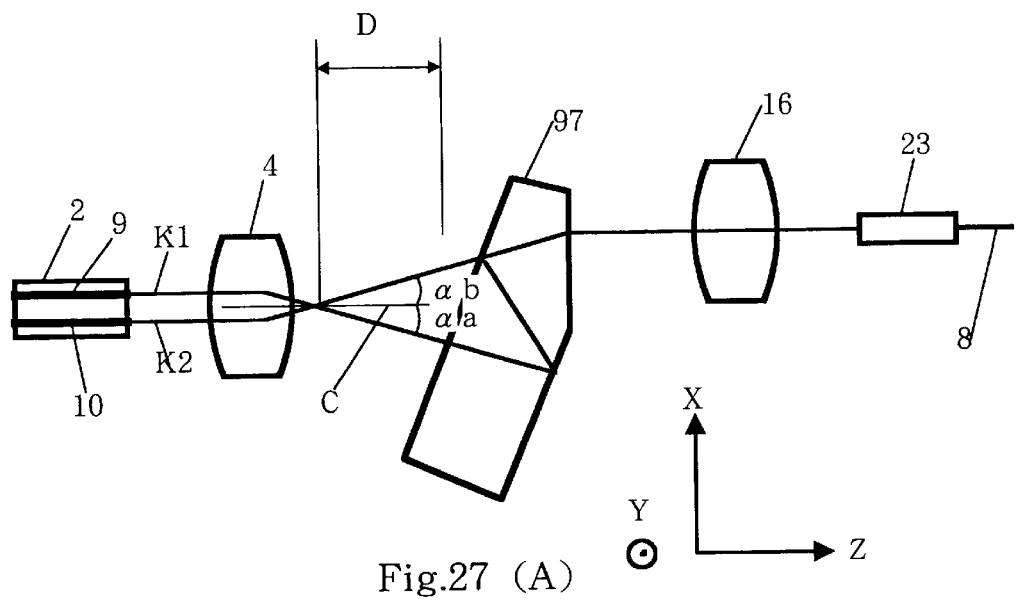
Fig.27 (A)
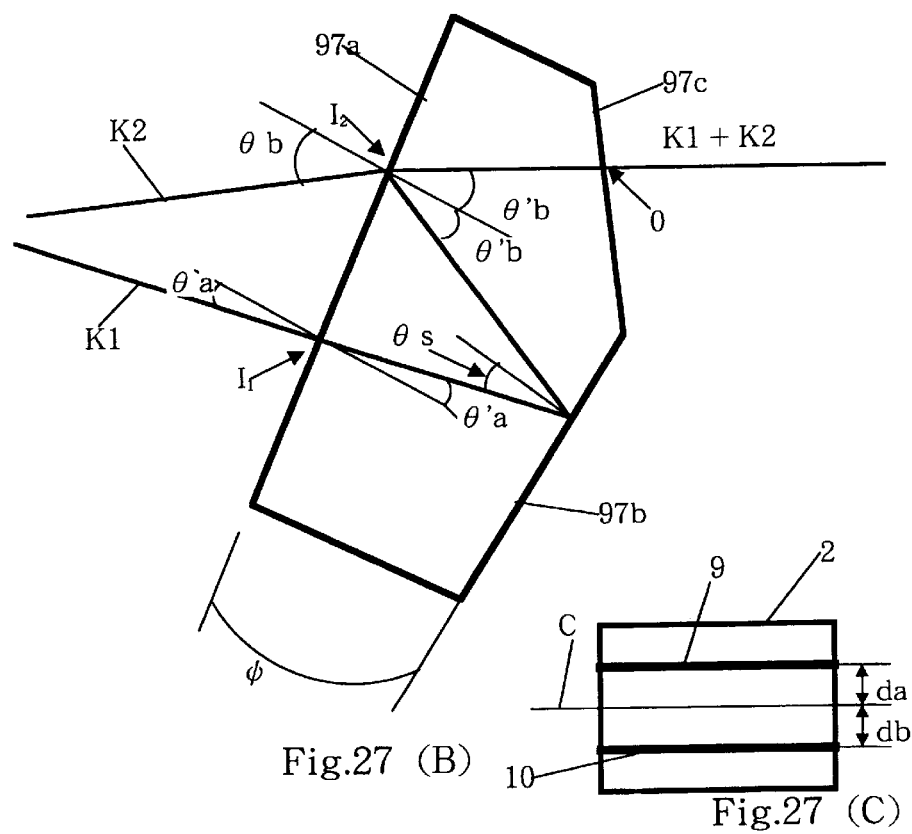
Fig.27 (B)
Fig.27 (C)

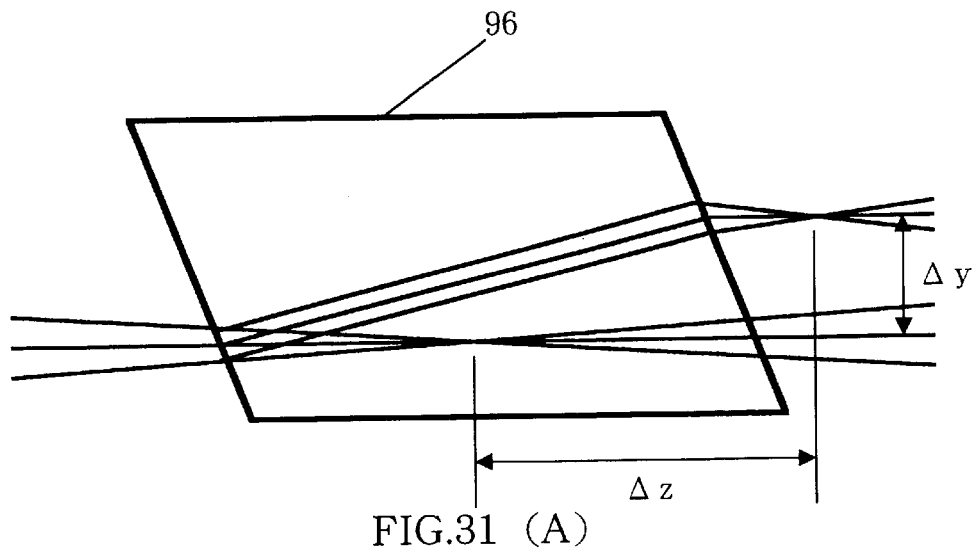
FIG.31 (A)
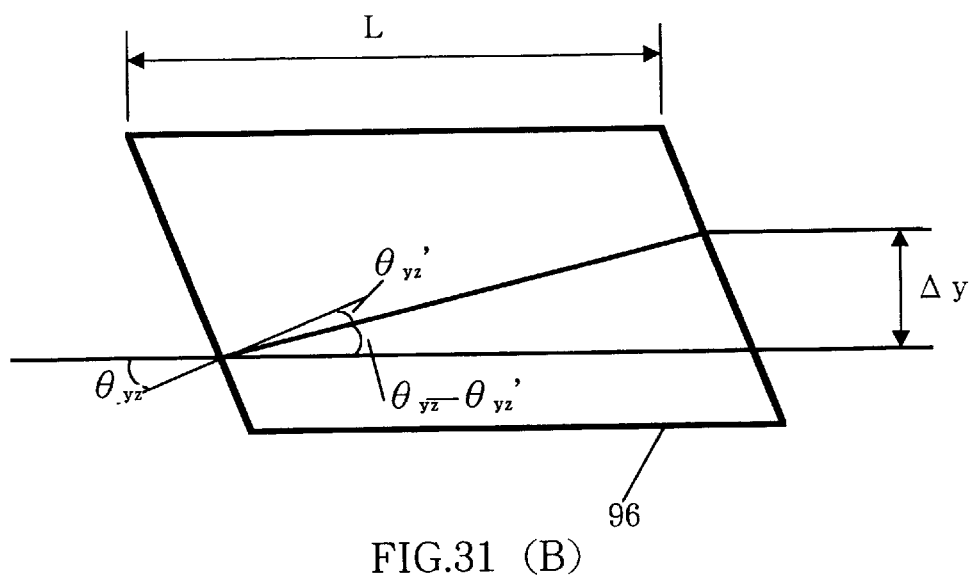
FIG.31 (B)
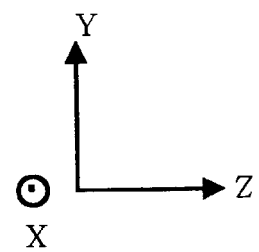

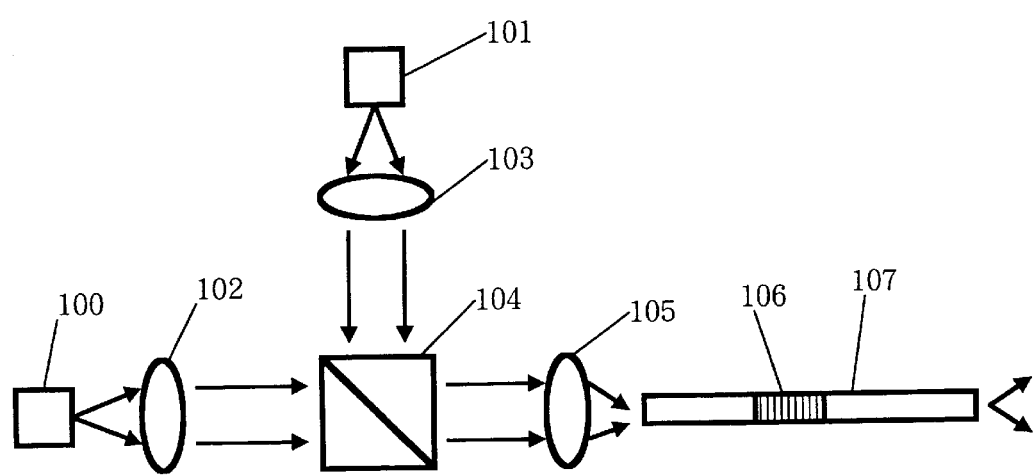
Fig.35
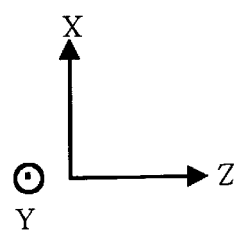

US 6,782,028 B2

SEMICONDUCTOR LASER DEVICE FOR USE IN A SEMICONDUCTOR LASER MODULE AND AN OPTICAL AMPLIFIER

BACKGROUND OF THE INVENTION

1. Field of the Invention

The present invention relates to a semiconductor laser module, and an optical amplifier using the semiconductor laser module, and more particularly, to a semiconductor laser device provided with two stripes from which two laser beams are emitted, and an optical amplifier.

2. Discussion of the Background

With progress in optical communications based on a high-density wavelength division multiplexing transmission system over the recent years, a higher output is increasingly demanded to a pumping light source used for the optical amplifier.

Further, a greater expectation is recently given to a Raman amplifier as means for amplifying the beams having a much broader band than by an erbium-doped optical amplifier that has hitherto been used as the optical amplifier. The Raman amplification is defined as a method of amplifying the optical signals, which utilizes such a phenomenon that a gain occurs on the side of frequencies as low as about 13 THz from a pumping beam wavelength due to the stimulated Raman scattering occurred when the pumping beams enter an optical fiber, and, when signal beams having the wavelength band containing the gain described above are inputted to the optical fiber in the thus pumped (excited) state, these signal beams are amplified.

According to the Raman amplification, the signal beams are amplified in a state where a polarizing direction of the signal beams is coincident with a polarizing direction of the pumping beams, and it is therefore required that an influence caused by a deviation between polarizing planes of the signal beam and of the pumping beam be minimized. For attaining this, a degree of polarization (DOP) has hitherto been reduced by obviating the polarization of the pumping beam (depolarization).

As a method for simultaneously realizing a higher output and depolarization of a pumping light source, as disclosed in U.S. Pat. No. 5,589,684, a method in which a laser beam emitted from two semiconductor laser modules oscillating on the same wavelength is polarization-synthesized by a polarization synthesizing coupler is known.

FIG. 35 is an explanatory view in explaining a conventional semiconductor laser apparatus disclosed in U.S. Pat. No. 5,589,684.

As shown in FIG. 35, a conventional semiconductor laser apparatus comprises: a first semiconductor laser device 100 and a second semiconductor laser device 101 for emitting laser beams in the orthogonal direction with each other on the same wavelength; a first collimation lens 102 for collimating the laser beam emitted from the first semiconductor laser device 100; a second collimation lens 103 for collimating the laser beam emitted from the second semiconductor laser device 101; a polarization synthesizing coupler 104 for orthogonally polarization-synthesizing the laser beam collimated by the first collimation lens 102 and the second collimation lens 103; a condenser lens 105 for condensing the laser beams polarization-synthesized by the polarization synthesizing coupler 104; and an optical fiber 107 with a fiber Bragg grating (FBG) 106 for receiving the laser beams condensed by the condenser lens 105 and letting the beams travel to the outside.

According to a conventional semiconductor laser apparatus, since the laser beams emitted in the orthogonal direction with each other from the first semiconductor laser device 100 and the second semiconductor laser device 101 are polarization-synthesized by the polarization synthesizing coupler 104, a laser beam whose degree of polarization is small can be emitted from the optical fiber 107. Furthermore, since fiber Bragg grating 106 is formed in the optical fiber 107, oscillation wavelengths of the semiconductor laser devices 100 and 101 are fixed in the same degree, a laser beam whose wavelength is fixed can be emitted from the optical fiber 107.

Accordingly, the above-mentioned conventional semiconductor laser apparatus can be applied as a pumping light source of an optical amplifier which requires a high optical output, especially of a Raman amplifier, which requires a low polarization dependency and a wavelength stability.

A conventional semiconductor laser apparatus has the following problems.

(1) In the conventional semiconductor laser apparatus, two chip carriers with two semiconductor laser devices 100 and 101 attached thereto respectively need to be disposed on a base plate by soldering. At this time, since positioning need to be conducted so that laser beams emitted from the two semiconductor laser devices 100 and 101 be orthogonal with each other, it is difficult to conduct the positioning of the semiconductor laser devices and a time for positioning becomes longer. As a result, a time for manufacturing a semiconductor laser module is increased.

(2) Since the beams emitted from each of the semiconductor laser devices 100 and 101 are emitted in completely different directions from each other, there arises, for example, a warp of a package in which optical components are aligned and fixed under a state of a high temperature. Due to this, it is difficult to stabilize beam intensity and a degree of polarization of the beam emitted from the optical fiber.

(3) In the conventional semiconductor laser apparatus, since collimation lenses 102 and 103 for collimating the laser beams emitted from the semiconductor laser device 100 are used, a beam diameter and an image magnification are enlarged. Therefore, there is a problem in that a tolerance for the position and angle is strict.

(4) In order to cool the two semiconductor laser devices 100 and 101 positioned at a space, a large-sized Peltier module is required. As a result, there is a problem in that the electric power consumption of a semiconductor laser module is increased.

(5) In the conventional semiconductor laser apparatus, an optical fiber with the fiber Bragg grating 106 and the semiconductor laser devices 100 and 101 need to be optically coupled. Since the optical coupling is performed mechanically in a resonator, there is a fear that an oscillation characteristic of the laser beam is changed due to a mechanical vibration. Therefore, there is a problem in that it is impossible to provide a stable optical output in some cases.

(6) Wavelengths of the laser beams emitted from each of the semiconductor laser devices 100 and 101 are determined by a sole FBG and thus a degree of freedom for setting up the wavelengths of each of the stripes is not provided.

Furthermore, when this semiconductor laser device is regarded as a pumping light source used for the Raman amplification, there are the following problems.

(7) In the conventional semiconductor laser device, since the semiconductor laser devices 100 and 101 and the fiber Bragg grating 106 are widely spaced, relative intensity noise (RIN) is made loud due to resonance between the fiber Bragg grating 106 and an optical reflection surface. For example, since amplification occurs at an early stage in the Raman amplification, if a pumping beam intensity fluctuates, a Raman gain also fluctuates. Therefore, fluctuation of the Raman gain is outputted as fluctuation of an amplified signal intensity as it is and there is a problem in that a stable Raman amplification can not be conducted.

(8) As an optical amplification method, in addition to a back pumping method in which a pumping beam is supplied in the opposite direction of the traveling direction of the signal beam, there is a forward pumping method in which a pumping beam is supplied in the same direction of the traveling direction of the signal beam and a bidirectional pumping method in which pumping is conducted from both the directions. At present, the back pumping method is mainly used as the Raman amplifier. This is because in the forward pumping method in which a weak signal beam moves together with a strong pumping beam in the same direction, there is a problem in that the fluctuation of the pumping beam intensity largely influences on the fluctuation of the amplified signal beam. Therefore, a stable pumping light source which can be applied to the forward pumping method is demanded. In other words, when the semiconductor laser module using a conventional fiber Bragg grating is employed, there is a problem in that applicable pumping methods are limited.

(9) In the Raman amplification in the Raman amplifier, it is defined as a condition that the polarizing direction of the signal beams is coincident with the polarizing direction of the pumping beams. That is, in the Raman amplification, there is a polarization dependency of an amplification gain, and an influence due to a deviation between the polarizing direction of the signal beam and the polarizing direction of the pumping beam should be minimized. Here, in the case of the back pumping method, since polarization becomes random during propagation in the signal beam, there arises no problem. However, in the case of the forward pumping method, polarization dependency is strong and thus the polarization dependency needs to be reduced by orthogonal polarization synthesizing of the pumping beam, depolarization and the like.

In other words, a degree of polarization (DOP) needs to be minimized. Furthermore, since in Raman amplification, the obtained amplification ratio is relatively low, a pumping light source for the Raman amplification having a high output has been demanded.

SUMMARY OF THE INVENTION

In contrast to the prior art, the embodiments of the present invention are for a semiconductor laser module, a manufacturing method thereof and an optical amplifier that are capable of obtaining a high optical coupling efficiency, attaining a down-size and a mass-production, and reducing both of a manufacturing time and a manufacturing cost.

The present invention provides a semiconductor laser device having a plurality of stripes formed at a space, wherein laser beams are emitted from one-sided edge surfaces of the respective stripes and diffraction gratings are provided in the respective stripes.

In particular, the present invention provides a semiconductor laser device comprising a first light emitting stripe aligned to emit a first laser beam through one edge surface and at least one other light emitting stripe aligned to emit at least one other laser beam through the one edge surface, wherein the first light emitting stripe aligned to emit the first laser beam through the one edge surface and an opposite edge surface and the least one other light emitting stripe aligned to emit at the least one other laser beam through the one edge surface and the opposite edge surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 8(B) and 8(C) are sectional views each taken along the line a—a in FIG. 8(A);

FIGS. 15(B) and 15(C) are a sectional view taken along the line b—b in FIG. 15(A) and a sectional view taken along the line c—c in FIG. 15(A), respectively;

FIG. 27 is an explanatory diagram schematically showing a configuration of the semiconductor laser module in accordance with a sixteenth embodiment of the present invention;

FIG. 28 is a graph showing a beam transmissivity when entering a wavelength selection filter 7a;

FIG. 31 is an explanatory diagram showing a light path correction prism;

FIG. 35 is an explanatory diagram showing a conventional semiconductor laser device disclosed in U.S. Pat. No. 5,589,684.

DESCRIPTION OF THE PREFERRED EMBODIMENTS

Figure 1:
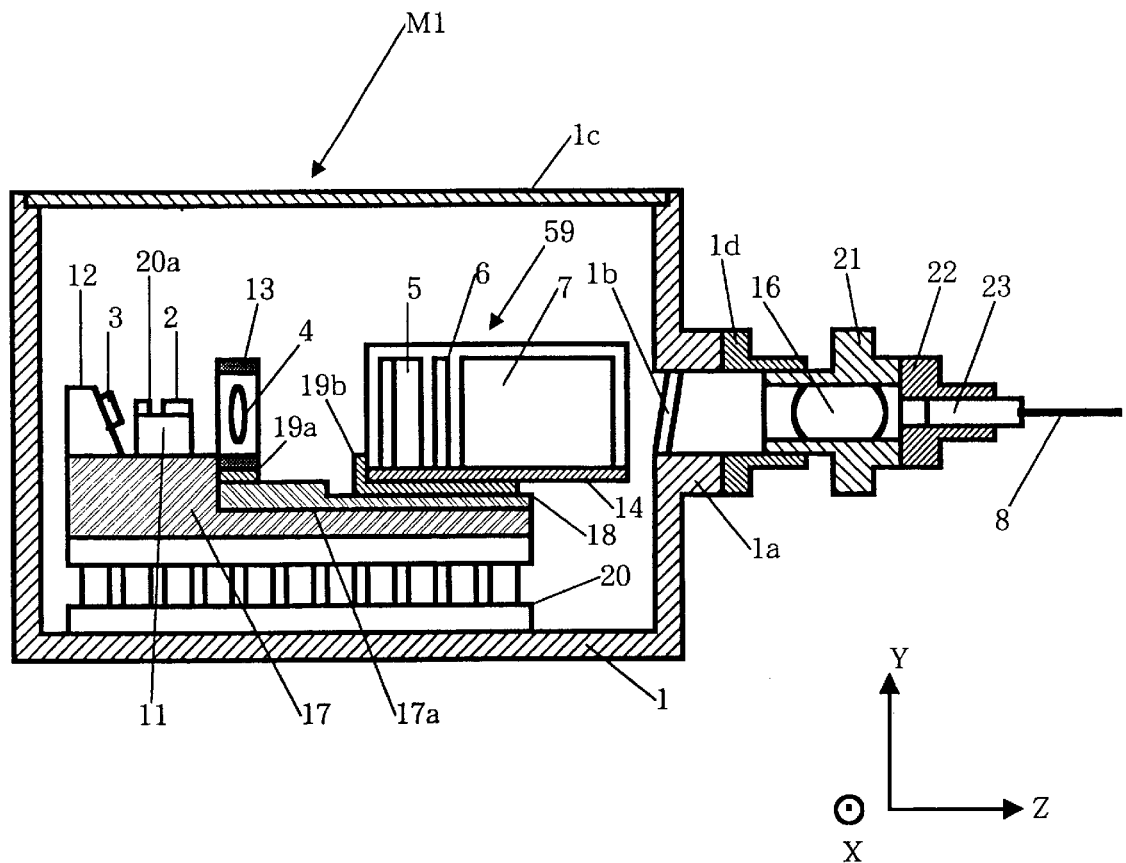
FIG. 1(A) is a side sectional view showing a configuration of a semiconductor laser module in accordance with a first embodiment of the present invention.
FIG. 1(B) is a side view showing a state where a semiconductor laser device is fixed onto a heat sink.
Figure 1:
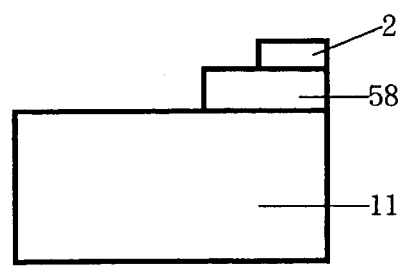

Embodiments of the present invention will hereinafter be described in comparison with the prior arts with reference to the accompanying drawings.

The present invention has been made in view of solving the above and an object of the present invention is therefore to provide a semiconductor laser device, a semiconductor laser module and an optical amplifier using the semiconductor laser module, which are applicable to a light source used for an optical amplifier and the like which can be manufactured easily, can stabilize the optical characteristic of the wavelength of the laser beam and the like, and can obtain a high gain.

(First Embodiment)

FIG. 1(A) is a side sectional view showing a configuration of the semiconductor laser module in accordance with a first embodiment of the present invention. FIG. 2 is an explanatory diagram schematically showing the configuration of the semiconductor laser module in accordance with the first embodiment of the present invention.

As shown in FIG. 1(A), a semiconductor laser module M1 in accordance with the first embodiment of the present invention includes a package 1 of which an interior is hermetically sealed, a semiconductor laser device 2, encased in the package 1, for emitting laser beams, a photo diode (a light receiving element) 3, a first lens 4, a prism 5, a half-wave plate (a polarization rotating element) 6, a PBC (polarization beam combiner) 7 serving as an optical synthesizing element and an optical fiber 8.

The semiconductor laser device 2 includes, as shown in FIG. 2, a first stripe 9 (a stripe-shaped light emitting portion) and a second stripe 10 disposed with an interval on the same plane and extending in parallel in the longitudinal direction. The semiconductor laser device 2 emits a first laser beam K1 and a second laser beam K2 respectively from edge surfaces of the first and second stripes 9, 10. K1 and K2 shown in FIG. 2 represent trajectories of the centers of the beams that exit the first and second stripes 9, 10, respectively. The beam travels, as indicated by a broken line in FIG. 2, with some divergence (spread) about the center thereof A space between the first stripe 9 and the second stripe 10 is set as 100 μm or less e.g., approximately 40–60 μm in order for the beams K1, K2 exiting these stripes 9, 10 to enter one piece of first lens 4. Moreover, the space between the stripes is narrow, whereby a difference in optical output characteristic between the stripes decreases.

As shown in FIG. 1(A), the semiconductor laser device 2 is fixedly fitted onto a chip carrier 11. Note that the semiconductor laser device 2 emits the two laser beams K1, K2 and is therefore easier to become exothermic than a semiconductor laser device for emitting the single laser beam. It is therefore preferable that the semiconductor laser device 2 be fixedly fitted onto a heat sink 58 composed of a material exhibiting a high thermal conductivity such as diamond and so forth, and that the heat sink 58 be fixedly fitted onto the chip carrier 11.

The photo diode 3 receives a monitor-oriented laser beam emitted from a rear-sided (left-sided in FIG. 1(A)) edge surface 2b (see FIG. 2) of the semiconductor laser device 2. The photo diode 3 is fixedly attached to a photo diode carrier 12.

The first and second laser beams K1, K2 exiting a front-sided (right-sided in FIG. 1(A)) edge surface 2a of the semiconductor laser device 2 are incident upon the first lens 4. The first lens 4 functions so that these laser beams K1, K2 travel forward intersecting each other, and serves to converge the laser beams K1, K2 at focus positions F1, F2, F1 and F2 are different from each other so as to cause a divergence between the first and second laser beams K1, K2 in the extending direction of the stripes 9, 10 (see FIG. 2).

Normally, parallel beams transformed into a large spot size have an angular tolerance that is as strict as 0.1° or smaller, however, the angular tolerance slackens in the condenser system converging the laser beams at focus positions F1, F2 as described above. The first lens 4 is disposed as a condenser optical system, whereby a tolerance of configurations of the optical elements, a positioning tolerance and a beam angular adjusting tolerance slacken. This is a preferable aspect.

As shown in FIG. 1(A), the first lens 4 is held by a first lens holding member 13. The first lens 4 is preferably positioned so that the optical axis of the first laser beam K1 emerging from the first stripe 9 and the optical axis of the second laser beam K2 emerging from the second stripe 10 show substantially a symmetry about the central axis of the first lens 4. With this arrangement, both of the first and second laser beams K1, K2 travel through the vicinity of the central axis of the first lens 4 that is defined as an area with a small aberration, and hence there is a decreased scatter on the wave surfaces of the laser beams, with the result that the optical coupling efficiency to the optical fiber 8 rises. As a result, a higher optical output may be obtained from the semiconductor laser module M1. Note that the first lens 4 preferably involves, the use of an aspherical lens exhibiting a small spherical aberration and a high optical coupling efficiency to the optical fiber 8 to restrain any influence of a spherical aberration.

The prism 5 is disposed between the first lens 4 and the PBC 7 and adjusts the light paths, substantially collimates the optical axes, of the first and second laser beams K1, K2, thus letting the laser beams K1, K2 exit the prism 5 itself. The prism 5 is composed of an optical glass of BK7 (borosilicate crown glass) and so on. The optical axes of the first and second laser beams K1, K2 traveling in non-parallel from the first lens 4 are collimated by refraction of the prism 5, and hence this facilitates manufacturing the PBC 7 disposed in rear of the prism 5 and makes it feasible to downsize the semiconductor laser module M1 by downsizing the PBC 7.

Figure 3:
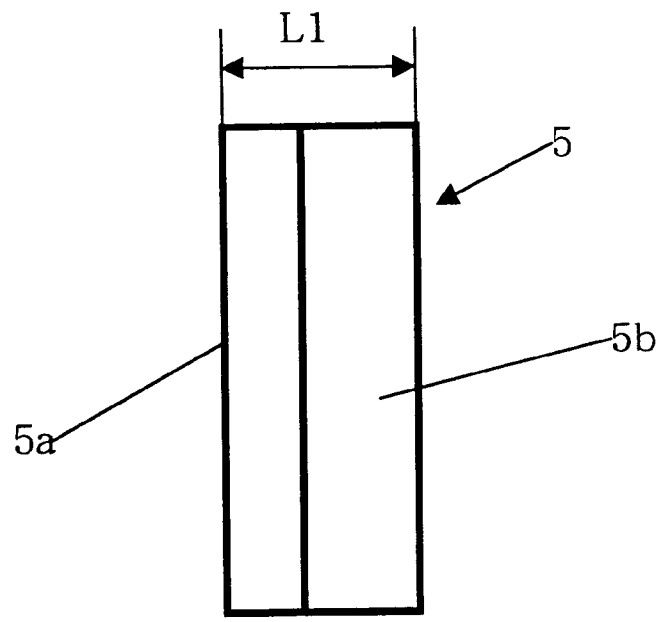
FIG. 3(A) is a side view showing a configuration of a prism.
FIG. 3(B) is a plan view thereof.
Figure 3:
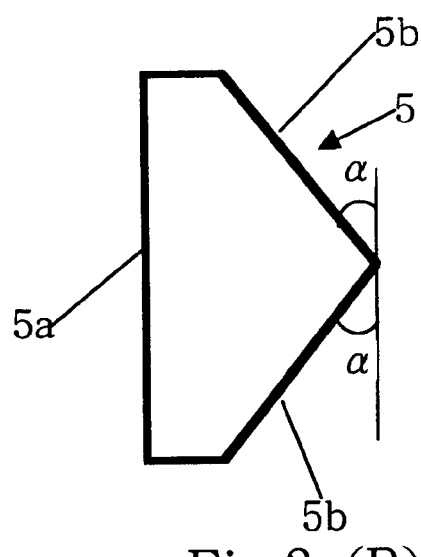

FIG. 3(A) is a side view showing a configuration of the prism 5, and FIG. 3(B) is a plan view thereof. As shown in FIGS. 3(A) and 3(B), the prism 5 is approximately 1.0 mm in its entire length L1, and includes an incident surface 5a formed flat and an exit surface 5b inclined at a predetermined angle α (α is 3.2°±0.1°).

As shown in FIG. 2, the half-wave plate 6 admits an incidence of only the first laser beam K1 of the first and second laser beams K1, K2 passing through the prism 5, and rotates by 90 degrees a polarizing surface of the first laser beam K1 incident thereupon. The first lens 4 makes the first and second laser beams K1, K2 split thoroughly, whereby the half-wave plate 6 becomes easy to dispose.

The PBC 7 has a first input part 7a on which the first laser beam K1 is incident, a second input part 7b on which the second laser beam K2 is incident, and an output part 7c where the first laser beam entering the first input part 7a and the second laser beam K2 entering the second input part 7b are multiplexed and thus exit. The PBC 7 is classified as, for instance, a birefringence element through which the first laser beam K1 travels as an ordinary ray to the output part 7C and the second laser beam K2 travels as an extraordinary ray to the output part 7c. The PBC 7, if being the birefringence element, is composed of, e.g., $TiO_2$ (rutile) to obtain a high index of birefringence and a large split width between the laser beams.

In the first embodiment, a polarization synthesizing module 59 is adopted in which the prism 5, the half-wave plate 6 and the PBC 7 are fixed to the same holder member 14. FIG. 4(A) is a plan view showing the polarization synthesizing module 59. FIG. 4(B) is a side sectional view thereof. FIG. 4(C) is a front view thereof. As shown in FIGS. 4(A) to 4(C), the holder member 14 of the polarization synthesizing module 59 is composed of a material (for example, SUS403, SUS304 and so on) suitable for YAG laser welding. The holder member 14 is approximately 7.0 mm in its entire length L2 and is formed substantially in a cylindrical shape as a whole. The holder member 14 is formed inside with an rectanguler accommodation space 14a in which the prism 5, the half-wave plate 6 and the PBC 7 are fixedly provided, respectively. The holder member 14 is opened at its upper portion and is flat in its lower portion.

This configuration greatly facilitates adjusting the positions of the prism 5 and the PBC 7 about a central axis C1 so that both of the first laser beam K1 incident upon the first input part 7a of the PBC 7 and the second laser beam K2 incident upon the second input part 7b thereof, exit the output part 7c.

Thus, these optical elements are set integral within the holder member 14, and it is therefore possible to adjust a degree of how much the laser beams K1, K2 overlap with each other on the X-Y plane simply by moving the holder member 14 in the Z-axis direction.

As shown in FIG. 2, the optical fiber 8 receives the laser beams exiting the output part 7c of the PBC 7 and lets the laser beams travel outside the package 1. The optical fiber 8 is, as shown in FIG. 2, provided with a beam reflection element 15 consisting of an FBG (fiber bragg grating) that reflects the beams having a predetermined wavelength range. This beam reflection element 15 reflects the beams having the predetermined wavelength back to the semiconductor laser device 2. With this beam reflection element 15, an oscillation wavelength of the semiconductor laser device 2 is fixed, and an oscillation spectral width can be decreased. Accordingly, if the laser beams emitted from the semiconductor laser module M1 are multiplexed by a wavelength synthesizing coupler (WDM: wavelength division multiplexing) and thus used as a pumping light source of an erbium-doped optical amplifier or a Raman amplifier, high-output multiplexed beams can be obtained by restraining a loss of the wavelength synthesizing couple down to a low level. If used for the Raman amplifier, a fluctuation in gain of the Raman amplification can be restrained. The beam reflection element 15 is formed by irradiating a core of the optical fiber 8 with ultraviolet rays serving as interference fringes through, e.g., a phase mask, and consequently causing periodic changes in refractive index.

A second lens 16 for optical-coupling the laser beams emerging from the output part 7c of the PBC 7 to the optical fiber 8, is disposed between the PBC 7 and the optical fiber 8. The first lens 4 is positioned so that the first and second laser beams K1, K2 are focused on points (F1, F2) between the first lens 4 and the second lens 16. With this contrivance, there decreases a propagation distance L needed (for a distance D' in FIG. 2 to take a sufficiently large value) for the first and second laser beams K1, K2 to split after passing through the first lens 4, and hence a length of the semiconductor laser module M1 in the optical-axis direction can be reduced. As a result, it is feasible to provide the highly reliable semiconductor laser module M1 exhibiting an excellent passage-of-time stability of the optical coupling of the semiconductor laser device 2 to the optical fiber 8 under, e.g., a high-temperature environment.

Figure 2:
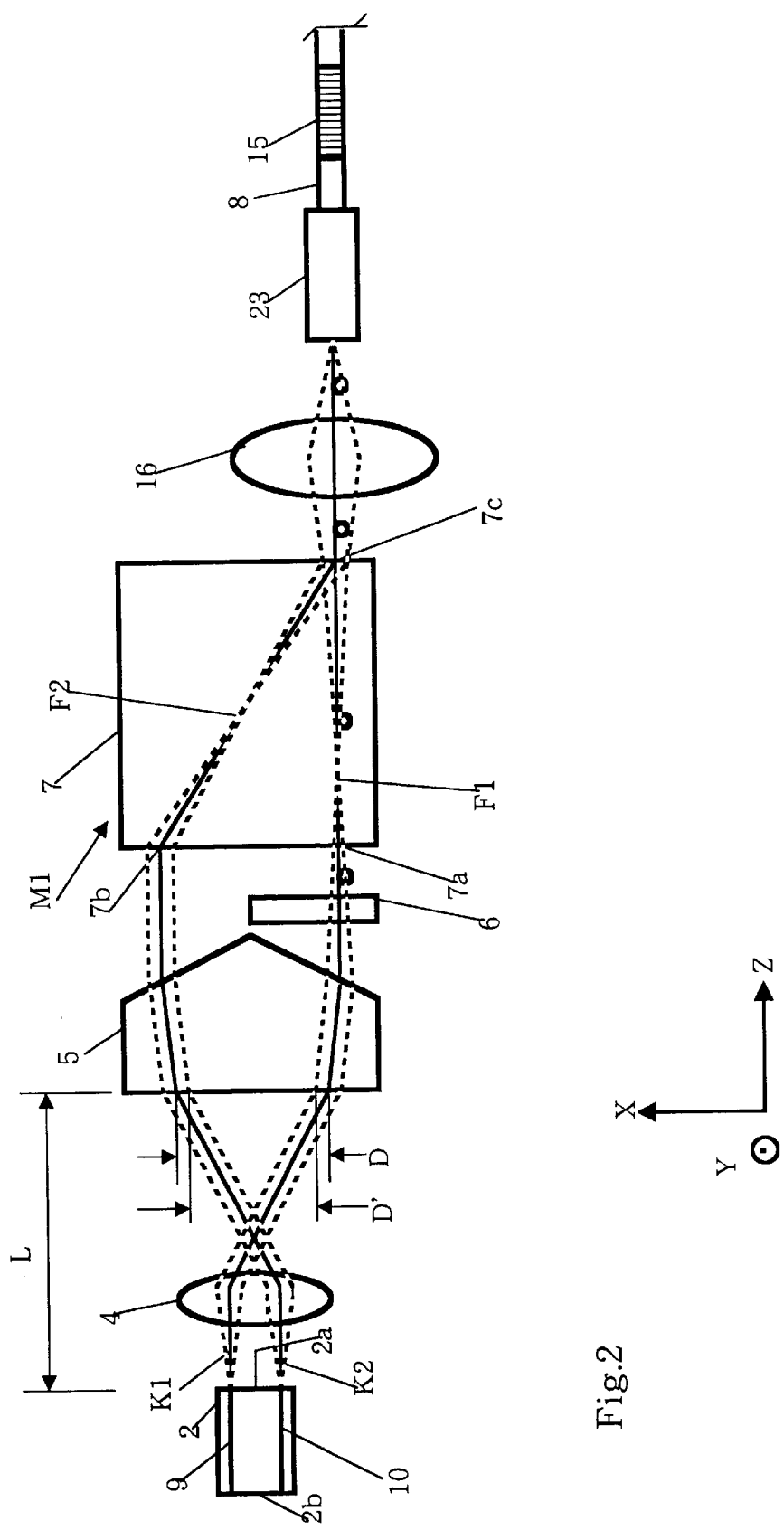
FIG. 2 is an explanatory diagram schematically showing a configuration of the semiconductor laser module in accordance with the first embodiment of the present invention.

As shown in FIG. 1, the chip carrier 11 to which the semiconductor laser device 2 is fixed and the photodiode carrier 12 to which the photo diode 3 is fixed, are fixed by soldering onto a first base plate 17 taking substantially an L-shape in section. It is preferable that the first base plate 17 be composed of a CuW based alloy and so on in order to enhance a capacity of transferring the heat evolved by the semiconductor laser device 2.

The first lens holder member 13 to which the first lens 4 is fixed and the polarization synthesizing module 59 with the prism 5, the half-wave plate 6 and the PBC 7 fixed to the holder member 14, are fixed by the YAG laser welding onto a second base plate 18 through a first support member 19a and a second support member 19b, respectively. It is therefore preferable that the second base plate 18 be formed of a stainless steel etc showing a high welding property. Further, the second base plate 18 is fixed by silver-soldering onto a flat part 17a of the first base plate 17.

A cooling device (thermoelectric cooler) 20 constructed of a plurarity of Peltier elements are provided under the first base plate 17. A thermistor 20a provided on the chip carrier 11 detects a change in temperature due to the heat transferred from the semiconductor laser device 2. The cooling device 20 is controlled to keep constant the temperature detected by the thermistor 20a. This contrivance makes it feasible to increase and stabilize the output of emission of the laser beams from the semiconductor laser device 2.

A flange 1a formed at the side area of the package 1 is provided inside with a window 1b upon which the beams penetrating the PBC 7 are incident and with a second lens 16 for converging the laser beams. The second lens 16 is held by a second lens holding member 21 fixed by the YAG laser welding to a side edge of the flange 1a. A metallic slide ring 22 is fixed by the YAG laser welding to a side edge of the second lens holding member 21.

The optical fiber 8 is held by a ferrule 23 fixed by the YAG laser welding to an interior of the slide ring 22.

Next, operations of the semiconductor laser module M1 in accordance with the first embodiment of the present invention will be explained.

As shown in FIG. 2, the first and second laser beams K1, K2 emitted from the front-sided edge surfaces 2a of the first and second stripes 9, 10 of the semiconductor laser device 2, penetrate the first lens 4 and intersect each other. Thereafter, the laser beams K1, K2 having a sufficient divergence split thoroughly and then enter the prism 5. A width of divergence (D) between the first and second laser beams K1, K2 when entering the prism 5 is approximately 460 μm. The first and second laser beams K1, K2 are collimated by the prism 5 and thus exit (the width of divergence between the laser beams K1 and K2 comes to approximately 500 μm). Then, the first laser beam K1 impinges on the half-wave plate 6 and, after its polarization plane has been rotated by 90 degrees, enters the first input part 7a of the PBC 7, while the second laser beam K2 enters the second input part 7b of the PBC 7.

In the PBC 7, the first laser beam K1 emerging from the first input part 7a and the second laser beam K2 emerging from the second input part 7b, are multiplexed and exit the output part 7c.

The laser beams emitted from the PBC 7 are converged by the second lens 16, then incident upon the edge surface of the optical fiber 8 held by the ferrule 23, and sent outside. Further, some proportion of the laser beams are reflected by the beam reflection element 15 of the optical fiber 8 back to the semiconductor laser device 2, thereby forming an external resonator between the semiconductor laser device 2 and the beam reflection element 15. Hence, the laser oscillations with a wavelength determined by the beam reflection element 15 can be done.

The monitor-oriented laser beams emerging from the rear-sided edge surface 2b of the semiconductor laser device 2, are received by the photo diode 3. An optical output or the like of the semiconductor laser device 2 is adjusted by changing the driving current for the semiconductor laser device 2 due to a light receiving quantity etc. of the photo diode 3.

According to the semiconductor laser module M1 in accordance with the first embodiment of the present invention, the first and second laser beams K1, K2 with their polarization planes coincident with each other are emitted from the first and second stripes 9, 10 formed at the space as narrow as 100 μm or less in the single semiconductor laser device 2. The first and second laser beams K1, K2 are thoroughly split from each other by the first lens 4, and thereafter the polarization planes thereof are rotated exactly by 90 degrees with the half-wave plate 6. Namely, the polarization planes of the laser beams K1, K2 make substantially completely 90° at this time. The first and second laser beams K1, K2 are polarization-synthesized by the PBC 7 in this state, and hence the laser beams having the high output and a small degree of polarization can be emitted out of the optical fiber 8. Further, the optical fiber 8 is formed with the FBG-based beam reflection element 15, and therefore the laser beams with the wavelength fixed can be emitted out of the optical fiber 8. Accordingly, the semiconductor laser module M1 can be applied as the pumping light source for a erbium-doped optical amplifier of which a high output is demanded or for a Raman amplifier required to have a low polarization dependency and a high wavelength stability.

Further, the semiconductor laser module M1 involves the use of the single semiconductor laser device 2 formed with the two stripes for emitting the two fluxes of laser beams and one piece of first lens 4 for splitting both of the laser beams K1 and K2, and therefore the time for positioning the semiconductor laser device 2 and the first lens 4 decreases. As a result, it is possible to reduce the time for manufacturing the semiconductor laser module M1.

Moreover, there has hitherto been the semiconductor laser module in which two pieces of semiconductor lasers emit the laser beams in the axial directions completely differently from each other (refer to, e.g., U.S. Pat. No. 5,589,684). This type of semiconductor laser module is, however, if designed without taking a warp or the like of the package in the axial direction into account, incapable of restraining fluctuations in the optical output due to the warp of the package that is caused by a change in the ambient temperature etc. By contrast, according to the configuration in the first embodiment, the two laser beams emitted from the single semiconductor laser device 2 travel substantially in the same direction, and hence the optical output of the laser beams emerging from the optical fiber 8 can be stabilized by restraining an influence of the warp of the package in only one direction (a Z-direction in FIG. 2).

Further, the single semiconductor laser device 2 emits the two laser beams, and the coupling efficiencies of these two laser beams have the same tendency of fluctuations with respect to the package warp and so on. Accordingly, even when the temperature fluctuates, the degree of polarization of the laser beams emitted from the optical fiber 8 is stabilized.

Further, the use of the single semiconductor laser device 2 helps downsize the cooling device 20 (e.g. a Peltier module) and decrease the consumption of electric power.

Note that the consumption power, required when the cooling device radiates a tremendous quantity of heat evolved from the two stripes 9, 10 preferably can be restrained to a large extent by creating a vacuum in the interior of the package 1 or using Xe as a filler gas.

Moreover, when attaching a polarization retaining fiber formed with the fiber Bragg grating (FBG) to the double-stripe type semiconductor laser module for emitting the two fluxes of laser beams as in the first embodiment, more longitudinal modes can be contained within the spectral width than in the single-stripe type semiconductor laser module that has the same FBG reflection band and emits one flux of laser beams.

Figure 5:
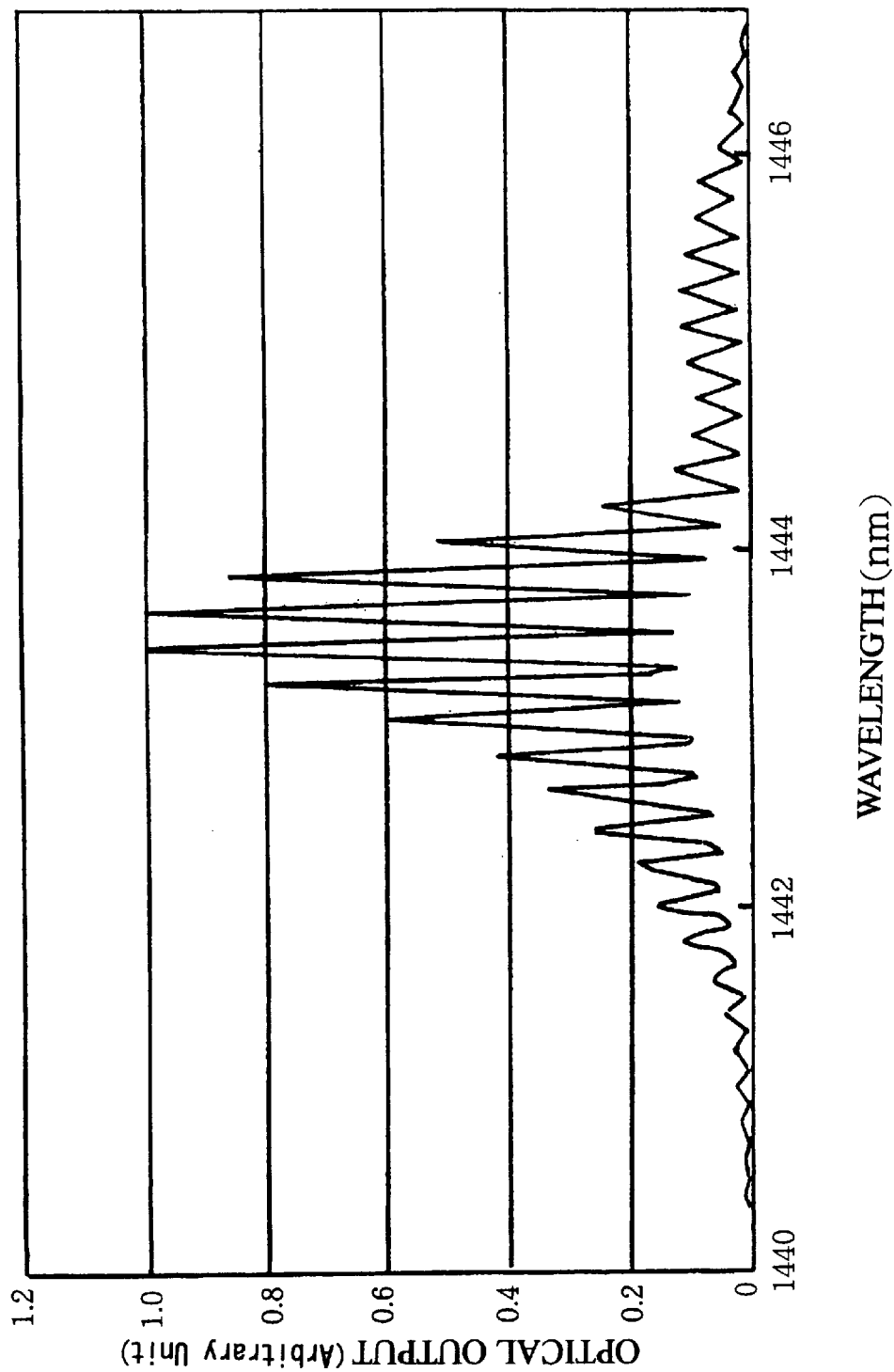
FIG. 5 is a graph showing a spectrum when a drive current 2A (1A applied per stripe) is applied in a double-stripe type semiconductor laser module.

FIG. 5 is a graph showing a spectrum when applying a drive current 2A (which means that a drive current 1A is given per stripe) in the double-stripe type semiconductor laser module M1. As can be understood from FIG. 5, five longitudinal modes are contained within the spectral full width at half maximum (FWHM) in the double-stripe type semiconductor laser module M1. On the other hand, in the case of a well known single-stripe type semiconductor laser module, three or four longitudinal modes are contained within the spectral FWHM at the drive current 1A.

The polarization retaining fiber has a refractive index that differs depending on a slow-axis and a fast-axis, and therefore reflection wavelengths selected in the two axes at the FBG differ from each other on the order of 0.4 nm. Hence, even if the spectrum corresponding to each stripe is the same as in the prior art, it can be considered that there increases the number of modes of the spectrums acquired as overlaps thereof.

In this case, when the optical output from the double-stripe type semiconductor laser module M1 in the first embodiment travels in the depolarizer, the DOP (degree of polarization) is reduced effectively. Therefore the semiconductor laser module M1 is suitable as the pumping light source of a Raman amplifier required to have the low polarization dependency.

Figure 6:
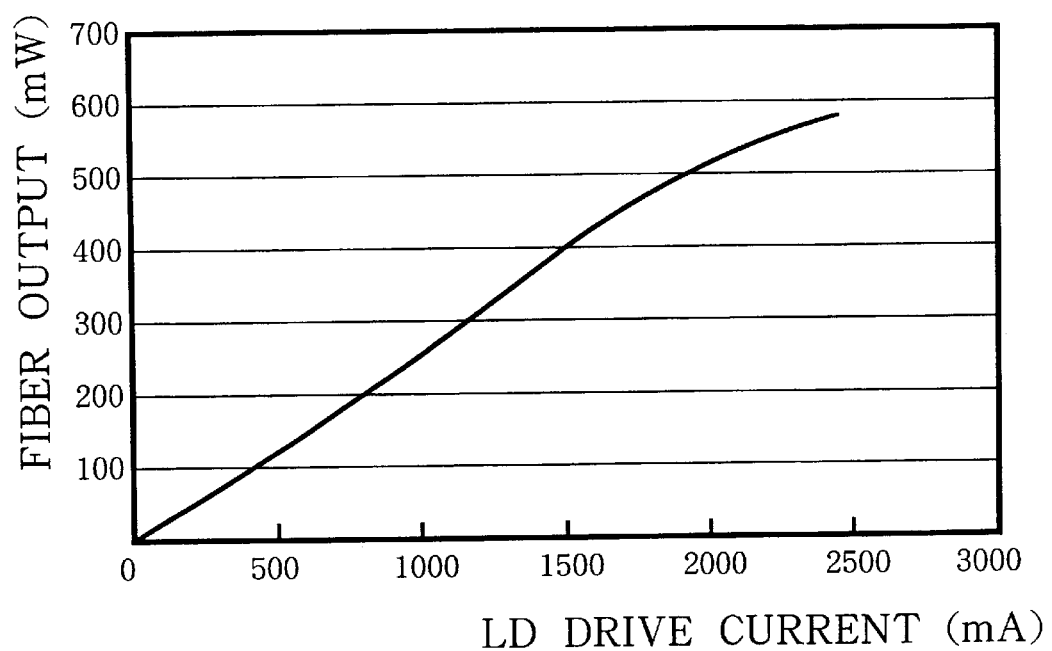
FIG. 6 is a graph showing a fiber output versus an LD drive current in the double-stripe type semiconductor laser module.

Further, the double-stripe type semiconductor laser module is capable of obtaining high optical output. FIG. 6 is a graph showing a fiber output with respect to an LD drive current in the double-stripe type semiconductor laser module. As can be understood from FIG. 6, an optical output on the order of 600 mW can be obtained when the drive current is 2500 mA. Hence, the double-stripe type semiconductor laser module in the first embodiment is suited as the pumping light source in a band of 14XX (1300 to 1550) mn for the Raman amplifier required to have high optical output, and also as the pumping light source in bands of 980 nm and 1480 nm for EDFA.

Next, a method of manufacturing the semiconductor laser module M1 in accordance with the first embodiment of the present invention will hereinafter be described.

To start with, the second base plate 18 is fixed by silver-soldering onto the flat part 17a of the first base plate 17.

Subsequently, the chip carrier 11 to which the semiconductor laser device 2 is fixed and the photodiode carrier 12 to which the photo diode 3 is fixed, are fixed by soldering onto the first base plate 17.

Next, the first lens 4 is fixed onto the second base plate 18 in a way that aligns the lens 4. In this aligning step of the first lens 4, the semiconductor laser device 2 is supplied with the electric current and emits the first and second laser beams K1, K2 from both of the first and second stripes 9, 10 of the semiconductor laser device 2. Then, after setting this beam emitting direction as a fiducial direction, the first lens 4 is inserted and positioned in the X-, Y- and Z-axis directions.

Figure 7:
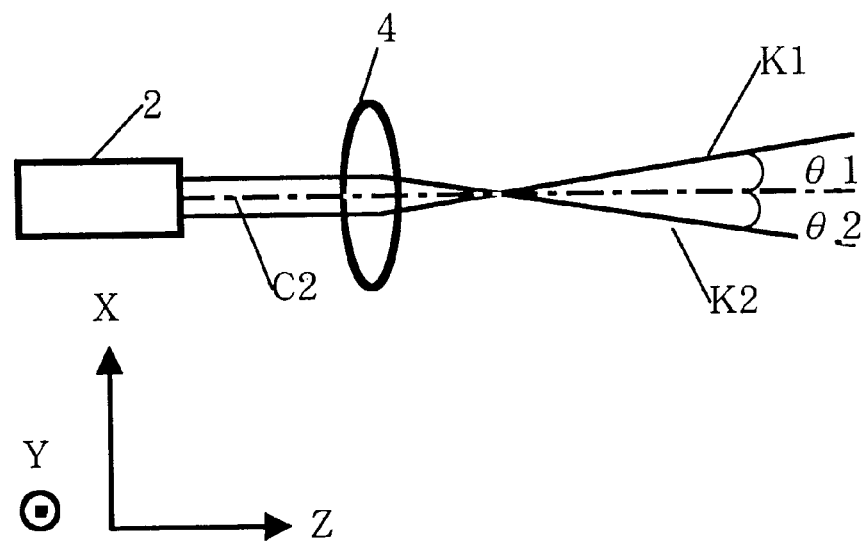
FIGS. 7(A) and 7(B) are explanatory diagrams showing a step of aligning a first lens.
Figure 7:
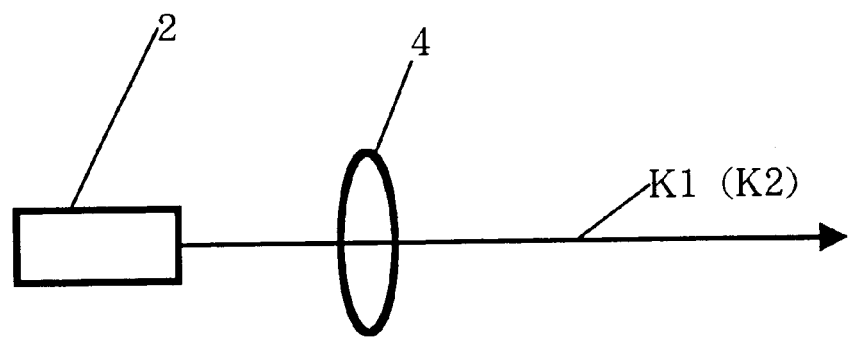

FIGS. 7(A) and 7(B) are explanatory diagrams showing the aligning step of the first lens 4. The first lens 4 is, as shown in FIG. 7(A), positioned in the X-axis direction so that an angle θ1 made between the fiducial direction (a central axis C2) set in the way described above and the first laser beam K1 is equal to an angle θ2 made between the central axis C2 and the second laser beam K2. The first lens 4 is, as shown in FIG. 7(B), positioned in the Y-axis direction so that the first and second laser beams K1, K2 travel through the center of the first lens 4. Further, the first lens 4 is positioned in the Z-axis direction so that a spot size of the laser beam is minimized at a predetermined distance from the semiconductor laser device 2. The first lens holding member 13, which holds the first lens positioned in the aligning step described above, is fixed by the YAG laser welding onto the second base plate 18 through the first support member 19a.

Subsequently, the polarization synthesizing module 59 including the prism 5, the half-wave plate 6 and the PBC 7 as the integral unit on the whole, is aligned and fixed onto the second base plate 18. In this aligning step of the polarization synthesizing module 59, the polarization synthesizing module 59 is aligned in the X- Y- and Z-axis directions and rotated about angle θ of the central axis C1 (see FIGS. 4(A) to 4(c)) of the holder member 14 so that an optical intensity of the beams coupled to the fiber is maximized by use of a positioning optical fiber collimator. The polarization synthesizing module 59 is adjusted in its position and then positioned about the central axis C1 of the holder member 14 by rotating the holder member 14 about the central axis C1 so that both of the first laser beams K1 entering the first input part 7a and the second laser beam K2 entering the second input part 7b, exit the output part 7c.

The polarization synthesizing module 59 is positioned in the Z-axis direction in a way that adjust the degree of how much the laser beams K1, K2 outputted from the PBC 7 overlap with each other on the X-Y plane. For example, the laser beams K1, K2 may completely overlap with each other, or positions of their beam spots may also be shifted. In the latter case, if the laser beams K1, K2 have different optical intensities, the optical fiber 8 is aligned so as to receive a larger quantity of laser beam having the smaller optical intensity, thus equalizing the optical intensities of the laser beams K1, K2 entering the optical fiber 8. The degree of polarization can be, it is preferable, thereby sufficiently decreased.

The holder member 14 is fixed by the YAG laser welding in the position determined in the aligning step described above onto the second base plate 18 through the second support member 19b.

Subsequently, the first base plate 17 is fixed by soldering onto the cooling device 20 fixed beforehand onto a bottom plate of the package 1.

Then, the semiconductor laser device 2 and the monitor-oriented photo diode 3 are electrically connected to leads (not shown) of the package 1 through a metal wires (unillustrated).

Next, a cover 1c is covered over the upper portion of the package 1 in an inert gas (e.g., $N_2$, Xe) atmosphere, and a peripheral edge portion thereof is resistance-welded, thereby hermetically sealing it.

Subsequently, the second lens 16 is aligned within the X-Y plane and in the Z-axis direction and thus fixed to the first flange 1a of the package 1. In this step, the first flange 1a is fixed by the YAG laser welding in such a position that the beam emerging from the second lens 16 is parallel to the central axis of the flange 1a of the package 1.

Finally, the optical fiber 8 is aligned and then fixed. In this step, the metallic slide ring 22 is fixed to the side edge of the second lens holding member 21. The slide ring 22 is adjusted in its position within the plane (the X-Y plane) perpendicular to the optical axis of the optical fiber 8 at the edge surface of the second lens holding member 21, and is thereafter fixed by the YAG laser welding at a boundary therebetween. The ferrule 23 for holding the optical fiber 8 is fixed by the YAG laser welding to an interior of the slide ring 22 in such a position that the beam emission from the optical fiber 8 is maximized. On this occasion, the optical fiber 8 is aligned taking a power balance of the plurality of laser beams to be synthesized into consideration. The position of the optical fiber 8 in the optical-axis direction (the z-axis direction) is thereby fixed.

Now, the semiconductor laser device 2 used for the semiconductor laser module in accordance with the first embodiment of the present invention will be explained. FIGS. 8(A) to 8(C) are explanatory views showing the configuration of the semiconductor laser device 2 used for the semiconductor laser module of the present invention. FIG. 9 is an explanatory view showing another example of the semiconductor laser device 2. Note that FIGS. 8(B) and 8(C) are the sectional views taken along the line a—a in FIG. 8(A).

As shown in FIG. 8(A), the semiconductor laser device 2 is configured such that a lamination structure 25 is formed on a substrate 24 composed of a predetermined semiconductor by executing a predetermined semiconductor epitaxial crystal growth on the basis of a known epitaxial growth method such as an organic metal vapor phase growth method, a liquid phase method, a molecular beam epitaxial growth method and a gas source molecular beam epitaxial growth method, thereafter a lower electrode 26 is provided on an undersurface of the substrate 24, an upper electrode 27 is provided on an upper surface of the lamination structure 25, a predetermined cavity length L3 is obtained by cleavage, further a low-reflection layer 28 (a reflectance is, e.g., 5% or smaller) is formed on one cleavage surface (the front edge surface 2a), and a high-reflection layer 29 (a reflectance is, e.g., 90% or larger) is formed on the other cleavage surface (the rear edge surface 2b).

As shown in FIG. 8(B), the lamination structure 25 on the substrate 24 is, for instance, a BH (buried heterostructure), wherein n-InP clad layer 31 composed of, e.g., non-doped GaInAsP, an active layer 32 composed of, e.g., GaInAsP and an p-InP clad layer 33 composed of, e.g., non-doped GaInAsP, are sequentially laminated on the substrate composed of e.g., n-InP, and further an upper buried layer 34 composed of, e.g., p-InP and a cap layer 35 composed of, e.g., p-GaInAsP are laminated on the p-InP clad layer 33. Then, the upper electrode 27 is provided on this cap layer 35, and the lower electrode 26 is provided on the undersurface of the substrate 24.

Then, the n-InP clad layer 31, the active layer 32 and the upper buried layer 34, are processed into two steaks of stripes in parallel with each other through a space of 40–60 μm, and, for example, a p-InP layer 36 and an n-InP layer 37 are laminated in this sequence on its side surfaces, thereby forming a constricted portion for letting the electric current through to the active layer 32.

The active layer 32 involves, for instance, a compressive distortion quantum well structure, wherein a grating mismatching rate with respect to the substrate 24 is 0.5% or larger but is not larger than 1.5%. Besides, it is advantageous in terms of gaining a higher output to take a multi quantum well structure in which the number of wells is about 5. Further, if the distortion quantum well structure adopts a distortion compensation structure in which a barrier layer thereof takes a tensile distortion opposite to the distortion of the well layer, the grating matching condition can be equivalently met, and hence a further higher value of the grating matching degree of the well layer, can be set.

Figure 8:
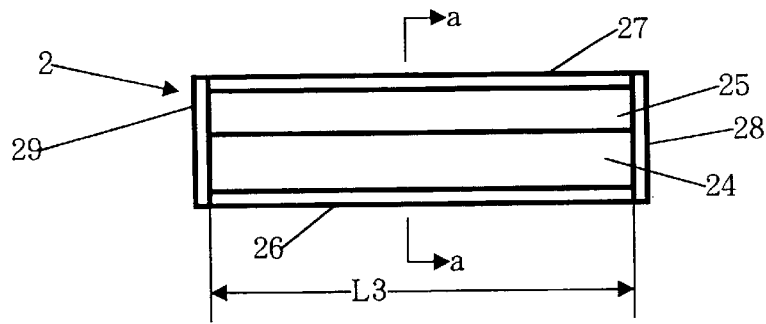
FIGS. 8(A) to 8(C) are explanatory views showing a configuration of the semiconductor laser device.
Figure 8:
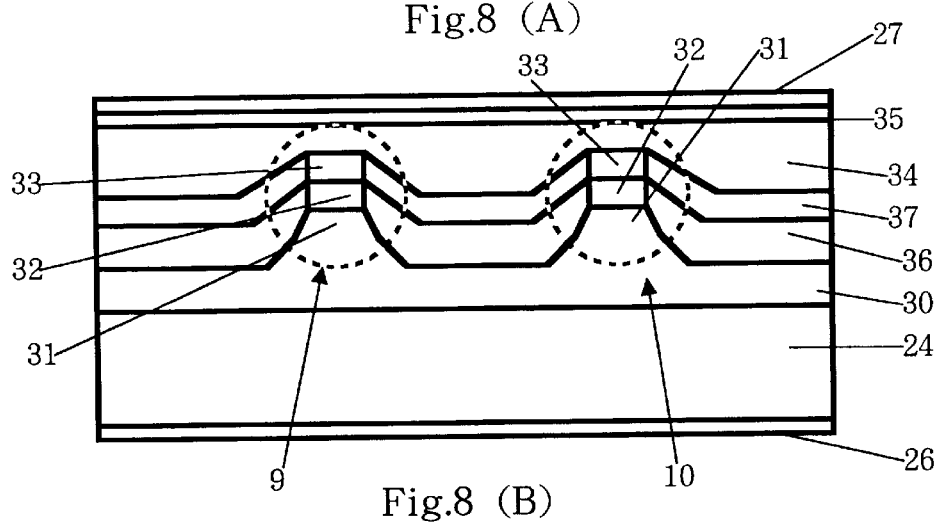
Figure 8:
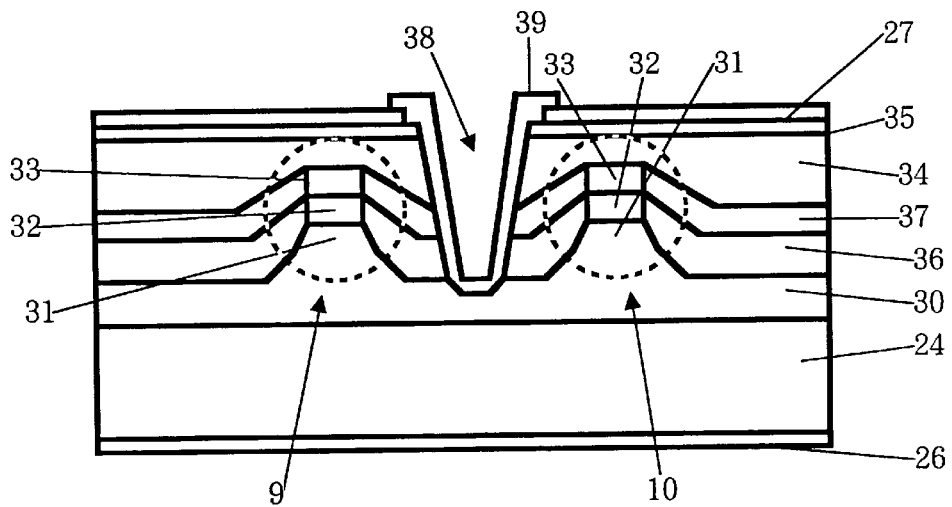
Figure 9:
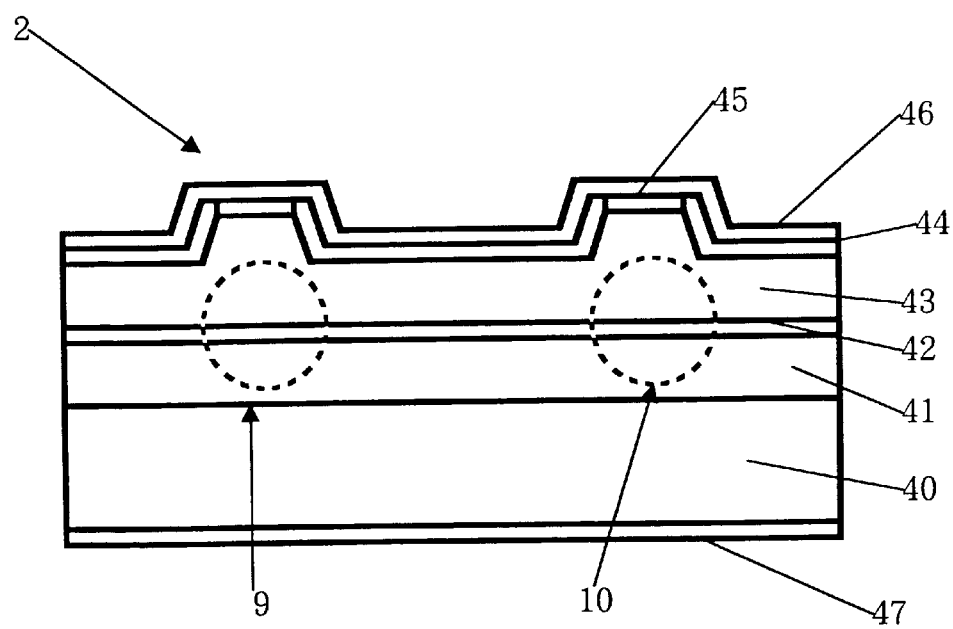
FIG. 9 is an explanatory view showing another example of the semiconductor laser device.

According to the first embodiment, the light emitting portions consisting of the n-InP clad layer 31, the GRIN-SCH-MQW active layer 32 and the p-InP clad layer 33 are formed extending in the form of stripes in the direction vertical to the sheet surface in FIG. 8, and these portions are called the stripes 9 and 10, respectively.

Next, a method of manufacturing the semiconductor laser device 2 having the structure described above will be explained.

To begin with, the lower clad layer 30, the n-InP clad layer 31, the active layer 32, the p-InP clad layer 33 are laminated in this sequence on the substrate 24 by the known epitaxial growth method such as the organic metal vapor phase growth method, the liquid phase method, the molecular beam epitaxial growth method and the gas source molecular beam epitaxial growth method.

Subsequently, two pieces of masks arranged in parallel with each other through the space of 40–60 μm are provided on the upper buried layer 34. Thereafter, some portions of the upper buried layer 34, the p-InP clad layer 33, the active layer 33, the n-InP clad layer 31 and the substrate 24, are dissolved by use of a predetermined etchant (etching liquid), the p-InP layer 36 and the n-Inp layer 37 are laminated in this sequence on the stripes, thereby forming the constricted portion for letting the electric current through to the active layer 32.

Subsequently, the upper buried layer 34 is crystal-grown with epitaxial growth method.

Further, the cap layer 35 is laminated on the upper buried layer 34.

Next, the upper electrode 27 is provided on the upper surface of the cap layer 35, and the lower electrode 26 is provided on the undersurface of the substrate 24.

Thereafter, the cavity length L3 is obtained by the cleavage. Further, the low-reflection layer 28 is formed on one cleavage surface (the front edge surface 2a), and the high-reflection layer 29 is formed on the other cleavage surface (the rear edge surface 2b).

In the thus manufactured semiconductor laser device 2, the side of the upper electrode 27 is bonded by AuSn-soldering to the heat sink 58 shown in FIG. 1(B). Then, the laser oscillations occur simultaneously at the two stripes when supplied with the electric current from outside via the upper electrode 27 (on the p-side in the first embodiment) and the lower electrode 26 (on the n-side in the first embodiment), and the two fluxes of outgoing beams from the low-reflection layer 28 are multiplexed by the PBC 7 described above and used for a desired application.

Supposing herein that the two stripes have absolutely the same characteristic, a threshold current of the semiconductor laser device 2 in the first embodiment is twice the threshold current of one single stripe, and the total optical output is twice the optical output of the single stripe. Namely, the semiconductor laser device 2 as a whole obtains approximately a 2-fold optical output with the drive current that is approximately twice the drive current per stripe, and a slope efficiency of the semiconductor laser device 2 is substantially the same as that of the semiconductor laser device 1 having one single stripe.

Note that the first embodiment discussed above has exemplified the structure in which the two stripes are simultaneously driven. As shown in, for example, FIG. 8(C), however, a separation trench 38 having a depth extending from the upper electrode 27 down to the lower clad layer 30, may be formed between the two stripes, and the surface of this separation trench 38 is covered with an insulation layer 39, whereby the two stripes can be electrically separated. If a lower electrode 26 sided portion of the semiconductor laser device 2 described above is bonded by AuSn-soldering to the unillustrated heat sink, the drive currents supplied to the two stripes can be independently controlled, thereby facilitating randomization of the polarization planes of the laser beams emitted from the optical fiber 8. In this case, at least one of the positive pole side and the negative pole side of each of the two stripes may be electrically insulated.

Note that the semiconductor laser device 2, when structured as shown in FIG. 8(C), is used by applying the drive current to one stripe, and may also be used by applying, if the active layer of one stripe fall into an abnormal state, the drive current to the other stripe. In this case, one stripe is configured as a redundant system, and hence the semiconductor laser device 2 comes to have a longer product life-span.

Further, when used in a way such that the upper electrode 27 sided portion is bonded to the heat sink 58, an electrode pattern corresponding to the upper electrode 27 is formed beforehand on the heat sink 58 side, whereby those two stripes can be independently driven.

Further, the semiconductor laser device 2 in the first embodiment discussed above has been exemplified as having the InP-series BH (buried heterostructure). However, there may also be used the semiconductor laser device 2 of, e.g., a GaAs-series ridge waveguide type as shown in FIG. 9. As shown in FIG. 9, this semiconductor laser device 2 has a structure in which an n-type lower clad layer 41, an active layer 42, a p-type upper clad layer 43, an insulation layer 44, a p-GaAs layer 45 are laminated on a substrate 40 made of n-GaAs, and two ridges are formed. An upper electrode (p-type electrode) 46 is provided over the insulation layer 44 and the p-GaAs layer 45. A lower electrode (n-type electrode) 47 is provided on an undersurface of the substrate 40.

The ridges are formed extending in stripes in the direction vertical to the sheet surface in FIG. 9. The active layer streaks 42 provided just under along the ridges each get luminescence. These luminescent layer streaks are called the stripes 9 and 10, respectively. Of course, a InP ridge type LD can be used in this embodiment.

Furthermore, the first embodiment has exemplified the Fabry-Perot semiconductor laser device 2 as the basic structure of the semiconductor laser device 2. In addition, the semiconductor laser device 2 may include a wavelength selecting element such as DFB, DBR and so on as will be mentioned later on. When using this type of semiconductor laser device 2, the optical output with the oscillation wavelength stabilized can be obtained without using the optical fiber with the FBG.

(Second Embodiment)

Figure 10:
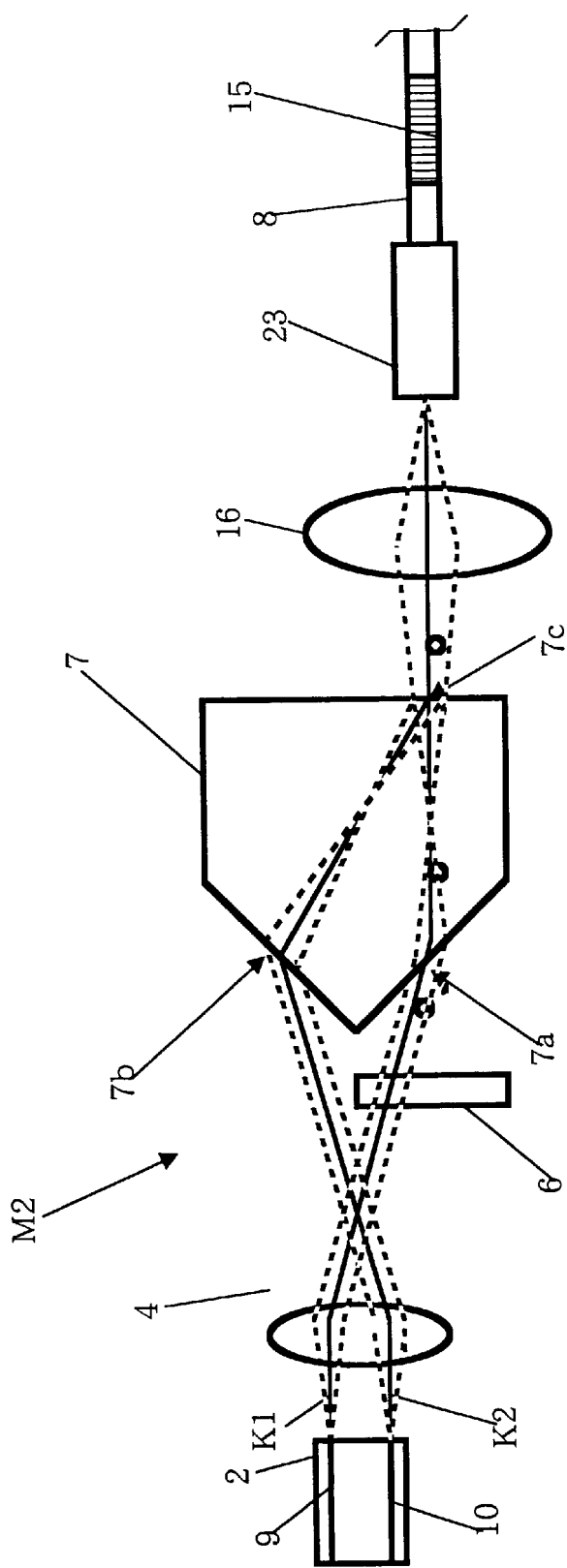
FIG. 10 is an explanatory diagram schematically showing a configuration of the semiconductor laser module in accordance with a second embodiment of the present invention.

FIG. 10 is an explanatory diagram schematically showing a configuration of a semiconductor laser module M2 in accordance with a second embodiment of the present invention. As shown in FIG. 10, according to the second embodiment, incident surfaces of the PBC 7 upon which the first and second laser beams K1, K2 are incident are inclined in a wedge-like shape so that the first laser beam K1 categorized as a normal ray travels in the axial-line direction of the optical fiber 8. Other than this point, this embodiment is substantially the same as the semiconductor laser module in the first embodiment.

According to the second embodiment, the first laser beam K1 as the normal ray travels in the axial-line direction of the optical fiber 8, and hence there is no necessity of providing the prism 5 between the half-wave plate 6 and the first lens 4, thereby making it possible to simplify the configuration.

Moreover, the length of the semiconductor laser module M2 in the optical-axis direction can be reduced, and it is therefore feasible to decrease the influence of the warp of the package on the optical output characteristic in a high-temperature state.

Note that the half-wave plate 6 and the PBC 7, which are fixed to the same holder member 14, may be structured as a polarization synthesizing module in order to facilitate the angle adjustment about the central axis also in the second embodiment.

(Third Embodiment)

Figure 11:
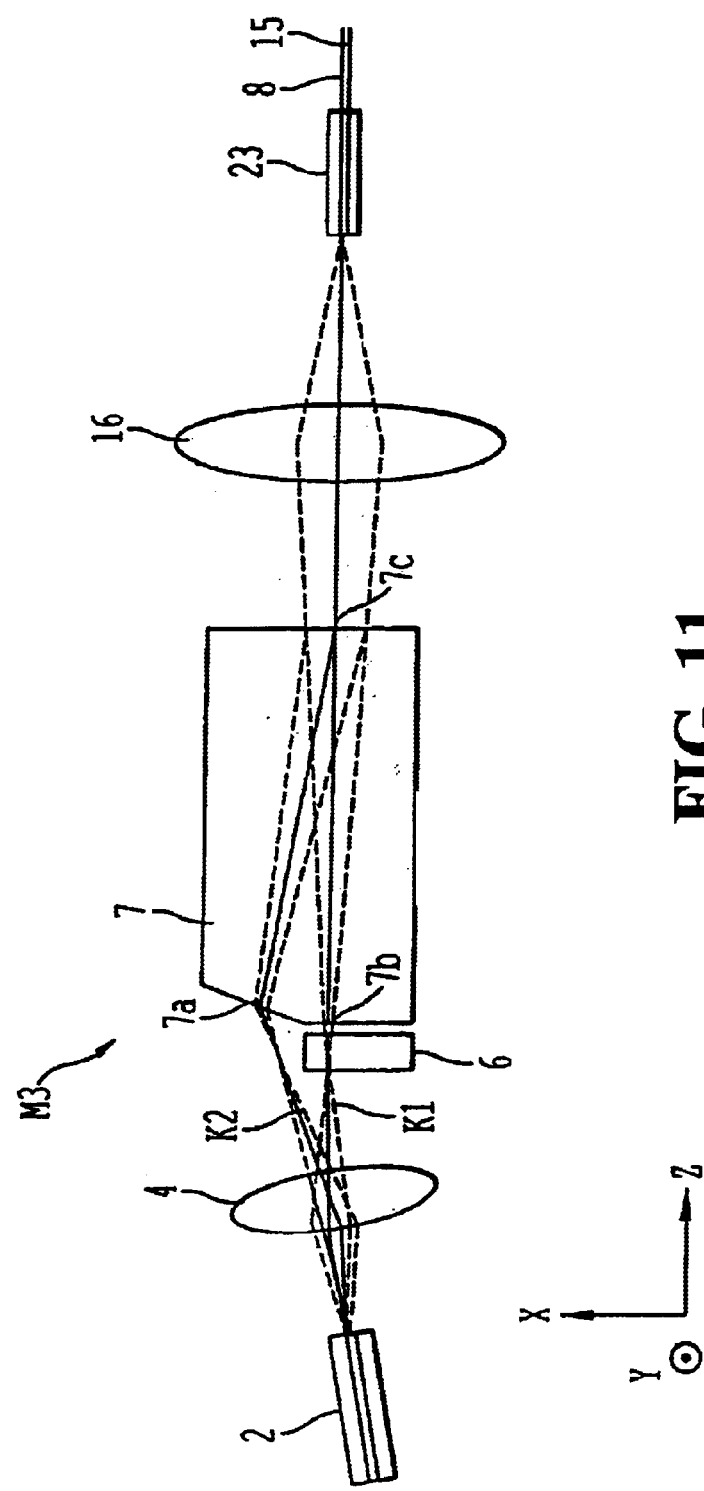
FIG. 11 is an explanatory diagram schematically showing a configuration of the semiconductor laser module in accordance with a third embodiment of the present invention.

FIG. 11 is an explanatory diagram schematically showing a configuration of a semiconductor laser module M3 in accordance with a third embodiment of the present invention. As shown in FIG. 11, according to the third embodiment, the semiconductor laser device 2 and the first lens 4 are disposed with tilts at predetermined angles to the axial-line direction so that the first laser beam K1 as the normal ray travels in the axial-line direction of the optical fiber 8. Other than this point, this embodiment is substantially the same as the semiconductor laser module in the first embodiment.

According to the third embodiment, the first laser beam K1 as the normal ray travels in the axial-line direction of the optical fiber 8, and hence there is no necessity of providing the prism 5 between the half-wave plate 6 and the first lens 4, thereby making it possible to simplify the configuration. Further, only one side of the PBC 7 may be polished, and hence the polishing can be more simplified than in the second embodiment.

Moreover, the length of the semiconductor laser module M3 in the optical-axis direction can be reduced, and it is therefore feasible to decrease the influence of the warp of the package on the optical output characteristic in the high-temperature state.

Note that the half-wave plate 6 and the PBC 7, which are fixed to the same holder member 14, may be structured as a polarization synthesizing module in order to facilitate the angle adjustment about the central axis also in the third embodiment.

Each of the semiconductor laser modules M1 to M3 in the first through third embodiments discussed above is capable of emitting the laser beams with high output, small degree of polarization and stabilized wavelength, and can be therefore used as the pumping light source for the erbium-doped optical amplifier or the Raman amplifier.

(Fourth Embodiment)

Figure 4:
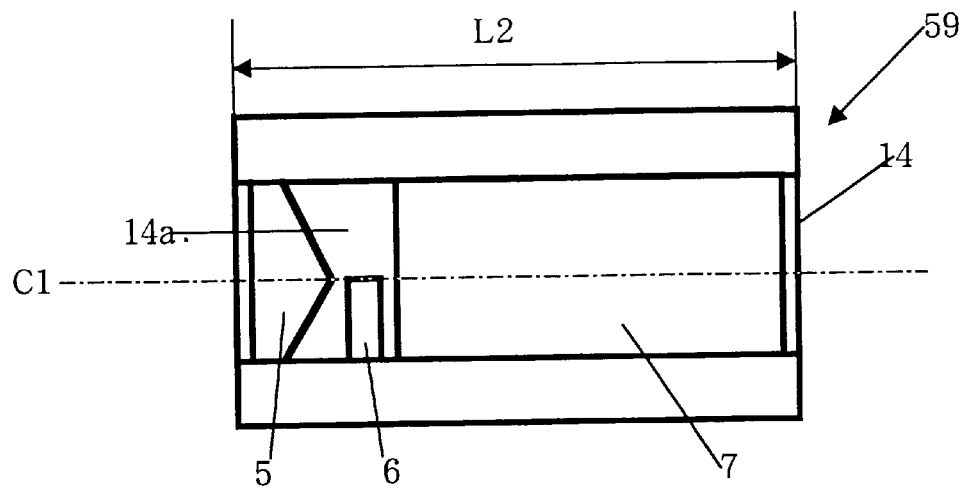
FIG. 4(A) is a plan view showing a polarization synthesizing module.
FIG. 4(B) is a side sectional view thereof.
FIG. 4(C) is a front view thereof.
Figure 4:
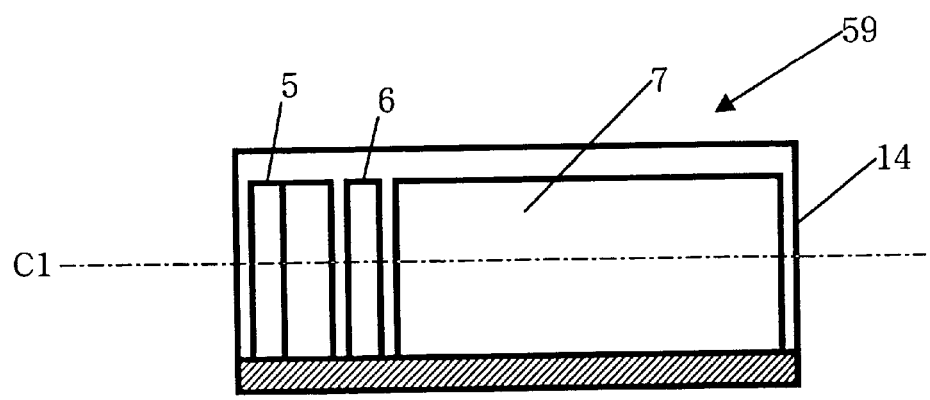
Figure 4:
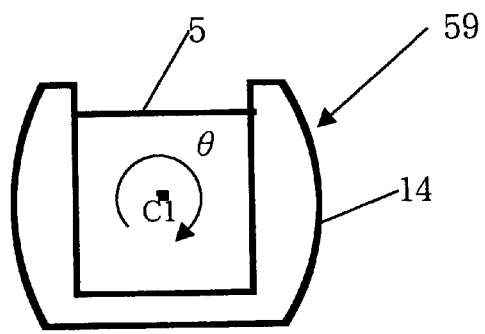
Figure 12:
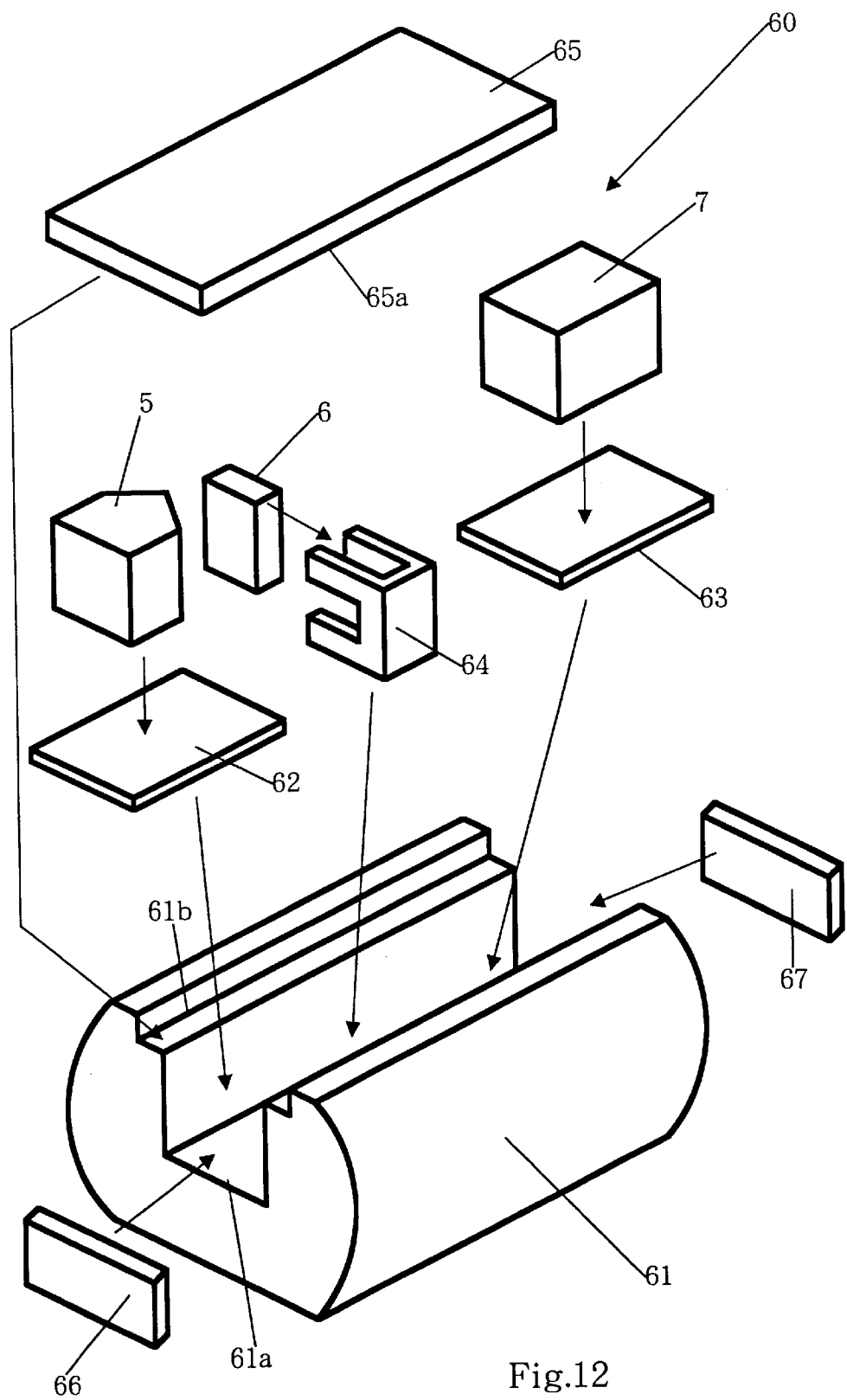
FIG. 12 is a fragmentary perspective view showing a polarization synthesizing module in accordance with a fourth embodiment of the present invention.
Figure 13:
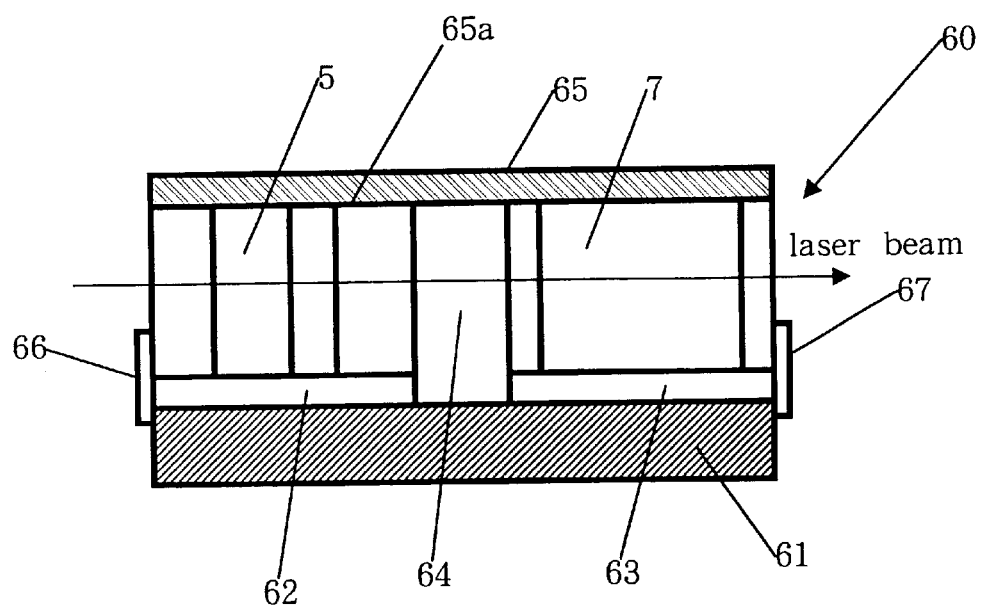
FIG. 13 is a side sectional view showing the polarization synthesizing module shown in FIG. 12.

FIG. 12 is a fragmentary perspective view showing a polarization synthesizing module 60 in accordance with a fourth embodiment of the present invention, used for a semiconductor laser module in the present invention and having a different configuration from that of the polarization synthesizing module 59 shown in FIG. 4. FIG. 13 is a side sectional view showing the polarization synthesizing module 60 shown in FIG. 12. Note that, the same members as those in the polarization synthesizing module 59 are marked with the same symbols, and their repetitive explanations are omitted.

As shown in FIGS. 12 and 13, the polarization synthesizing module 60 in the fourth embodiment includes a holder member 61 formed with a groove 61a (a accommodation space) extending in the longitudinal direction, first and second adjustment sheets 62, 63 so disposed as to be fitted into the groove 61a of the holder member 61, the prism 5 disposed on the first adjustment sheet 62, the PBC 7 disposed on the second adjustment sheet 63, a half-wave plate holder 64 so disposed as to be fitted into the groove 61a of the holder member 61, the half-wave plate 6 held by the half-wave plate holder 64, and a plate-like bottom cover 65 fixedly inset in a stepped portion 61b formed on an aperture side of the groove 61a of the holder member 61.

The holder member 61, the half-wave plate holder 64 and the bottom cover 65 are made of a material (e.g., Kovar) that can be YAG-laser-welded.

An upper portion of the half-wave plate 6 is metalized, and an upper portion of the half-wave plate holder 64 is gold-plated. The upper portion of the half-wave plate 6 is fixed by soldering to the upper portion of the half-wave plate holder 64.

The first and second adjustment sheets 62, 63 are formed of a material deformable enough to facilitate positioning of the prism 5 and the PBC 7 as well. The first and second adjustment sheets 62, 63 may be composed of a flexible member such as a soft metal (In, and so on) and a solder sheet (Sn—Pb, and so forth), and of a resilient member such as a resin.

The polarization synthesizing module 60 is also fitted with first and second stoppers 66, 67 fixed by the YAG laser welding to both side edges of the groove 61a of the holder member 61. As shown in FIG. 13, the first stopper 66 and the half-wave plate holder 64 hold the first adjustment sheet 62 sandwiched in therebetween and thus function as a slide stopper for the first adjustment sheet 62. Further, the second stopper 67 and the half-wave plate holder 64 hold the second adjustment sheet 63 sandwiched in therebetween and thus function as a slide stopper against the second adjustment sheet 63.

Note that the first and second stoppers 66, 67 may be formed beforehand integrally with the holder member 61.

Further, note that the first and second stoppers 66, 67 may be formed of transparent materials e.g. glass, resin. And lens, prizm 5, PBC 7, or half wave plate 6 can be used the stoppers 66,67.

Next, a method of assembling the polarization synthesizing module 60 in the fourth embodiment will be explained. At first, the first and second stoppers 66, 67 are fixed by the YAG laser welding to both of the side edges of the groove 61a of the holder member 61.

Subsequently, the half-wave plate 6 is secured by soldering to the half-wave plate holder 64.

Then, the half-wave plate holder 64 holding the half-wave plate 6 is fixed by the YAG laser welding to the groove 61a of the holder member 61. On this occasion, the half-wave plate holder 64 is positioned so that the first and second adjustment sheets 62, 63 are respectively fitted in between the first and second stoppers 62, 63 and the half-wave plate holder 64.

Next, the first adjustment sheet 62 is so disposed as to be fitted into the groove 61a of the holder member 61 between the first stopper 66 and the half-wave plate holder 64. Further, the second adjustment sheet 63 is so disposed as to be fitted into the groove 61a of the holder member 61 between the second stopper 67 and the half-wave plate holder 64.

Subsequently, the prism 5 is placed on the first adjustment sheet 62, and the PBC 7 is placed on the second adjustment sheet 63.

Then, the bottom cover 65 is set in the stepped portion 61b formed on the aperture side of the groove 61a of the holder member 61. The surfaces of the prism 5 and the PBC 7 are brought into contact with and pressed against an undersurface 65a of the bottom cover 65. The first and second adjustment sheets 62, 63 are thereby deformed, and the prism 5 and the PBC 7 are positioned in desired positions.

Finally, the bottom cover 65 is fixed by the YAG laser welding to the holder member 61.

In this polarization synthesizing module 60, the surfaces of the prism 5 and the PBC 7 are brought into contact with and pressed against the undersurface 65a of the bottom cover 65 and positioned with the aid of the deformations of the first and second adjustment sheets 62, 63. The undersurface 65a of the bottom cover 65 is formed flat with a higher working precision than the surface of the groove 61a. Accordingly, the light incident surfaces of the prism 5 and of the PBC 7, which have been brought into contact with the undersurface 65a of the bottom cover 65, are positioned precisely perpendicular with respect to the undersurface 65a of the bottom cover 65, whereby a rotational direction e about the optical axis can be positioned with high accuracy.

Considering from this point, it is feasible that the working precision of the undersurface 65a of the bottom cover 65 where the surface of the prism 5 and PBC are brought into contact, may fulfil at least one of below conditions of the planar roughness;

maximum height, Rmax=≦10 μm, center-line-average-roughness, Ra=≦5 μm, average roughness measured at 10 points, Ra=≦10 μm.

Note that the first and second adjustment sheets 62, 63 can be integrated to one sheet.

Note that the prism 5 and the PBC 7 may be gold-plated and fixed by soldering directly to the groove 61a of the holder member 61. In this case, the first and second adjustment sheets 62, 63 are not required, however, it is preferable that the working surface of the groove 61a be formed accurately.

(Fifth Embodiment)

Figure 14:
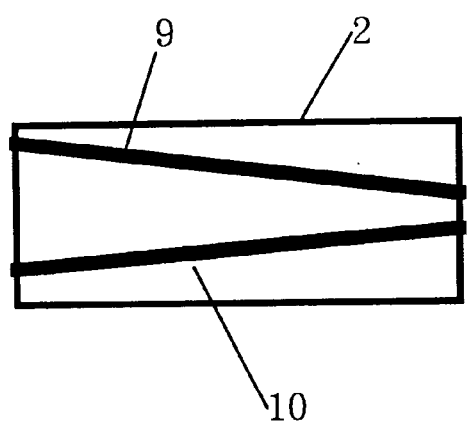
FIG. 14 is an explanatory diagram schematically showing a semiconductor laser device in accordance with the fifth embodiment of the present invention.

The first and second stripes 9, 10 of the semiconductor laser device 2 described above are formed extending in parallel to each other in the longitudinal direction. The first and second stripes 9, 10 may, however, for instance, be formed to be inclined to each other as shown in FIG. 14 without being limited to the parallelism. Referring to FIG. 14, the right side is a direction in which the laser beams are emitted, and the space between the stripes 9 and 10 becomes narrower as it gets closer to the right side edge. In this case, the two first and second laser beams K1, K2 emitted from the two stripes 9, 10 intersect each other at a comparatively short distance from the semiconductor laser device 2, and, after traveling through the first lens 4, split (which implies that a divergent width D' becomes sufficiently large in FIG. 2). Therefore, a required propagation distance (L in FIG. 2) decreases, and hence the length of the semiconductor laser module M in the optical-axis direction can be reduced.

Note that the propagation distance L can be likewise reduced even when emitting the laser beams in the leftward direction.

(Sixth Embodiment)

Figure 15:
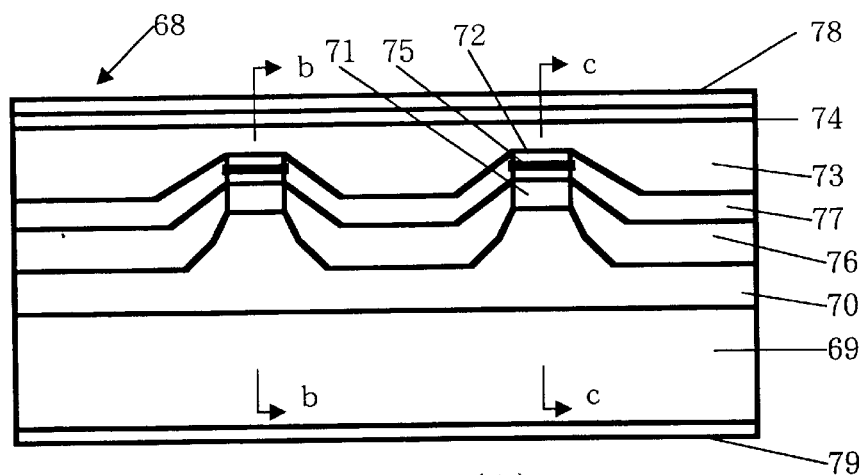
FIGS. 15(A) to 15(C) are explanatory views showing a configuration of the semiconductor laser device in accordance with a sixth embodiment of the present invention.
Figure 15:
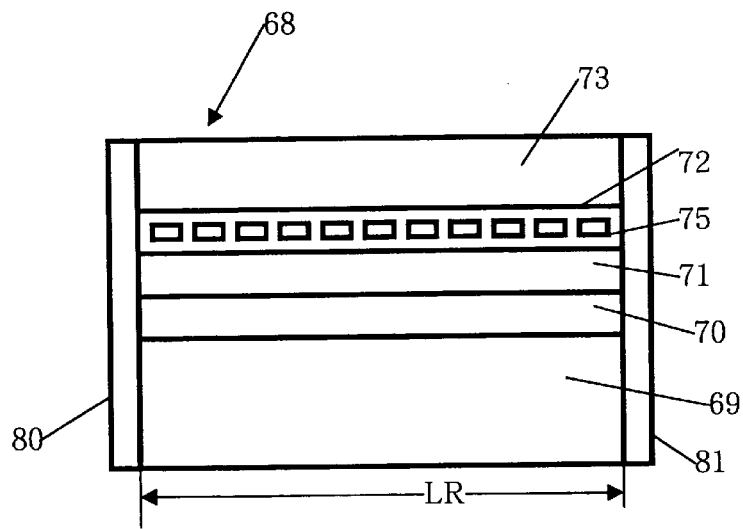
Figure 15:
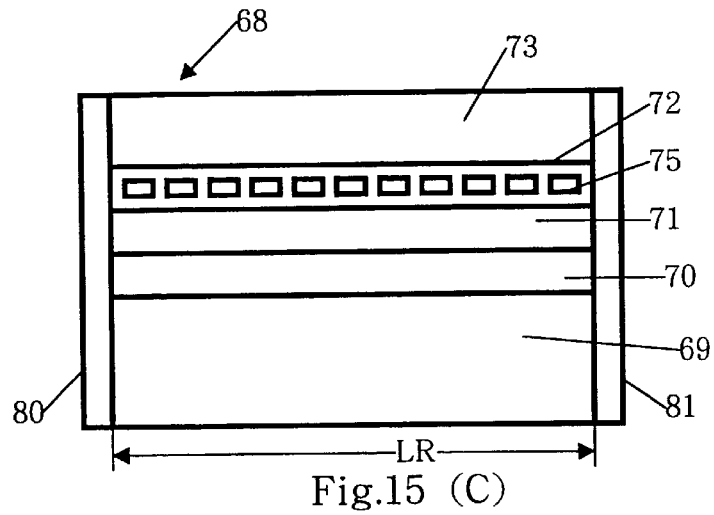

FIGS. 15(A) to 15(C) show a semiconductor laser device 68 in accordance with a sixth embodiment used for the semiconductor laser module in accordance with the embodiments of the present invention and having a different configuration from the semiconductor laser device 2 shown in FIGS. 8(A) to 8(C). FIGS. 15(B) and 15(C) are sectional views taken along the line b—b and the line c—c in FIG. 15(A), respectively.

As shown in FIGS. 15(A) through 15(C), the semiconductor laser device 68 in the sixth embodiment has a structure that an n-InP buffer layer 70 serving as an n-InP buffer layer and a lower clad layer, a GRIN-SCH-MQW (distribution refractive index isolating/trapping multi quantum well) active layer 71, a p-InP upper clad layer 72, a p-Inp buried layer 73 and an InGaAsP cap layer 74, are laminated sequentially on a surface (100) of an n-InP substrate 69.

Within each the p-InP upper clad layer 72 of the two stripes, p-InGaAs diffraction gratings 75 each having a thickness on the order of 20 nm are formed periodically at a pitch of approximately 230 $\mu$m. The diffraction gratings 75 serve to adjust a center wavelength of the laser beams to a predetermined wavelength, e.g. in the 1.48 $\mu$m band. Upper portions of the p-InP upper clad layer 72 containing the diffraction grating 75, the GRIN-SCH-MQW active layer 71 and the n-InP buffer layer 70, are worked in a mesa stripe. Both sides of the mesa strip are embedded in a p-InP blocking layer 76 and an n-InP blocking layer 77 that are formed as current blocking layers. Further, a p-type electrode 78 is provided on an upper surface of the InGaAsP cap layer 74, and an n-type electrode 79 is provided on an undersurface of the n-ip substrate 69.

A first reflection layer 80 having a reflectance as high as 80% or greater is provided on a beam reflection edge surface as one edge surface of the semiconductor laser device 68 in the longitudinal direction. A second reflection layer 81 having a reflectance as low as 5% or less is provided on a beam output edge surface as the other edge surface thereof. The beams generated within the GRIN-SCH-MQW active layer 71 of an optical resonator formed of the first and second reflection layers 80, 81, are reflected by the first reflection layer 80 and exit as laser beams via the second reflection layer 81.

The semiconductor laser device 68, if used as a pumping light source for, e.g., the Raman amplifier, has its oscillation wavelength $\lambda_0$ on the order of 1300 to 1550 nm and a cavity length $L_R$ that is set from not less than 800 $\mu$m to not more than 3200 $\mu$m.

Note that, a mode spacing $\Delta\lambda$ of the longitudinal mode occurred by the resonator of the semiconductor laser device is generally expressed by the following formula.

Namely;

$$\Delta\lambda = \lambda_0^2/(2 \cdot n \cdot L_R)$$

Herein, if the oscillation wavelength $\lambda_0$ is set to 1480 $\mu$m and an equivalent refractive index is set to 3.5, when the cavity length is 800 $\mu$m, the longitudinal mode spacing $\Delta\lambda$ is approximately 0.39 nm. When the cavity length is 3200 $\mu$m, the longitudinal mode spacing $\Delta\lambda$ is approximately 0.1 nm. That is, as the cavity length is set larger, the longitudinal mode spacing $\Delta\lambda$ becomes narrower, which means that the selection condition for oscillating the laser beams of the single longitudinal mode gets strict.

Figure 16:
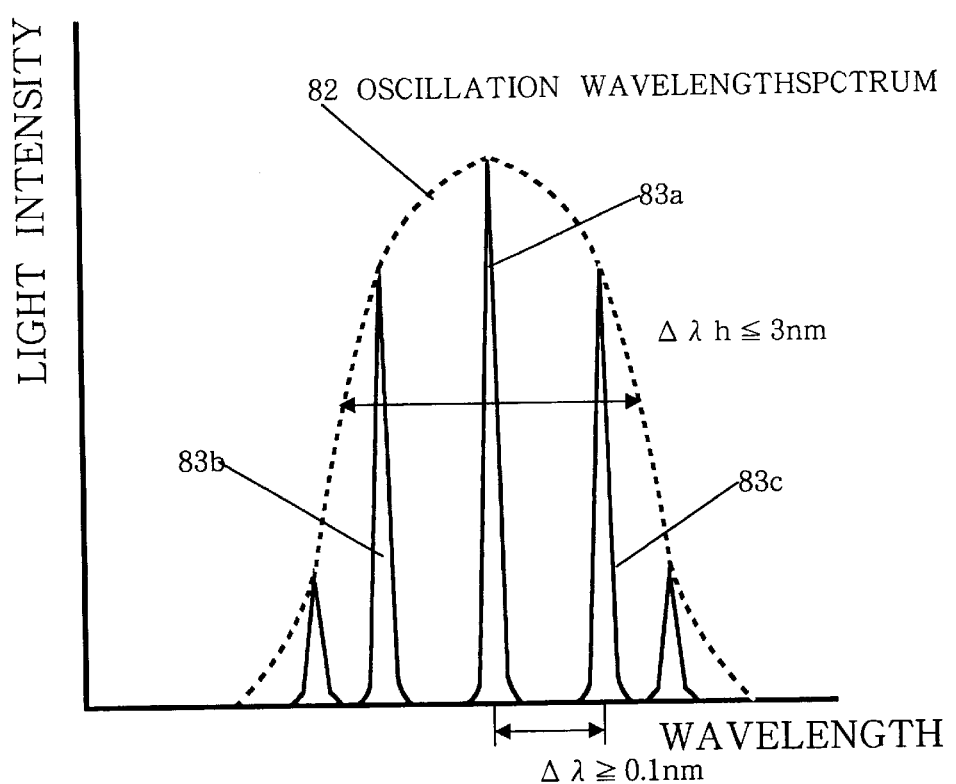
FIG. 16 is a graph showing a relationship between an oscillation wavelength spectrum and an oscillation longitudinal mode in the semiconductor laser device in accordance with the sixth embodiment of the present invention.

The diffraction grating 75 selects the longitudinal mode with a Bragg wavelength thereof. A wavelength selecting characteristic of this diffraction grating 75 is given as an oscillation wavelength spectrum 82 shown in FIG. 16. As shown in FIG. 16, a contrivance in accordance with the sixth embodiment is that a plurality of oscillation longitudinal modes exist within the wavelength selection characteristic shown by a FWHM $_h$ of the oscillation wavelength spectrum by the semiconductor laser device with the diffraction grating including the diffraction gratings 75. The conventional semiconductor laser device, if the cavity length $L_R$ is set to 800 $\mu$m or larger, is difficult to achieve the single longitudinal mode oscillations. Therefore, the semiconductor laser device having the above cavity length $L_R$ has not been used. The semiconductor laser device 68 in the sixth embodiment, however, with the cavity length $L_R$ positively set to 800 $\mu$m or larger, emits the laser beams, in which the plurality of oscillation longitudinal modes are contained within the FWHM $\Delta\lambda_h$ of the oscillation wavelength spectrum. Referring to FIG. 16, the FWHM $\Delta\lambda_h$ of the oscillation wavelength spectrum contains three oscillation longitudinal modes 83a to 83c.

Figure 17:
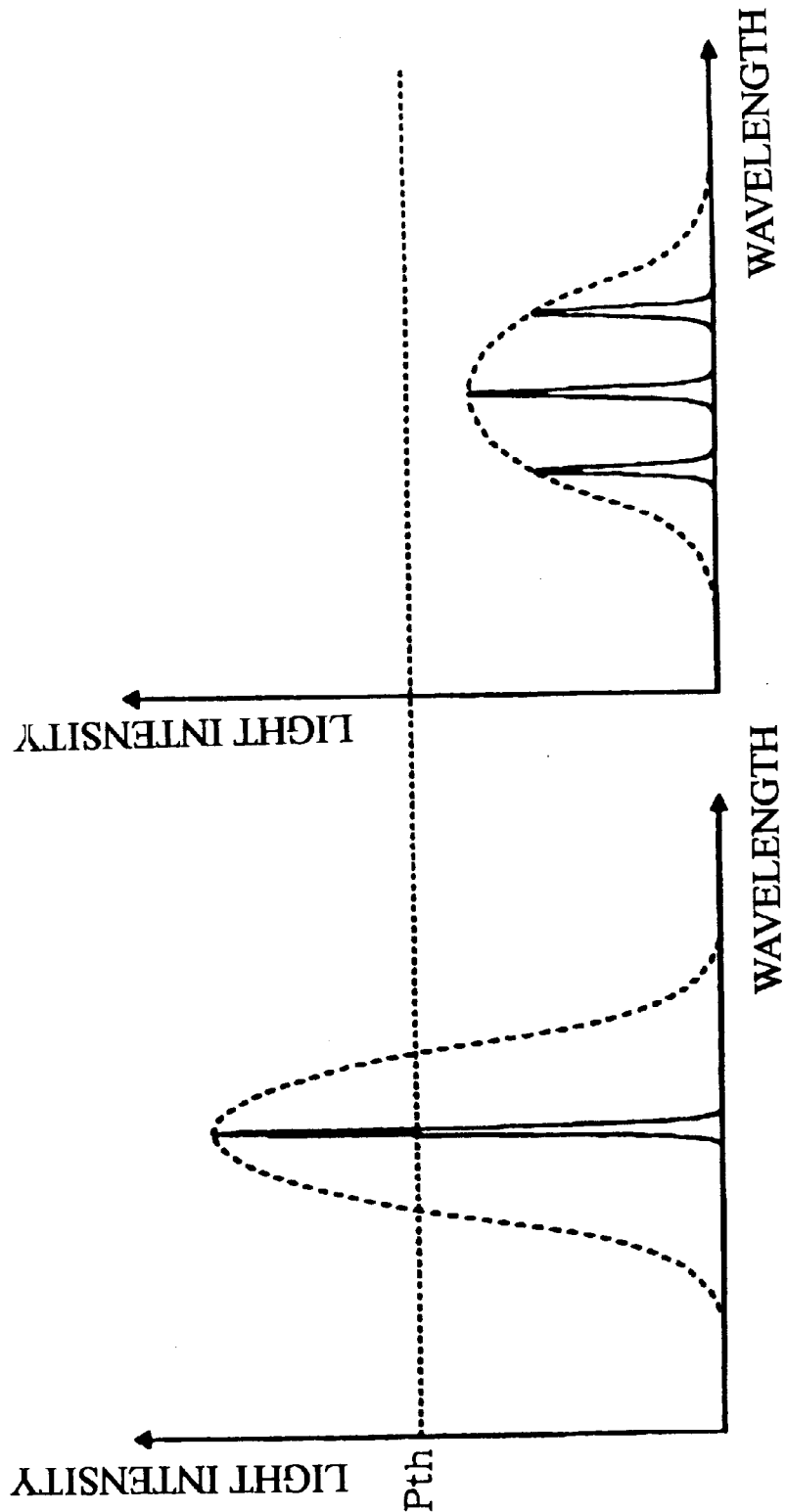
FIGS. 17(A) and (B) are graphs showing a relationship in laser optical output power between the single oscillation longitudinal mode and a plurality of oscillation longitudinal modes, and a threshold value of stimulated Brillouin scattering.

When using the laser beams having the plurality of longitudinal modes, a higher laser output value than in the case of using the laser beams of the single longitudinal mode can be obtained restraining the peak value of the laser emission. For example, the semiconductor laser device 68 exemplified in the sixth embodiment has a mode profile as shown in FIG. 17(B) and is capable of obtaining a high laser output with a low peak value. By contrast, FIG. 17(A) shows a mode profile of the single longitudinal mode oscillations having a high peak value by the semiconductor laser device in the case of obtaining the same laser output.

Herein, in the case of using the semiconductor laser device as the pumping light source for the Raman amplifier, it is preferable that pumping beam output power be increased in order to enhance a Raman gain. If a peak value thereof is high, however, the stimulated Brillouin scattering occurs, and there arises a problem in that the noises rise. With the occurrence of the stimulated Brillouin scattering, when obtaining the same laser output power including a threshold value Pth that triggers the occurrence of the stimulated Brillouin scattering, as shown in FIG. 17(B), the plurality of oscillation longitudinal modes are given, and its peak value is restrained, thereby making it feasible to obtain the high pumping beam output power having a plurality of longitudinal modes respectively within the threshold value Pth of the stimulated Brillouin scattering. As a result, a high Raman gain can be acquired.

Further, as shown in FIG. 16, the wavelength spacing (mode spacing) $\Delta\lambda$ between the oscillation longitudinal modes 83a to 83c is set to 0.1 nm or larger. This is because when the semiconductor laser device 68 is used as the pumping light source for the Raman amplifier, if the mode spacing $\Delta\lambda$ is 0.1 nm or less, there might be a high possibility in which the stimulated Brillouin scattering occurs. As a consequence, it is concluded preferable from the above formula of the mode spacing $\Delta\lambda$ that the cavity length $L_R$ be 3200 $\mu$m or less.

It is desirable that the number of the oscillation longitudinal modes contained within the FWHM $\Delta\lambda_h$ of the oscillation wavelength spectrum is three or more. It is because when the semiconductor laser device is used as the pumping light source for the Raman amplifier, there is a polarization dependency that the Raman amplification occurs in a state where the polarizing direction of the signal light is set to be coincident with the polarizing direction of the pumping beam, and hence there is a necessity of obtaining the pumping beam with no polarization by polarization-synthesizing the pumping beams emitted from the semiconductor laser device through the polarization retaining fiber. Generally, as the number of oscillation longitudinal modes increases, a necessary length of the polarization retaining fiber can be decreased. Particularly when there are four or five oscillation longitudinal modes, the necessary length of the polarization retaining fiber abruptly decreases. Accordingly, the length of the polarization retaining fiber used in the Raman amplifier can be reduced by setting the number of oscillation longitudinal modes to three or more and particularly four or more, thereby simplifying and downsizing the Raman amplifier.

Further, the rise in the number of oscillation longitudinal modes leads to a decreased coherent length, and the degree of polarization decreases due to depolarization, with the result that the polarization dependency can be eliminated. This also makes it possible to simplify and downsize the Raman amplifier.

Herein, if the oscillation wavelength spectral width is too large, a multiplexing loss by a wavelength synthesizing coupler increases, and the noises and the gain fluctuations occur due to a wavelength behavior within the oscillation wavelength spectral width. Therefore, the FWHM $\Delta\lambda_h$ of the oscillation wavelength spectrum 82 is set to 3 nm or less and preferably to 2 nm or less.

Moreover, the semiconductor laser module using the fiber Bragg grating has a large relative intensity noise (RIN) due to a resonance between the FBG and the beam reflection surface, and there might be a case where the stable Raman amplification can not be effected. In contrast with this, the semiconductor laser module using the semiconductor laser device 68 in the sixth embodiment has no necessity of using the FBG, and the laser beams emerging from the second reflection layer 81 can be used directly as the pumping light source for the Raman amplifier. Hence, the relative intensity noises decrease with the result that a fluctuation in the Raman gain becomes small, and the stable Raman amplification can take place.

Moreover, the semiconductor laser module using the FBG is required to have the optical coupling between the optical fiber containing the FBG and the semiconductor laser device, and therefore needs the alignment of the optical axis when assembling the semiconductor laser device. This is time-consuming and takes a labor. In contrast with this, the semiconductor laser device 68 in the sixth embodiment needs the alignment of the optical axis not for the resonator but for the optical output and is therefore easier to assemble.

Further, the semiconductor laser module using the FBG requires the mechanical coupling within the resonator, and consequently there arises a case in which the oscillation characteristic of the laser changes due to the vibrations or the like. By contrast, the semiconductor laser device 68 in the sixth embodiment has no change in the laser oscillation characteristic due to the mechanical vibrations or the like, and is capable of obtaining the stable optical output.

According to the sixth embodiment, the semiconductor laser device 68 makes the wavelength selection with the aid of the diffraction gratings 75, and sets the oscillation wavelength to 1300 to 1500 μm and the cavity length $L_R$ to 800 to 3200 μm, thereby emitting the laser beams having the plurality of oscillation longitudinal modes, preferably four or more oscillation longitudinal modes within the FWHM $\Delta\lambda_h$ of the oscillation wavelength spectrum 82. As a result, the stable and high Raman gain can be obtained without the occurrence of the stimulated Brillouin scattering in the case of being used as the pumping light source for the Raman amplifier.

Further, the optical coupling of the semiconductor laser device to the optical fiber containing the FBG is not attained within the resonator, thereby facilitating the assembly and making it feasible to avoid the unstable emission derived from the mechanical vibrations or the like.

(Seventh Embodiment)

FIGS. 18(A) to 18(C) are vertical sectional views each showing a configuration of the semiconductor laser device in the longitudinal direction according to a seventh embodiment.

In the sixth embodiment discussed above, there are provided the plurality of longitudinal modes within FWHM $\Delta\lambda_h$ of the oscillation wavelength spectrum 82 by increasing the cavity length $L_R$. In contrast with this contrivance, according to the seventh embodiment, the FWHM $\Delta\lambda_h$ of the oscillation wavelength spectrum 82 is changed by varying a grating length LG of the diffraction grating or a coupling coefficient, whereby the number of longitudinal modes within FWHM $\Delta\lambda_h$ becomes relatively plural.

As shown in FIG. 18(A), a semiconductor laser device 84a is different in layout of the diffraction gratings 75 from the semiconductor laser device 68 in the sixth embodiment, and has a different reflectance of the second reflection layer 81. The configurations of other components are substantially the same as those of the semiconductor laser device 68, and the same components are marked with the same reference numerals, of which the repetitive explanations are omitted.

The diffraction gratings 75 are provided by a predetermined length LG1, extending from the second reflection layer 81 having a beam reflectance as low as 2% or less, suitably 1% or less, more suitably 0.2% or less, toward the first reflection layer 80 having a beam reflectance as high as 80% or greater, but are not provided on the p-InP spacer layer 72 out of the predetermined length LG1.

Further, FIG. 18(B) is a vertical sectional view showing in the longitudinal direction a configuration of a semiconductor laser device 84b defined as a modified example of the seventh embodiment. This semiconductor laser device 84b has the diffraction gratings 75 provided on the side of the first reflection layer 80, in which the beam reflectance of the first reflection layer 80 is set to be low. Namely, the diffraction gratings 75 are provided to a predetermined length LG2, extending from the first reflection layer 80 having a beam reflectance as low as 2% or less toward the second reflection layer 81 having a beam reflectance as low as 1 to 5%, but are not provided on the p-InP spacer layer 72 out of the predetermined length LG2.

Moreover, FIG. 18(C) is a vertical sectional view showing in the longitudinal direction a configuration of a semiconductor laser device 84c defined as another modified example of the seventh embodiment. This semiconductor laser device 84c adopts the layouts of the diffraction gratings 75 shown in FIG. 18(A) and of the refracting gratings 75 shown in FIG. 18(B).

Namely, the semiconductor laser device 84c has the diffraction gratings 75 provided by a predetermined length LG3, extending from the second reflection layer 81 having a beam reflectance as low as 2% or less toward the first reflection layer 80 having a beam reflectance as low as 2% or less, and the refracting gratings 75 provided by a predetermined length LG4, extending from the first reflection layer 80 toward the second reflection layer 81.

Figure 18:
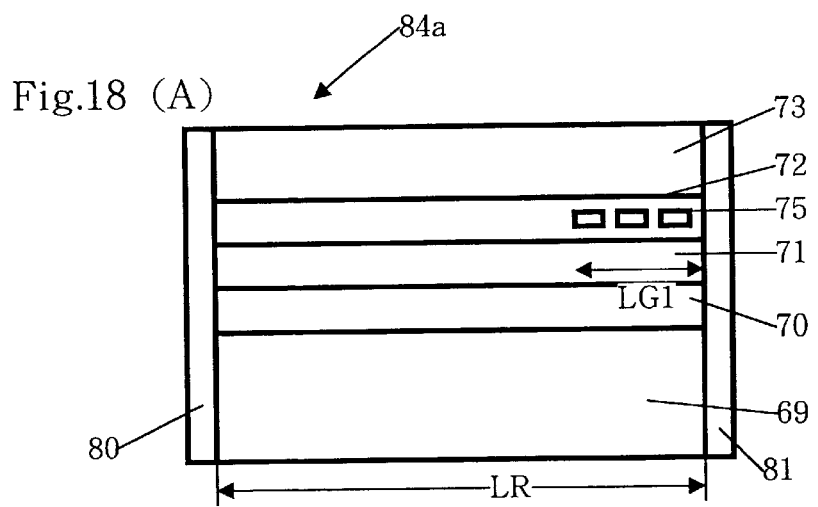
FIGS. 18(A) to 18(C) are vertical sectional views each showing in the longitudinal direction a configuration of the semiconductor laser device in accordance with a seventh embodiment of the present invention.
Figure 18:
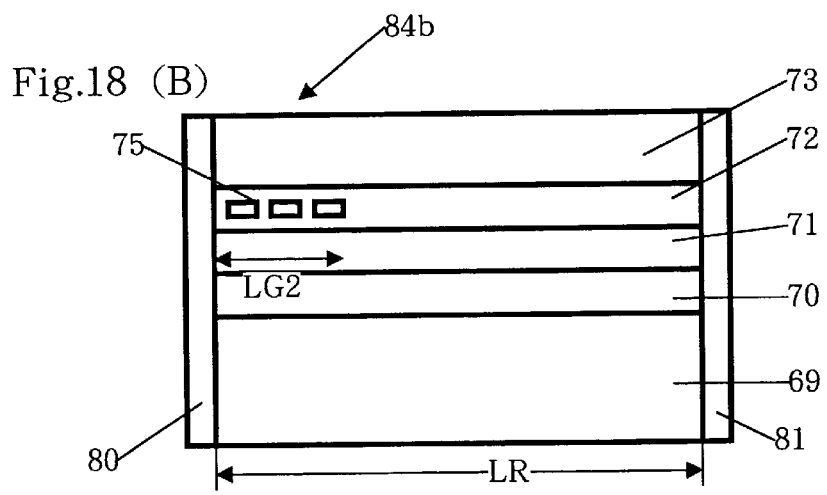
Figure 18:
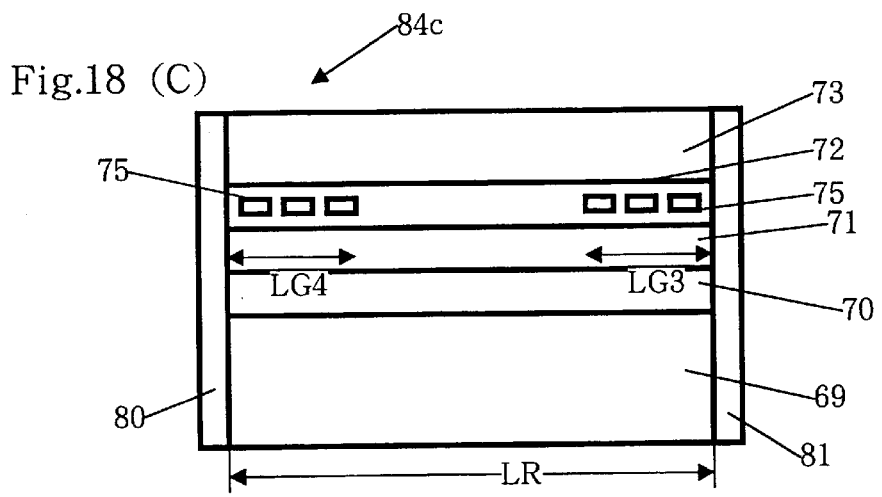

The FWHM $\Delta\lambda_h$ of the oscillation wavelength spectrum 82 shown in FIG. 16 can be varied by changing the predetermined lengths of the diffraction gratings 75 shown in FIG. 18 even if the mode spacing ax of the oscillation longitudinal modes is a fixed value.

That is, it is effective to reduce the length of the diffraction gratings 75 for increasing the FWHM $\Delta\lambda_h$ of the oscillation wavelength spectrum 82. Hence, as shown in the seventh embodiment, the diffraction gratings 75 are not provided over the entire length of the resonator (GRIN-SCH-MQW active layer 71) but are provided to a segment of this cavity length.

In this case, a phase oscillation condition might deviate depending on the positions of the refracting gratings 75 with respect to the resonator, and this deviation might induce a decline of the laser oscillation characteristic. Hence, as shown in FIG. 18(A), when the refracting gratings 75 are provided extending from the second reflection layer 81 as its starting point up to a point halfway along the resonator toward the first reflection layer 80, the second reflection layer 81 has the reflection coating that exhibits the reflectance as low as 2% or less, and the first reflecting layer 80 has the reflection coating that exhibits the reflectance as high as 80% or greater. Further, as shown in FIG. 18(B), when the refracting gratings 75 are provided extending from the first reflection layer 80 as its starting point up to a point halfway along the resonator toward the second reflection layer 81, the first reflection layer 80 has the reflection coating that exhibits the reflectance as low as 2% or less, and the second reflecting layer 81 has the reflection coating that exhibits the reflectance as low as 1 to 5%. Moreover, as shown in FIG. 18(C), when the refracting gratings 75 are provided on the sides of the second and first reflection layers 81 and 80 respectively, both of the second and first reflection layers 81, 80 have the reflection coatings each showing the low reflectance on the order of 2% or less.

Further, as shown in FIG. 18(A), when the diffraction gratings 75 are provided on the side of the second reflection layer 81, it is preferable that the reflectance of the diffraction grating 75 itself be set comparatively low. As shown in FIG. 18(B), when the diffraction gratings 75 are provided on the side of the first reflection layer 80, it is preferable that the reflectance of the diffraction grating 75 itself be set comparatively high. Moreover, as shown in FIG. 18(C), when the diffraction gratings 75 are provided on both sides of the first and second reflection layers 80, 81, the reflectance of the diffraction grating 75 itself provided on one side is set comparatively low, and the reflectance of the diffraction grating 75 itself provided on the other side is set comparatively high. With the settings described above, it is feasible to reduce the influence of the first and second reflection layers 80, 81 upon the Fabry-Perot resonator in such a way that the wavelength selection characteristic of the diffraction gratings 75 is satisfied.

To be more specific, the semiconductor laser device shown in FIG. 18(A) is 1300 $\mu$m in the cavity length $L_R$, 50 $\mu$m in the grating length of the diffraction gratings 75 and 0.125 in the product K*LG of the coupling coefficient K and FBG length LG. When the diffraction gratings 75 described above are applied, the FWHM $\Delta\lambda_h$ of the oscillation wavelength spectrum 82 is approximately 2 nm, and the FWHM $\Delta\lambda_h$ can contain three to eight oscillation longitudinal modes.

Further, referring to FIGS. 18(A) through 18(C), the diffraction gratings 75 are provided on the side of the second reflection layer 81 or the first reflection layer 80, or on the sides of the second and first reflection layers 81, 80. The diffraction gratings 75 may, however, be provided to a segment of the cavity length along the GRIN-SCH-MQW active layer 71 without being limited to the above layouts. It is, however, desirable that the reflectance of the diffraction grating 75 be taken into consideration.

According to the seventh embodiment, the length of the diffraction gratings 75 is set segmental to the cavity length $L_R$, and the grating length LG and the coupling coefficient KLG of the diffraction gratings 75 are properly varied, thereby obtaining the desired FWHM $\Delta\lambda_h$ of the oscillation wavelength spectrum 82. Then, the laser beams having the plurality of oscillation longitudinal modes within this FWHM $\Delta\lambda_h$ can be oscillated, and the semiconductor laser device exhibiting the same operation effects as those in the sixth embodiment can be actualized.

(Eighth Embodiment)

Figure 19:
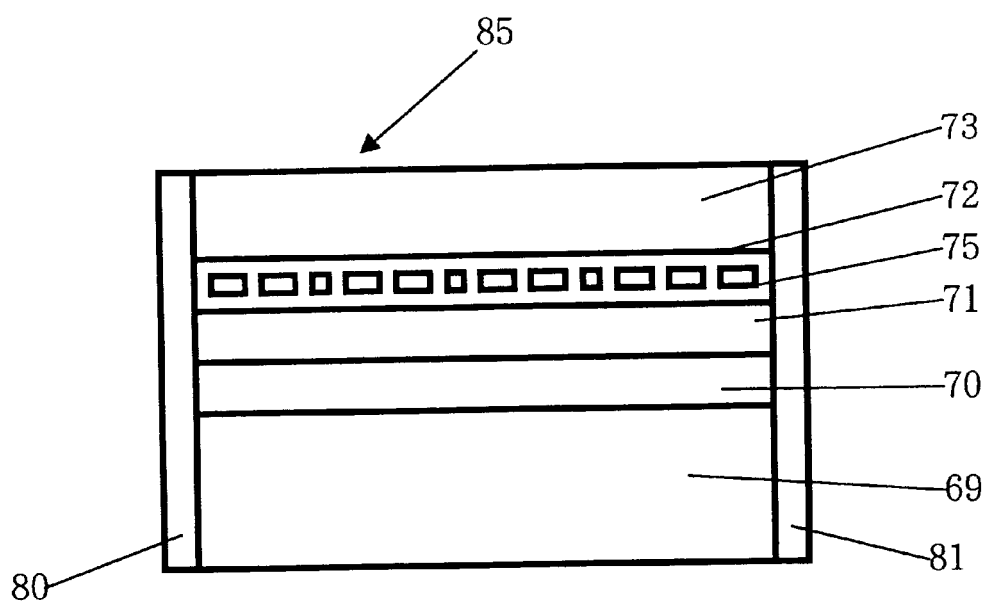
FIG. 19 is a vertical sectional view showing in the longitudinal direction a configuration of the semiconductor laser device in accordance with an eighth embodiment of the present invention.

FIG. 19 is a vertical sectional view showing in the longitudinal direction a configuration of the semiconductor laser device in accordance with an eighth embodiment of the present invention.

The grating period of the diffraction gratings 75 is fixed in the sixth and seventh embodiments discussed above. In this eighth embodiment, however, the eighth embodiment involves the use of chirped gratings in which the grating period of the diffraction gratings 75 is periodically changed, thereby causing a fluctuation in the wavelength selection characteristic of the diffraction gratings 75 and expanding the FWHM $\Delta\lambda_h$ of the oscillation wavelength spectrum 82. Then, the number of the longitudinal modes within the FWHM $\Delta\lambda_h$ is made relatively plural.

As shown in FIG. 19, the semiconductor laser device 85 has the diffraction gratings 75 categorized as the chirped gratings in which the grating period of the diffraction gratings 75 is periodically changed. The configurations of other components are the same as those of the semiconductor laser device 68 in the sixth embodiment, and the same components are marked with the same symbols, of which the repetitive explanations are omitted.

Figure 20:
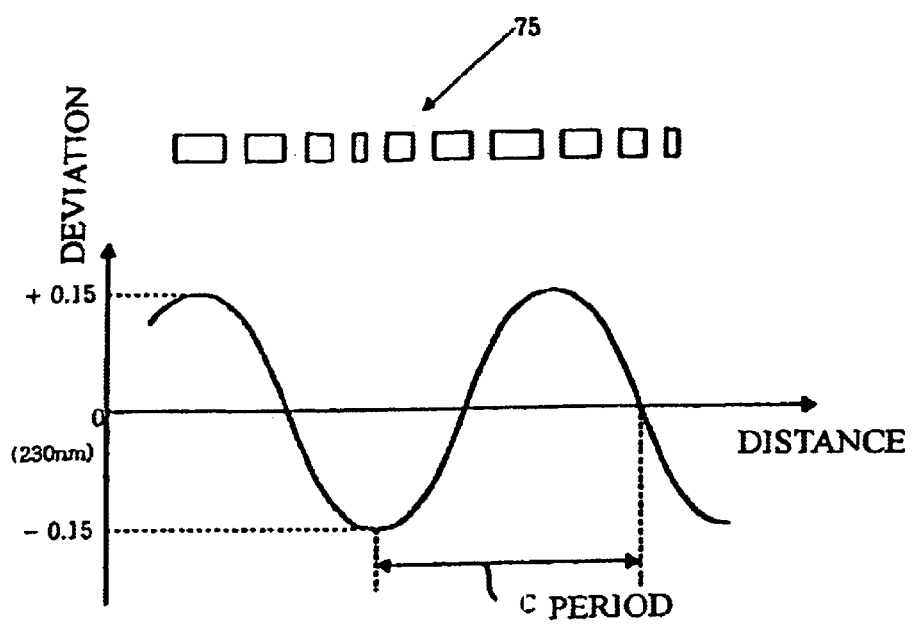
FIG. 20 is an explanatory diagram showing a fluctuation in period of diffraction gratings provided in the semiconductor laser device shown in FIG. 19.

FIG. 20 is a graph showing the periodic change of the grating period of the diffraction gratings 75. As shown in FIG. 20, the refracting gratings 75 have such a structure that an average period is 230 nm, and a periodic fluctuation (deviation) on the order of ±0.15 nm is repeated with a period C. The reflection band of the diffraction gratings 75 has a FWHM of approximately 2 nm due to the periodic fluctuation of 10.15 nm, and about three to six oscillation longitudinal modes can be thereby given within the FWHM $\Delta\lambda_h$ of the oscillation wavelength spectrum 82.

In the eighth embodiment discussed above, the chirped gratings are provided having a length equal to the cavity length $L_R$. The diffraction gratings 75 as the chirped gratings may, however, be disposed to a segment of the cavity length $L_R$ as in the seventh embodiment without being limited to the layout given above. Namely, the chirped gratings exemplified in the eighth embodiment discussed above may be applied to the seventh embodiment.

Further, the eighth embodiment involves the use of the chirped gratings in which the grating period is changed with the fixed period C. The grating period is not, however, restricted to this period C and may also be changed at random between a period $\lambda 1$(230 nm+0.15 nm) and a period $\lambda 2$ (230 nm−0.15 nm).

Figure 21A:
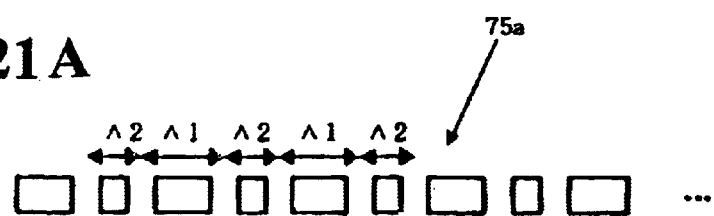
FIG. 21 is an explanatory diagram showing a modified example for actualizing the fluctuation in period of the diffraction gratings provided in the semiconductor laser device shown in FIG. 19.
Figure 21B:
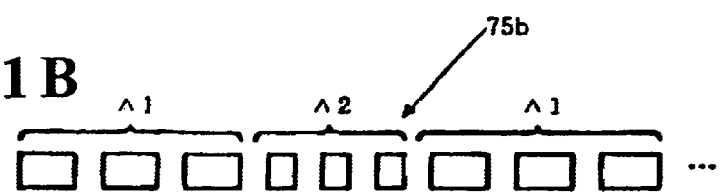
Figure 21C:
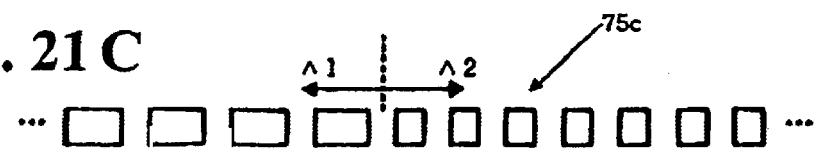

Moreover, as shown in FIG. 21(A), diffraction gratings 75a with the period $\lambda 1$ and the period $\lambda 2$ repeated one by one alternately may be given a period fluctuation. Further, as shown in FIG. 21(B), diffraction gratings 75b with the period $\lambda 1$ and the $\lambda 2$ each repeated a plurality of times alternately may be given a period fluctuation. Still further, as shown in FIG. 21(C), diffraction gratings 75c having a plurality of consecutive periods $\lambda 1$ and a plurality of consecutive periods $\lambda 2$ may be given a period fluctuation. Moreover, the diffraction gratings may be laid out with complementing a period having a different discrete value between the period λ1 and the λ2.

In the eighth embodiment, the diffraction gratings 75 provided in the semiconductor laser device are formed as the chirped gratings and so on, thereby giving the period fluctuation on the order of ±0.05 to 0.2 nm with respect to the average period. The FWHM of the reflection band is thereby set to a desired value, the FWHM $\Delta\lambda_h$ of the oscillation wavelength spectrum is finally determined, and the laser beams with the plurality of oscillation longitudinal modes contained within the FWHM $\Delta\lambda_h$ are outputted. It is therefore possible to actualize the semiconductor laser device having the same operation effects as those in the sixth or seventh embodiment.

(Ninth Embodiment)

According to the semiconductor laser devices in the sixth through eighth embodiments, the wavelengths selected by the diffraction gratings 75 provided in the two stripes are substantially the same. By contrast, according to the semiconductor laser device in accordance with a ninth embodiment of the present invention, the wavelengths selected by the diffraction gratings 75 provided in the two stripes are selectively set different.

If the wavelengths selected by the diffraction gratings 75 provided in the two stripes slightly deviate (on the order of 0.1 nm or larger but less than 3 nm, for example, approximately 0.5 nm), the spectrum obtained by overlapping contains a much larger number longitudinal modes within the wavelength FWHM required in the Raman amplification. The DOP (degree of polarization) can be thereby reduced more effectively.

Further, the wavelengths selected by the diffraction gratings 75 provided in the two stripes may deviate on the order of several nm to several tens of nm (e.g., 3 nm or larger). Normally in the Raman amplification, absolutely different wavelengths, for instance, 1430 run and 1450 nm, are combined for use as a pumping light source. The two stripes can be designed to emit the 2-wavelength laser beams by providing the diffraction gratings 75 in the two stripes. That is, it follows that the wavelengths are synthesized by the single semiconductor laser module, and hence there is no necessity for the architecture including the two semiconductor laser modules and the externally-attached wavelength synthesizing coupler as in the prior art. This attains the downsizing and saving parts.

In the ninth embodiment, the optical output often needs to be controlled by the respective wavelengths thereof. This being the case, as shown in FIG. 8(C), a separation trench 38 is formed between the two stripes, and the surface of the separation trench 38 is covered with an insulation layer, whereby the two stripes, it is preferable, be electrically separated.

The degree of freedom of the wavelengths of the laser beams outputted from the semiconductor laser module can be increased by forming the two types with an arbitrary combination of the diffraction gratings 75 in the sixth through ninth embodiments discussed above.

As a matter of course, the half-wavelength plate 6 may not be used if the wavelength synthesizing element (e.g., the prism is used as the wavelength synthesizing element) composed of a birefringence substance like rutile when wavelength-synthesizing the beams emitted from the two stripes described above (when the polarization-synthesizing is not required).

(Tenth Embodiment)

In the double-stripe type semiconductor laser module for emitting the two fluxes of laser beams as exemplified in the first through fifth embodiments, what is normally done for attaching the polarization retaining fiber formed with FBG as a pigtail fiber is a method of setting it by making the polarizing plane of the two fluxes of laser beams coincident with a polarization retaining axis of the polarization retaining fiber.

By contrast, the tenth embodiment involves using the semiconductor laser device formed with the two stripes containing the diffraction gratings 75 exemplified in each of the sixth through ninth embodiments and eliminates the necessity for FBG, wherein the optical coupling is attained in such a way that the polarizing plane of the polarization retaining fiber deviates 45 degrees from the polarizing plane of the semiconductor laser device. This contrivance enables the polarization retaining fiber to function as a depolarizer and makes it possible to effectively reduce the DOP.

(Eleventh Embodiment)

Figure 22:
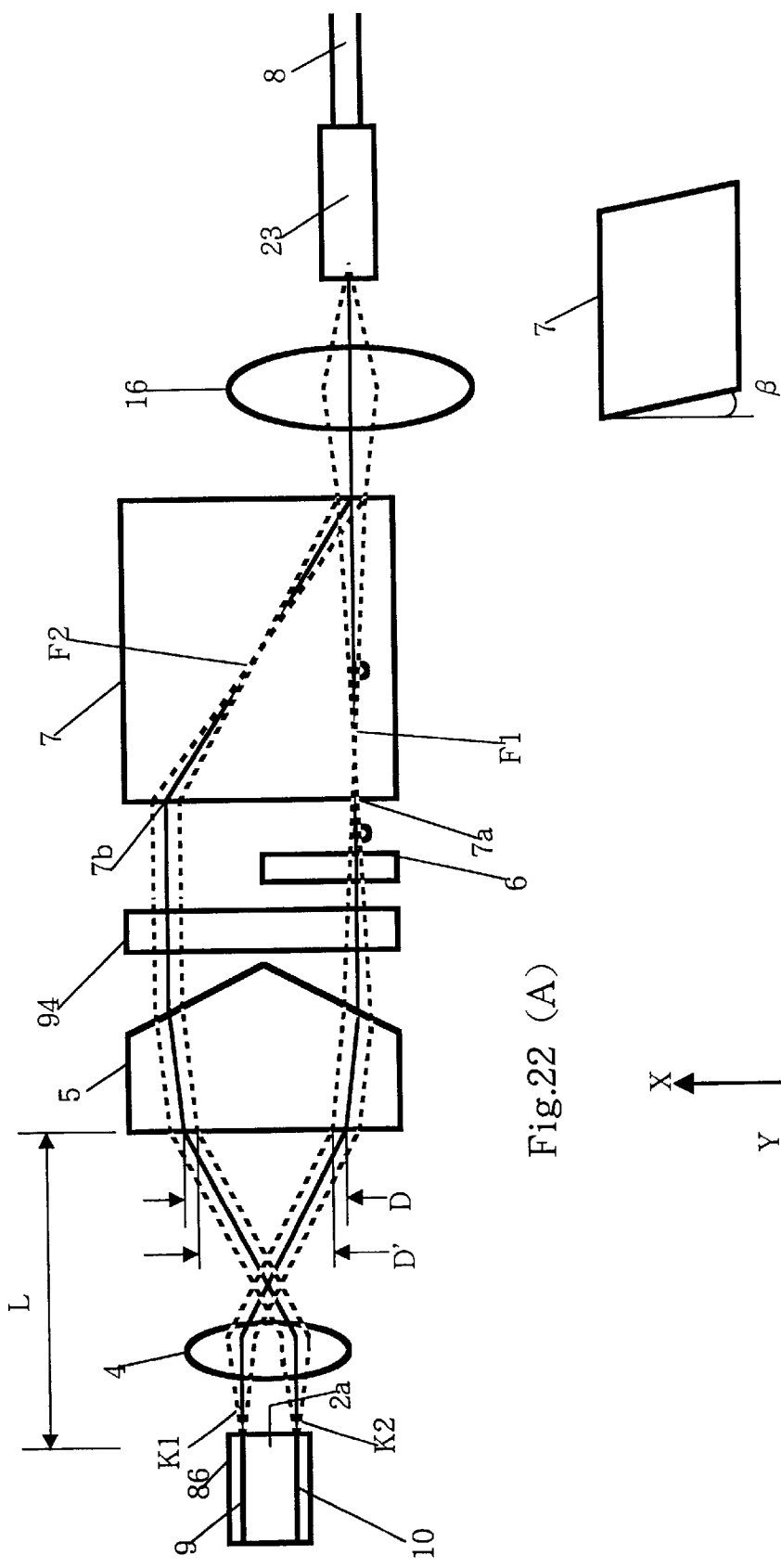
FIG. 22 is an explanatory diagram schematically showing a configuration of the semiconductor laser module in accordance with an eleventh embodiment of the present invention.

FIG. 22 is an explanatory diagram schematically showing a configuration of the semiconductor laser module in accordance with an eleventh embodiment of the present invention.

As shown in FIG. 22, the eleventh embodiment involves using one of the semiconductor laser devices exemplified in each of the sixth through tenth embodiments (which is denoted by the numeral 86 as the representative) each provided with the diffraction gratings 75 in the two stripes 9, 10, and there is eliminated the necessity of providing the optical fiber 8 with the beam reflection element 15 such as FBG and so on. Further, an optical isolator 94 that transmits the first beam K1 and the second laser beam K2 emitted from the semiconductor laser device 86 only toward the optical fiber 8, is disposed between the first lens 4 and the second lens 16. Other than this point, this embodiment is substantially the same as the semiconductor laser module in the first embodiment. The optical isolator disposed therebetween enables the semiconductor laser device 86 to stabilize its operation by preventing the reflection beams. Note that the optical isolator 94 is disposed in a position where the first and second laser beams K1, K2 are parallel, e.g., a position between the prism 5 and the half-wavelength plate 6, whereby one single optical isolator 94 suffices to correspond.

(Twelfth Embodiment)

Figure 23:
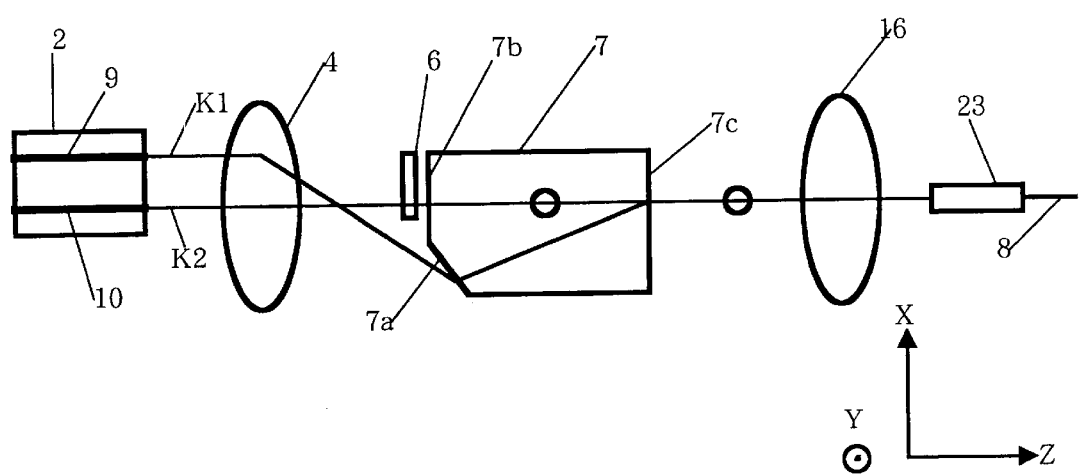
FIG. 23 is an explanatory diagram schematically showing a configuration of the semiconductor laser module in accordance with a twelfth embodiment of the present invention.

FIGS. 23(A) and 23(B) are explanatory diagrams schematically showing a configuration of the semiconductor laser module in accordance with a twelfth embodiment of the present invention.

As shown in FIG. 23(A), the twelfth embodiment has such a characteristic configuration that the second laser beams K2 of the first and second laser beams K1, K2 emitted from the semiconductor laser device 2 including the two stripes 9, 10 travels through the central point of the first lens 4 in the axial-line direction of the optical fiber 8.

In the optical synthesizing element 7 (PBC), the input part 7b and the output part 7c for the second laser beam K2 are formed perpendicularly to the optical axis of the second laser beam K2, and the input part 7a for the first laser beam K1 is formed with an inclination to these surfaces. Other than this point, this embodiment is substantially the same as the semiconductor laser module in the first embodiment.

According to this configuration, polishing to form the inclined surfaces onto the optical synthesizing element 7 are not needed except for the input part 7a, then the optical synthesizing element 7 can be obtained by low cost.

The PBC 7 rotates through approximately 1° about the Y-axis in order to prevent the reflection return beams to the semiconductor laser device 2. Further, as shown in FIG.

23(B), an incident surface of the PBC 7 may be given an inclination of angle β (e.g., 4 degrees) in the Z-axis direction for preventing the reflection return beams to the semiconductor laser device 2.

According to the twelfth embodiment, the second laser beam K2 travels through the central point of the first lens 4 in the axial-line direction of the optical fiber 8, and the first laser beam K1 is deflected by the first lens 4 with a wider divergence from the second laser beam K2, thereby eliminating the necessity of providing the prism and simplifying the configuration.

Moreover, the length of the semiconductor laser module in the optical axial direction can be reduced, and it is therefore possible to decrease the influence of the warp of the package upon the optical output characteristic in the high-temperature state.

Note that the half-wavelength plate 6 and the PBC 7 may be fixed to the same holder member 14 to configure the polarization synthesizing module to facilitate the angular adjustment about the central axis.

(Thirteenth Embodiment)

Figure 24:
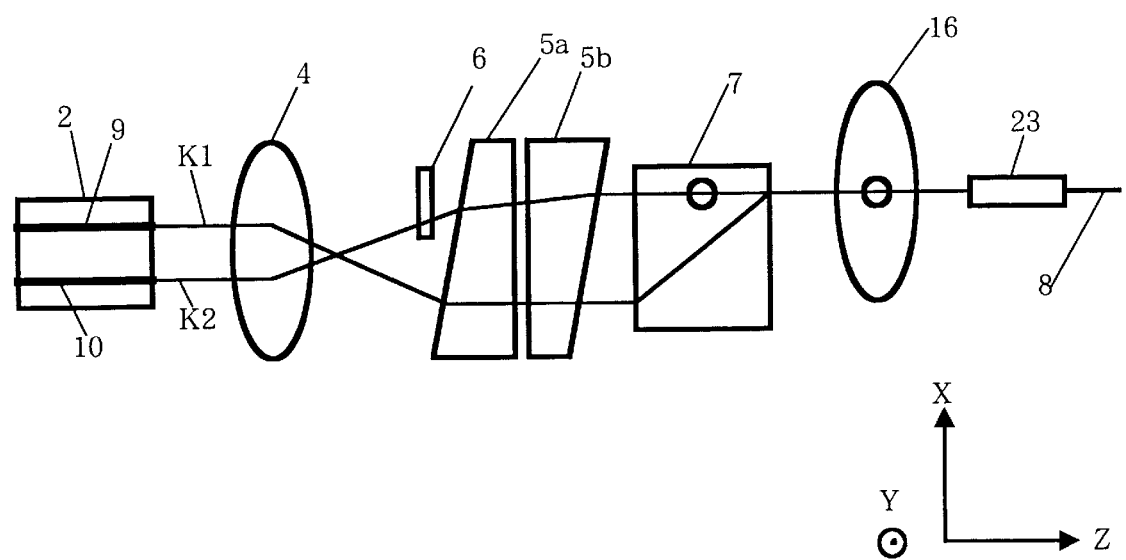
FIG. 24 is an explanatory diagram schematically showing a configuration of the semiconductor laser module in accordance with a thirteenth embodiment of the present invention.

FIG. 24 is an explanatory diagram schematically showing a configuration of the semiconductor laser module in accordance with a thirteenth embodiment of the present invention.

As shown in FIG. 24, what is characteristic of the thirteenth embodiment is that a plurality (two pieces are given in an example in FIG. 24) of prisms 5a, 5b are disposed in the optical-axis direction. The prisms 5a, 5b have flat input surfaces for inputting the two laser beams K1, K2 and flat output surfaces formed in non-parallel to the input surfaces. Namely, the prism 5a is formed with the input and output surfaces, and the prism 5b is likewise formed with the input and output surfaces. Other than this point, this embodiment is substantially the same as the semiconductor laser module in the first embodiment. According to the thirteenth embodiment, the two laser beams K1, K2 can be collimated by the prisms with high accuracy. Note that when the two prisms are used, there is performed the wavelength synthesization using the semiconductor laser device exemplified in each of the sixth through ninth embodiments.

(Fourteenth Embodiment)

Figure 25:
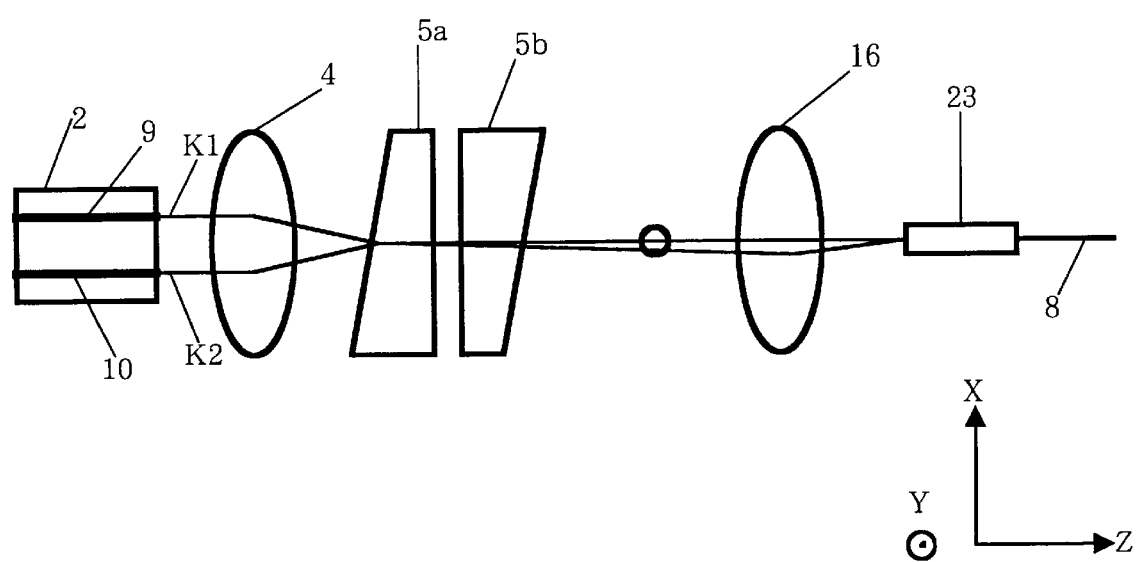
FIG. 25 is an explanatory diagram schematically showing a configuration of the semiconductor laser module in accordance with a fourteenth embodiment of the present invention.

FIG. 25 is an explanatory diagram schematically showing a configuration of the semiconductor laser module in accordance with a fourteenth embodiment of the present invention.

As shown in FIG. 25, the fourteenth embodiment involves the use of the same prisms 5a, 5b as those in the thirteenth embodiment and has such a characteristic that the incident surface of the prism 5a is disposed in a position where the first and second laser beams K1, K2 penetrating the first lens 4 are substantially overlapped with each other. Other than this point, this embodiment is substantially the same as the semiconductor laser module in the first embodiment. According to the fourteenth embodiment, the two laser beams K1, K2 penetrating the prisms 5a, 5b and substantially overlapped with each other are incident upon the condenser lens 6, and therefore the PBC 7 is unnecessary, thereby obtaining a more simplified configuration. Note that the prisms 5a, 5b are herein defined as wavelength synthesizing elements.

Further, the length of the semiconductor laser module in the optical axial direction can be reduced, and it is therefore possible to decrease the influence of the warp of the package upon the optical output characteristic in the high-temperature state.

The semiconductor laser device 2 with the diffraction gratings can be used suitably in this configuration.

(Fifteenth Embodiment)

Figure 26:
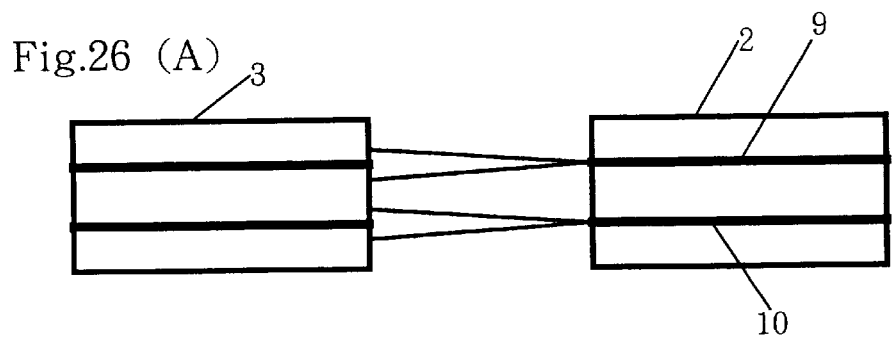
FIG. 26 is an explanatory diagram showing an example of a photo diode (light receiving element) in accordance with a fifteenth embodiment of the present invention.
Figure 26:
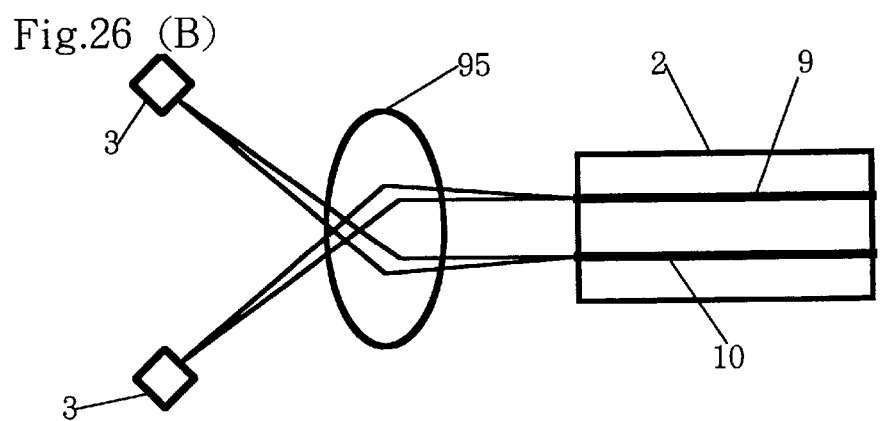
Figure 26:
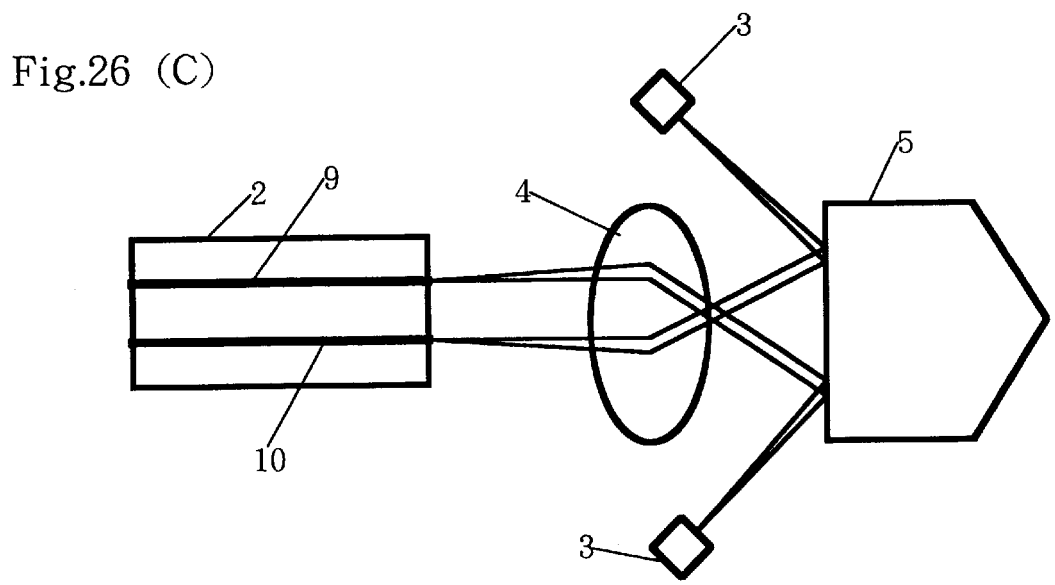

FIGS. 26(A) to 26(C) are explanatory diagrams showing an example of the photo diode (the light receiving element) 3 in accordance with a fifteenth embodiment of the present invention.

The photo diode 3 may be, as shown in FIG. 26(A), a waveguide type light receiving element for receiving the beams emitted from the rear-sided edge surfaces of the stripes 9, 10 of the semiconductor laser device 2.

Further, a plurality of photo diodes 3 may be, as shown in FIG. 26(B), provided for receiving and monitoring the respective beams emitted from the other-sided edge surfaces of the stripes 9, 10 of the semiconductor laser device 2. In this case, it is preferable that a lens 95 for splitting the laser beams emitted from the semiconductor laser device 2 so as to have a divergence, be disposed between the semiconductor laser device 2 and the photo diode 3.

Further, the photo diode 3 may receive and monitor the beams reflected by the PBC 7 as shown in FIG. 26(C).

Based on a result of monitoring by the photo diode 3 as shown in FIGS. 26(A), 26(B), 26(C), for instance, an APC (auto power control) circuit adjust a quantity of the drive current supplied to the semiconductor laser device 2, thereby controlling the optical output at a constant level.

According to the configuration described above, the APC can be effected on the two stripes independently, and the laser beams K1, K2 can also be kept at an arbitrary light intensity balance.

(Sixteenth Embodiment)

FIGS. 27(A) and 27(B) are explanatory diagrams schematically showing a configuration of the semiconductor laser module in accordance with a sixteenth embodiment of the present invention.

As shown in FIG. 27(A), the semiconductor laser module in the sixteenth embodiment includes the semiconductor laser device 2, having the plurality of stripes 9, 10 (two stripes in an example shown in FIG. 27) formed with a space, for emitting the plurality of laser beams K1, K2 from the front-sided edge surfaces of the stripes 9, 10. The semiconductor laser module further includes the first lens 4 for converging the plurality of laser beams emitted from the semiconductor laser device on a different focal point, a prism 97 serving as a beam synthesizing element for synthesizing the plurality of laser beams traveling through the first lens 4, and the optical fiber 8 for receiving the laser beams emerging from the prism 97 and letting the beams travel outside.

The stripes 9, 10 of the semiconductor laser device 2 include the diffraction gratings 75 described above, and the laser beams are emitted with different wavelengths from the stripes 9, 10.

The sixteenth embodiment involves, as shown in FIG. 27(B), the use of a wedge-shaped prism as the prism 97. The incident surface of this wedge-shaped prism is provided with a wavelength selection filter 97a that reflects or transmits the beam in accordance with the wavelength. The wavelength selection filter 97a is constructed of, e.g., dielectric multilayers. The wavelength selection filter 97a reflects the first laser beam K1 and transmits the second laser beam K2.

Figure 28:
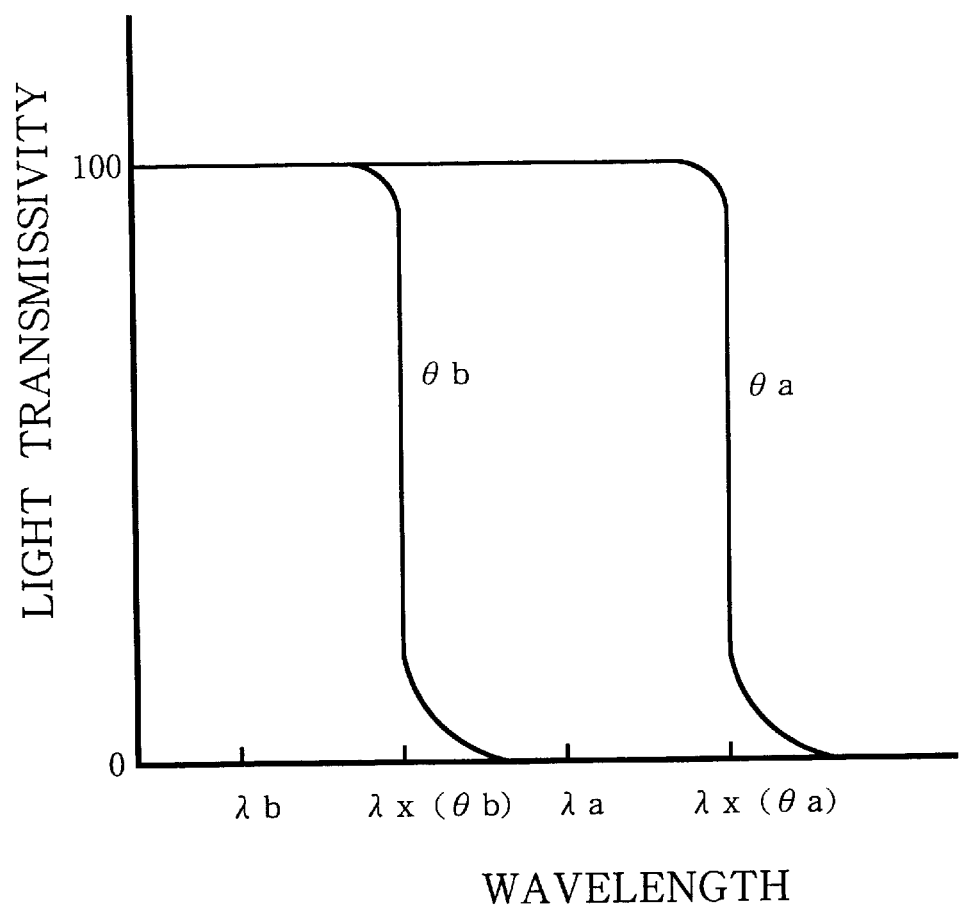

FIG. 28 is a graph showing a beam transmissivity when the beams enter the wavelength selection filter 97a. As shown in FIG. 28, the beam transmissivity differs depending on a difference in an incident angle upon the wavelength selection filter 97a. When the incident angle is θb, the filter 97a transmits almost 100% of the incident beams of which the wavelength is λx(θb) or less, and reflects almost 100% of the incident beams of which the wavelength is longer than λx(θb). Further, when the incident angle is θa, the filter 97a transmits almost 100% of the incident beams of which the wavelength is λx(θa) or less, and reflects almost 100% of the incident beams of which the wavelength is longer than λx(θa).

Moreover, the exit surface of the wedge-shaped prism is provided with a total reflection layer 97b that reflects the beams of all the wavelengths, and a reflection preventive layer 97c that prevents the beam reflection.

According to the sixteenth embodiment, the wavelength of the laser beam K1 is set to λa, the incident angle of the laser beam K1 upon the wavelength selection filter 97a is set to θa, the wavelength of the laser beam K2 is set to λb, and the incident angle of the laser beam K2 upon the wavelength selection filter 97a is set to θb.

The first laser beam K1, when entering the first input part $I_1$ of the wavelength selection filter 97a at the angle θa, penetrates it at an angle θ'a and at a refractive index Np. Then, the first laser beam K1 is reflected at an angle θs (θa+wedge angle Ψ) from the total reflection layer 7b (the reflection part) and reaches the first input part $I_1$ for the second laser beam K2.

The second laser beam K2, when entering the second input part 12 of the wavelength selection filter 97a at the angle θb, penetrates it at the angle θ'b and at the refractive index Np. The reflected first laser beam K1 is reflected at an angle θ'b (2θs+wedge angle Ψ) from the second input part 12 of the wavelength selection filter 97a. Therefore, the first and second laser beams K1, K2 are synthesized. The synthesized laser beam (K1+K2) travels through the output part O of the reflection preventive layer 97c.

The optical module in the sixteenth embodiment is designed based on, e.g., the following numerical values and can be thereby embodied.

Ψ=1°, θ'a=8°, θ'b=10°, Np=1.5, θa=12.050°, θb=15.098°, an angle αa (made by the optical axis C of the first lens 4 and the first laser beam K1)=(θa-θb)/2=-1.524°, an angle αb (made by the optical axis C of the first lens 4 and the second laser beam K2)=(θb-θa)/2=1.524°, a first lens focal length f2=720 μm, a distance da (between the first stripe 9 and the optical axis C of the first lens 4)=-tanαa·f2=19.16 μm, a distance db (between the second stripe 10 and the optical axis C of the first lens 4)=-tanαb·f2=-19.16 μm, a thickness t (of the prism 97 in the incident position of the first laser beam K1)=1 mm, an interval Δy (between the incident positions of the first and second laser beams K1, K2)≅2(tanθa+Ψ)t≅0.462 mm, an on-optical-axis distance D (from the focal position of the first lens 4 to the edge surface of the PBC 7)≅Δy/(θb-θa)=8.7 mm, λa=1480 nm, λb=1460 nm (λx(θb)=1470 nm, λx(θa)=1486.5 nm, and a cut-off wavelength λx0 (at the incident angle of 0 degree)=1522.6 nm.

The sixteenth embodiment involves the use of the first lens 4 for converging the plurality of laser beams emitted from the semiconductor laser device 2 on the different focal point, whereby both of a beam size and an image magnification are reduced, and positional and angular tolerances can be enlarged. This effect is not limited to the sixteenth embodiment but common to the case where the first lens 4 is used as a converging optical system.

Next, the coupling efficiency when the laser beams emitted from the semiconductor laser device 2 are coupled to the optical fiber, will be considered based on the Gaussian beam approximation. What may be considered in this case is the coupling of the beam emitted from the semiconductor laser device 2 and projected by the first lens 4 and the beam emerging from the optical fiber 8 and projected by the second lens 16. Focal lengths of the lenses 4, 16 are selected so that mode field radii of the respective projected beams are equalized.

Figure 32:
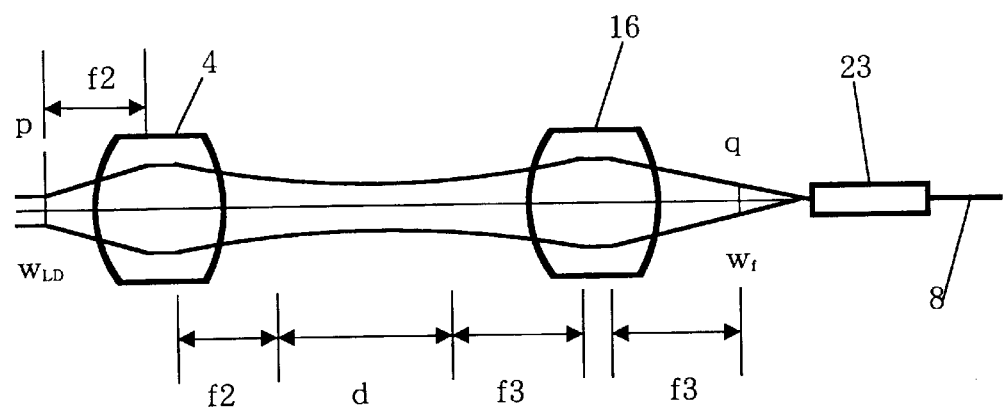
FIG. 32 is an explanatory diagram showing coupling of Gaussian beams.

Referring to FIG. 32, f2 is a focal length of the first lens 4, f3 is a focal length of the second lens 16, $w_{LD}$ is a mode filed radius of a point p spaced with the focal length f2 of the first lens 4, $w_f$ is a mode filed radius of a point q spaced with the focal length f3 of the second lens 16, i.e., an interval between the focal positions of the first lens 4 and the second lens 16.

The image magnification M is given such as M≅$w_f/w_{LD}$=f2/f3, and hence, if $w_f$=5 μm and $w_{LD}$=1.7 μm, f2=720 μm, f3 is given such as f3=2100 μm.

In this case, the mode filed radius of the beams emitted from the semiconductor laser device 2 and the optical fiber 8 and projected by the first lens 4 and the second lens 16, is 198 μm. An axial deviation tolerance at this time is substantially equal to a deviation in the case of 200 μμm.

Especially for synthesizing the two laser beams of the laser of which a maximum angle difference as strict as Δθ=0.013°, it is required that a maximum angle difference between the beams be set on the order of 0.013°. For attaining this, the respective elements may be manufactured so that the wedge angle Ψ=1+0.0013°, da=-db=19.16±0.03 μm. f2=720±0.7 μm. The coupling efficiency of each of the stripes 9, 10 to the optical fiber 8 can be thereby set to 80% or greater.

(Seventeenth Embodiment)

FIGS. 29(A) and 29(B) are explanatory diagrams schematically showing a configuration of the semiconductor laser module in accordance with a seventeenth embodiment of the present invention.

Figure 29:
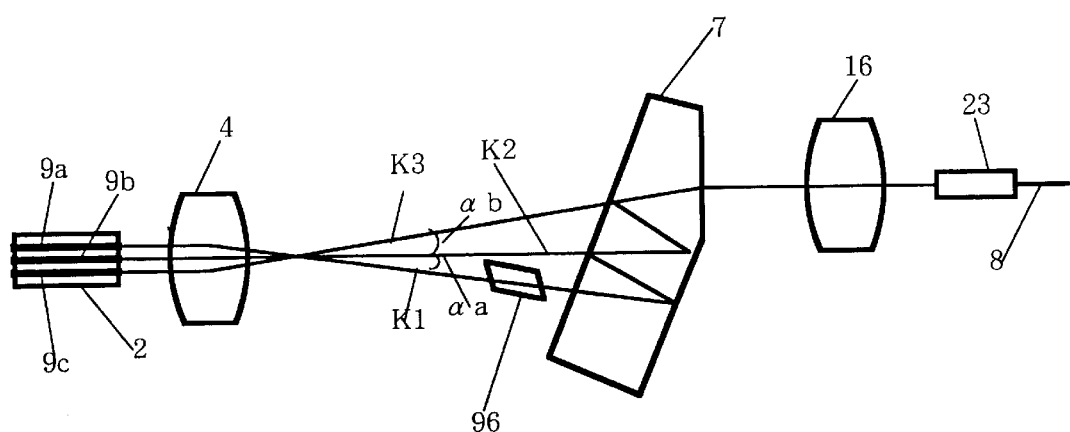
FIG. 29 is an explanatory diagram schematically showing a configuration of the semiconductor laser module in accordance with a seventeenth embodiment of the present invention.
Figure 29:
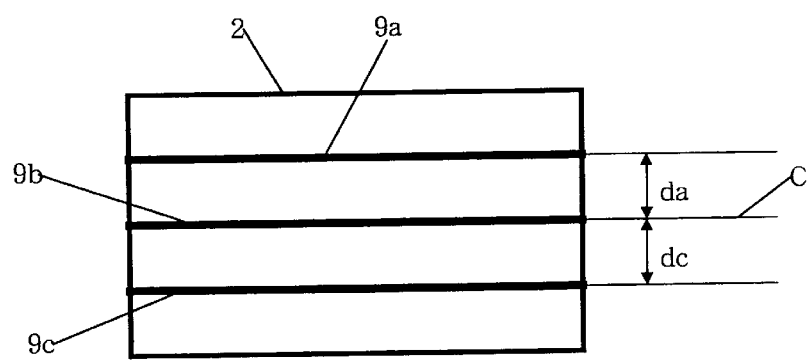

As shown in FIG. 29(A), the semiconductor laser module in the seventeenth embodiment includes the semiconductor laser device 2, having the plurality of stripes 9a, 9b, 9c (three stripes in an example shown in FIG. 29) formed with a space, for emitting the plurality of laser beams K1, K2, K3 from the front-sided edge surfaces of the stripes 9a, 9b, 9c. The semiconductor laser module further includes the first lens 4 for converging the plurality of laser beams emitted from the semiconductor laser device on a different focal point, the prism 97 for synthesizing the plurality of laser beams traveling through the first lens 4, and the optical fiber 8 for receiving the laser beams emerging from the prism 97 and letting the beams travel outside.

The stripes 9a, 9b, 9c of the semiconductor laser device 2 include the diffraction gratings 75 described above, and the laser beams are emitted with different wavelengths from the stripes 9a, 9b, 9c.

Figure 30:
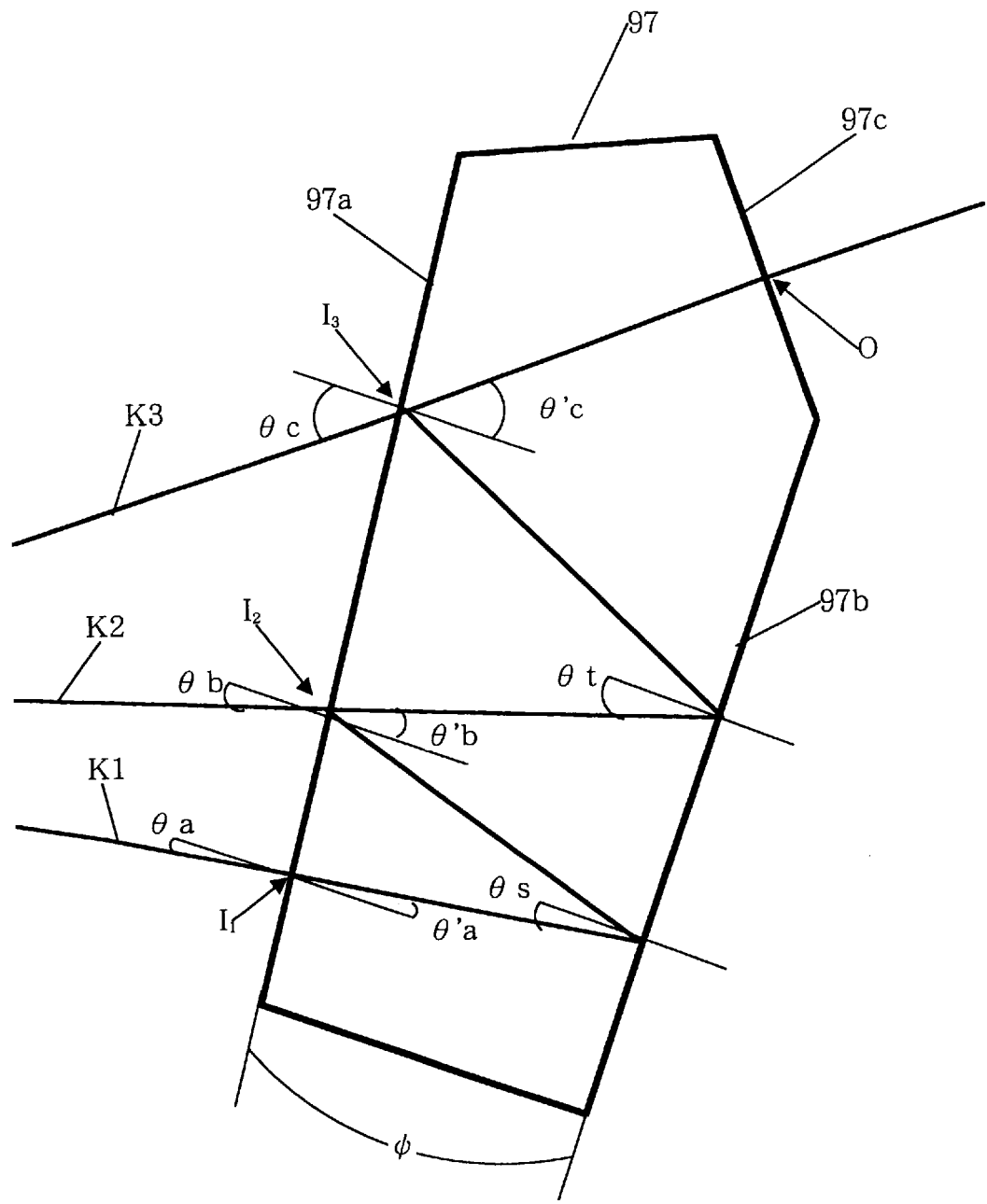
FIG. 30 is an explanatory diagram showing a PBC (polarization beam combiner) of a wedge-shaped prism.

Further, as shown in FIG. 30, the exit surface of the wedge-shaped prism is provided with the total reflection layer (reflection part) 97b for reflecting the beams of all the wavelengths, and a reflection preventive layer (output part) 97c for preventing the reflection.

According to the seventeenth embodiment, the wavelength of the laser beam K1 is set to λa, the incident angle of the laser beam K1 upon the wavelength selection filter 97a is set to θa, the wavelength of the laser beam K2 is set to θb, the incident angle of the laser beam K2 upon the wavelength selection filter 97a is set to θb, the wavelength of the laser beam K3 is set to λc, and the incident angle of the laser beam K3 upon the wavelength selection filter 97a is set to θc.

The first laser beam K1, when entering the first input part $I_1$ of the wavelength selection filter 97a at the angle θa, penetrates it at the angle θ'a and at the refractive index Np. Then, the first laser beam K1 is reflected at an angle θs (θa+wedge angle ψ) from the total reflection layer 7b (the reflection part) and reaches the first input part $I_1$ for the second laser beam K2.

The second laser beam K2, when entering the second input part 12 of the wavelength selection filter 97a at the angle θ'b, penetrates it at the angle θ'b and at the refractive index Np. The reflected first laser beam K1 is reflected at the angle θ'b (θs+wedge angle ψ) from the wavelength selection filter 97a, and therefore the first and second laser beams K1, K2 are synthesized. The synthesized laser beam (K1+K2) is reflected at an angle θt (θ'b+wedge angle ψ) from the total reflection layer 97b and reaches a third input part $I_3$ for the third laser beam K3.

The third laser beam K3, when entering the third input part $I_3$ of the wavelength selection filter 97a at the angle θc, penetrates it at the angle θ'c and at the refractive index Np.

The reflected synthesized laser beam (K1+K2) is reflected at an angle θ'c (θt+wedge angle ψ) from the third input part $I_3$ of the wavelength selection filter 97a, and hence the third laser beam K3 and the synthesized laser beam (K1+K2) are synthesized. The synthesized laser beam (K1+K2+K3) penetrates the reflection preventive layer 97c.

According to the seventeenth embodiment, a light path correction prism 96 for correcting the light path of the first laser beam K1 is disposed in front of the prism 97 (see FIG. 31).

The light path correction prism 96 is capable of correcting axial deviations

Δx, Δy, Δθ, Δz) of the Gaussian beams. Herein, the following relationships are established:

Sinθp=Ncsinθ'
Δy=L·tan(θp−ep')/(1−tan(θp−θp')tanθp)≅Lθ(rad)·(1−1/N), and
Δz≅(1−1/Nc)L where L is the length of the light path correction prism 96 in the optical axis direction, θp is the incident angle, θp' is the exit angle, and Nc is the refractive index. With respect to the axial deviation Δx, the light path correction prism 96 corrects the incident position of the first laser beam K1. Further, an incident position Δy1 can be minutely adjusted by rotating the light path correction prism 96. An incident position Δy2 can be adjusted by moving forward and backward the light path correction prism 96.

With respect to Δθ, when Ψ=1±0.05°, a maximum difference between the distances da and dc is set to ±0.1 μm, whereby the laser beams can be multiplexed at a low loss without any adjustment.

With respect to Δz, the reflection occurs a plurality of times at the wedge-shaped prism, and therefore the beam converging point of every laser beam differs. If the light path correction prism 96 is not inserted, there occurs a light path difference on the order of 2.5 mm between the first and third laser beams K1, K3.

According to the seventeenth embodiment, the light path correction prism 96 is inserted, whereby the difference in the light path length can be substantially completely corrected. Similarly, the light path correction prism 96 for the second laser beam K2 may be inserted, thereby correcting difference in the light path length.

According to the seventeenth embodiment, the light path correction prism 96 is provided on the light path for the laser beam, and hence, even if the maximum difference between the elements is comparatively slackened, it is possible to obtain approximately 80% or more of the optical coupling of each laser beam to the optical fiber 8.

Note that the first lens 4 widens the divergence between the plurality of laser beams which are independent without being overlapped with each other, and therefore the light path correction prism 96 can be inserted in the seventeenth embodiment.

The optical module in the seventeenth embodiment is designed based on, e.g., the following numerical values and can be thereby embodied.

The light path for the second laser beam K2 is coincident with the central axis C of the first lens 4.

Ψ=1°, θ'a=8°, θ'b=10°, θ'c=12°, Np=1.5, θa=12.050°, θb=15.10°, θc=18.17°, the angle αa (made by the optical axis C of the first lens 4 and the first laser beam K1)=θa−θb=−3.05°, the angle αc (made by the optical axis C of the first lens 4 and the third laser beam K3)=θc−θa=3.07°, the first lens focal length f2=720 μm, the distance da (between the first stripe 9a and the optical axis C of the first lens 4)=−tanαa·f2=−38.4 μm, a distance dc (between the third stripe 9c and the optical axis C of the first lens 4)=−tanαb f2=38.6 μm, a thickness t (of the prism 97 in the incident position of the first laser beam K1)=1 mm, an interval Δy1 (between the incident positions of the first and second laser beams K1, K2)≅2(tanθa+ψ)t≅0.462 mm, an interval Δy2 (between the incident positions of the second and third laser beams K2, K3)≅2(tanθa+2ψ/cos²θa+ψ)t≅0.535 mm, an on-optical-axis distance D (from the focal position of the first lens 4 to the edge surface of the prism 97)≅Δy2/(θc−θb) (rad)=10.0 mm, λa=1490 nm, λb=1470 nm, λc=1450 nm (λx (θc)=1460 nm, λx(θb)=1483.57 nm, λx(θa)=1502,77 nm, and the cut-off wavelength λx0 (at the incident angle of 0 degree)=1536.62 nm.

Further, in the light path correction prism 96, when Δy=D (θb−θa) (rad)−Δy1=0.070 nm, L=3.5 nm and Nc=3.4 (silicon), the prism incident angle θ≅1.25° and a light path length reduction Δz≅(1−1/Nc)L≅2.5 nm.

In the case of generalizing the sixteenth and seventeenth embodiments, when the laser beams having first to n-th wavelengths are emitted from the first to n-th (n is an integer that is 2 or larger) stripes of the semiconductor laser device 2, the prism 97 includes first to nth input parts upon which the laser beams of the first through n-th wavelengths are incident, a reflection part for totally reflecting the laser beams, and an output part. The i-th (i includes all the integers of 2 to n) input parts and the reflection part function such that the (i−1)th beam entering the light synthesizing element from the (i−1)th input part is reflected by the reflection part toward the i-th input part and further reflected within the i-th input part in the traveling direction of the beam of the i-th wavelength, and synthesized with the beam of the i-th wavelength. The synthesized beams having the first to n-th wavelengths are coupled to the optical fiber via the output part.

(Eighteenth Embodiment)

An eighteenth embodiment is that of the semiconductor laser module exemplified in one of the first through seventeenth embodiments, as applied to a Raman amplifier.

Figure 33:
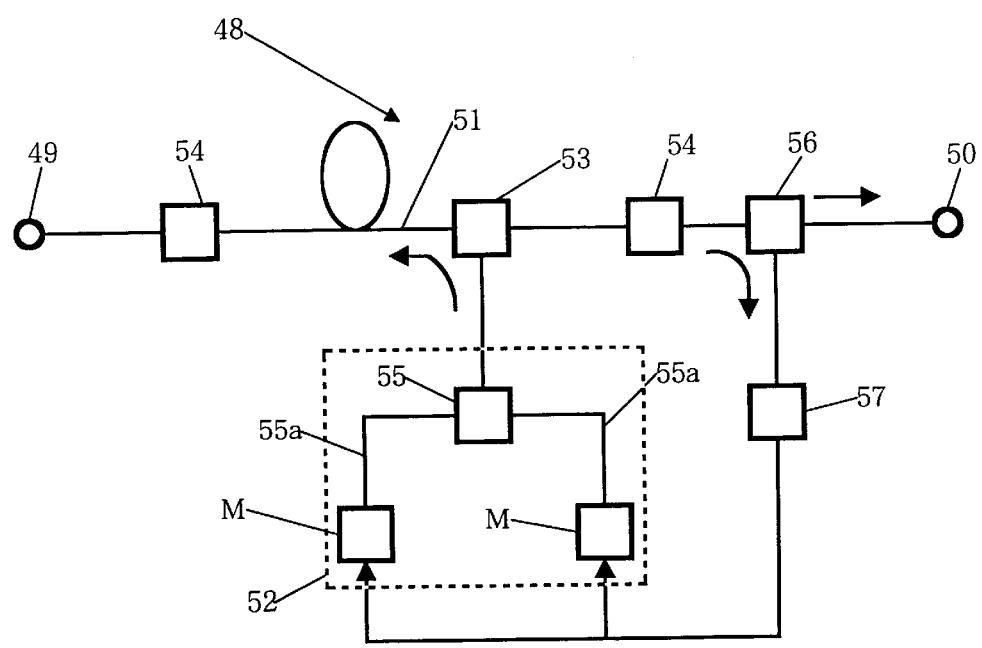
FIG. 33 is a block diagram showing a configuration of a Raman amplifier in accordance with a twelfth embodiment of the present invention.

FIG. 33 is a block diagram showing a configuration of the Raman amplifier shown in the twelfth embodiment of the present invention. This Raman amplifier is used in, e.g., a WDM communication system. As shown in FIG. 33, a Raman amplifier 48 includes an input unit 49 for inputting the signal beam, an output unit 50 for outputting the signal beam, an optical fiber (amplification fiber) 51 through which the signal light is transmitted between the input unit 49 and the output unit 50, a pumping beam generating unit 52 for generating the pumping beam, and a WDM coupler 53 for multiplexing the pumping beam generated by the pumping beam generating unit 52 with the signal beam transmitted through the optical fiber (amplification fiber) 51, and optical isolators 54 that transmit only the signal beam traveling from the input unit 49 toward the output unit 50, are provided between the input unit 49 and the WDM coupler 53 and between the output unit 50 and the WDM coupler 53.

The pumping beam generating unit 52 includes a plurality semiconductor laser modules for emitting the laser beams having wavelength ranges different from each other in the eighteenth embodiment, and a WDM coupler 55 for synthesizing the laser beams emitted from the semiconductor laser modules M.

The pumping beams emitted from the semiconductor laser modules M are synthesized by the WDM coupler 55 through a polarization retaining fiber 55a, and exit the pumping beam generating unit 52.

The pumping beams generated by the pumping beam generating unit 52 are coupled to the optical fiber 51 by the WDM coupler 53. The signal beams inputted from the input unit 49 are multiplexed with the pumping beams and amplified in the optical fiber 51, then travel through the WDM coupler 53 and are outputted from the output unit 50.

The signal beams (amplified signal beams) amplified within the optical fiber 51 are inputted to a monitor beam distribution coupler 56 via the WDM coupler 53 and the optical isolators 54. The monitor beam distribution coupler 56 emits some proportion of the amplified signal beams to a control circuit 57, and the remaining amplified signal beams are outputted as emission laser beams from the output unit 50.

The control circuit 57 controls a laser emission state, e.g., a light intensity of each semiconductor laser module M on the basis of some amplified signal beams inputted, and performs feedback control so that a gain band of the optical amplification comes to have a flat characteristic.

In this Raman amplifier 48, if the semiconductor laser module incorporating the semiconductor laser device with the diffraction gratings 75 provided within the stripes is used, the FBG for the laser oscillation stabilization, is not wanted. As a result, it is possible to reduce both of the size and weight of the Raman amplifier and also the cost thereof.

Further, this Raman amplifier can reduce a greater amount of relative intensity noises (RIN) than by the semiconductor laser module using FBG and is therefore capable of restraining the fluctuation in the Raman gain and performing stable Raman amplification.

Moreover, the Raman amplifier is easier to align the optical axis than by the semiconductor laser module using FBG and is therefore capable of improving an assembling characteristic and, with no mechanical optical coupling within the resonator, enhancing the stability and the reliability of the Raman amplification also in terms of this point.

Furthermore, the semiconductor laser device with the diffraction gratings 75 provided in the stripes has the plurality of oscillation modes, and is therefore capable of emitting the high-output pumping beams without causing the stimulated Brillouin scattering, whereby the stable and high Raman gain can be obtained.

Further, the Raman amplifier shown in FIG. 33 is categorized as a rear optical pumping type, however, as discussed above, the semiconductor laser module emits the stable pumping beams. Hence, the Raman amplifier is, regardless of whether a front optical pumping type or a bidirectional optical pumping type, capable of performing the stable Raman amplification.

Figure 34:
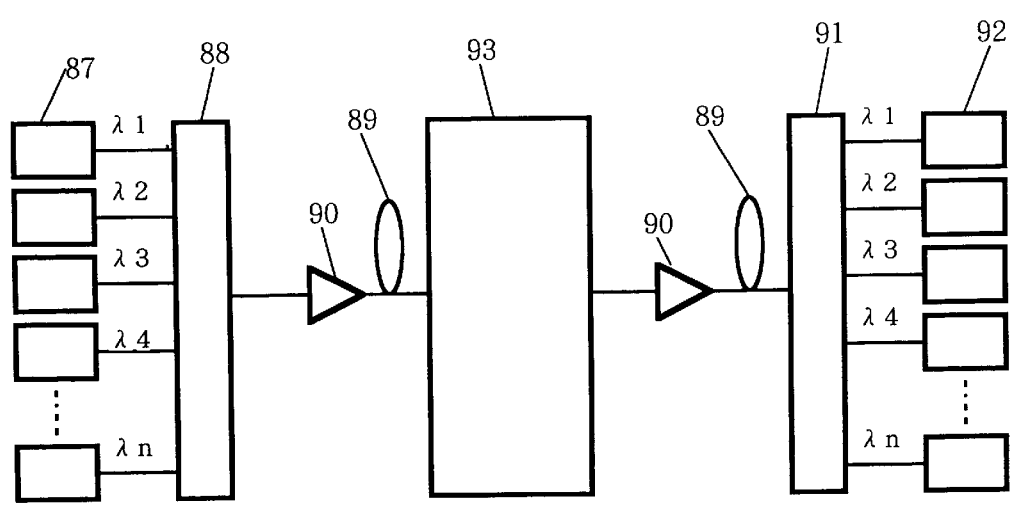
FIG. 34 is a block diagram showing an architecture of a WDM communication system to which the Raman amplifier shown in FIG. 23 is applied.

The Raman amplifier sown in FIG. 33 can be, as explained above, applied to the WDM communication system. FIG. 34 is a block diagram showing architecture of the WDM communication system to which the Raman amplifier shown in FIG. 33 is applied.

Referring to FIG. 34, the optical signals having wavelengths λ1 to λn that are transmitted from a plurality of transmitters 87, are multiplexed by an optical multiplexer 88 and converged at one length of optical fiber 89. A plurality of Raman amplifiers 90 each corresponding to the Raman amplifier shown in FIG. 33 are disposed according to a distance on the transmission path of the optical fiber 89, and amplify attenuated optical signals. The signals transmitted on the optical fiber 89 are demultiplexed by an optical demultiplexer 91 into optical signals having the plurality of wavelength λ1 to λn, and received by a plurality of receivers 92. Note that an ADM (Add/Drop Multiplexer) 93 for adding and fetching the optical signal having an arbitrary wavelength might be provided on the optical fiber 89.

The present invention can be modified in many forms within the range of the technical items set forth in the following claims without being limited to the embodiments discussed above.

In the semiconductor laser modules M in the embodiments discussed above, the semiconductor laser device 2 and the holder member 14 are cooled by the same cooling device 20, however, the temperatures of the semiconductor laser device 2 and the holder member 14 may be controlled independently by use of separate cooling devices.

Further, the polarization rotating element involves the use of the half-wave plate 6, however, the polarizing plane may be rotated by use of, for instance, the Faraday element. In this case, the Faraday element is disposed inwardly of the coil, and an intensity of a magnetic field applied to the Faraday element is set variable corresponding to a magnitude of the electric current flowing through the coil. With this arrangement, a fluctuation in the wavelength of the laser beam and a fluctuation in the rotational angle of the polarizing plane due to a fluctuation in the temperature, can be individually compensated by adjusting the magnitude of the electric current flowing through the coil.

Moreover, it is obvious that the semiconductor laser module in each of the embodiments discussed above can be used as not only the pumping light source for the Raman amplification but also, for example, a 0.98 μm EDFA pumping light source. Moreover, the semiconductor laser module in each of the embodiments of the present invention can be used as a signal light source.

Further, the number of the stripes formed in the present semiconductor laser device 2 is not limited to 2 or 3 but may be 4 or more.

According to the present invention, since one semiconductor laser device provided with a plurality of stripes for emitting laser beams and a single first lens for splitting the plurality of laser beams are used, a time for positioning of the semiconductor laser device and the first lens is shortened. As a result, a time for manufacturing a semiconductor laser module can be reduced.

Further, conventionally, since beams are emitted in a completely different axial directions from two semiconductor laser devices respectively, unless the module is designed considering a warp or the like of a package in the respective axial directions, it is impossible to suppress an optical output fluctuation due to a warp of a package caused by a change of the ambient temperature and the like. In contrast, according to the present invention, since a plurality of beams emitted from one semiconductor laser device is propagated in the substantially same direction, an influence of a warp of a package is suppressed only in one direction, whereby stabilization of an optical output emitted from an optical fiber can be achieved.

Further, by emitting a plurality of laser beams from one semiconductor laser device, the plurality of laser beams fluctuates with respect to a warp of a package and the like, showing a tendency of having the same coupling efficiency with an optical fiber. Accordingly, even in the case where a temperature fluctuation and the like occur, a degree of polarization of the beam emitted from the optical fiber is stabilized.

Further, since one semiconductor laser device is used, it is possible to miniaturize a cooling device such as a Peltier module for cooling the heat generated from the semiconductor laser device, whereby the low electric power consumption can be realized.

Further, since a first lens for converging a plurality of laser beams emitted from the semiconductor laser device on a different focal point, a beam diameter and an image magnification is reduced and thus a tolerance for the position and angle is made less strict.

Further, since diffraction gratings are provided in respective stripes of the semiconductor laser device, by combining the diffraction gratings arbitrarily and forming the respective stripes, a degree of freedom for setting up the wavelengths of the beams outputted from the semiconductor laser module is increased.

When the semiconductor laser module of the present invention is employed as a pumping light source used for the Raman amplification, the following effects can be obtained.

Since diffraction gratings are provided in respective stripes of the semiconductor laser device, wavelengths can be stabilized, a relative intensity noise is reduced in comparison with the semiconductor laser module using the fiber grating. In particular, in the case where the semiconducor laser module of the present invention is used in the Raman amplifier of a forward pumping method, the Raman amplification with less noise can be performed.

Further, since a resonator is not physically separated, an oscillation characteristic of the laser is hard to change due to a mechanical vibration and the like and thus it is possible to output a stable laser beam with high reliability. Therefore, it is possible to conduct a stable and highly reliable Raman amplification in the case where the semiconductor laser module of the present invention is used in the Raman amplifier.

Further, since a wavelength lock is performed by the diffraction gratings inside the semiconductor laser device, it is possible to easily incorporate an optical isolator for suppressing incidence of a reflection return beam from an optical fiber which leads the outputted laser beam.

In addition to the above, the present invention has the following effects.

It is possible to conduct wavelength synthesizing by using one semiconductor laser device.

Furthermore, by providing a plurality of stripes whose wavelengths have a slight difference, a width of a wave-coupled spectrum is widened, thereby facilitating suppression of occurrence of SBS and further reduction of DOP.

Furthermore, in the case where a polarization conserved fiber is used as an optical fiber and its polarization conserved axis is deviated from a polarizing plane by 45 degrees and optically coupled with the laser beam, it is possible to effectively perform further reduction of DOP.

Obviously, additional numerous modifications and variations of the present invention are possible in light of the above teachings. It is therefore to be understood that within the scope of the appended claims, the present invention may be practiced otherwise than as specifically described herein.

What is claimed is:

1. A semiconductor laser device comprising:
   a substrate;
   an active layer formed over said substrate;
   a first light emitting stripe formed over said active layer and having a diffraction grating and aligned to emit a first laser beam through one edge surface of the active layer; and
   at least one other light emitting stripe formed over said active layer and having another diffraction grating and aligned to emit at least one other laser beam through the one edge surface of the active layer.

2. The semiconductor laser device according to claim 1, wherein:
   the first light emitting stripe is configured to emit light from the first laser beam through the one edge surface and an opposite edge surface; and
   the least one other light emitting stripe is configured to emit light from the at the least one other laser beam through the one edge surface and the opposite edge surface.

3. The semiconductor laser device according to claim 1, wherein:
   the first light emitting stripe and the at least one other light emitting stripe extend parallel to each other.

4. The semiconductor laser device according to claim 3, wherein:
   the at least one other light emitting stripe includes only a second light emitting stripe in the semiconducting laser device.

5. The semiconductor laser device according to claim 4, wherein:
   the first light emitting stripe and the second light emitting stripe are separated by not more than 100 $\mu$m.

6. The semiconductor laser device according to claim 1, wherein:
   the first light emitting stripe and the at least one other light emitting stripe are inclined relative to each other.

7. The semiconductor laser device according to claim 1, wherein:
   the first light emitting stripe and the at least one other light emitting stripe are configured to be driven simultaneously.

8. The semiconductor laser device according to claim 1, wherein:
   the first light emitting stripe and the at least one other light emitting stripe are configured to be driven independently in a way that electrically insulates at least one side of a positive pole and a negative pole of the first light emitting stripe and the at least one other light emitting stripe.

9. The semiconductor laser device according to claim 1, wherein:
   the semiconducting laser device is an InP-series buried heterostructure laser.

10. The semiconductor laser device according to claim 1, wherein:
    the semiconducting laser device is a GaAs-series ridge waveguide laser.

11. The semiconductor laser device according to claim 1, wherein:
    the semiconducting laser device is configured to operate as a pumping light source in an inclusive range of 1300 nm through 1550 nm for a Raman amplifier.

12. The semiconductor laser device according to claim 1, wherein:
    the semiconducting laser device is configured to operate as a pumping light source in at least one of a 980 nm band and a 1480 nm band for an EDFA.

13. The semiconductor laser device according to claim 1, wherein:
    at least one of the diffraction grating and the another diffraction grating is disposed uniformly across an entire cavity length of the semiconductor device.

14. The semiconductor laser device according to claim 1, wherein:

at least one of the diffraction grating and the another diffraction grating extend along a cavity length of the semiconductor device in an inclusive range of 800 μm through 3200 μm and is configured to produce a plurality of longitudinal oscillation wavelengths within a predetermined wavelength band.

15. The semiconductor laser device according to claim 1, wherein:

at least one of the diffraction grating and the another diffraction grating is disposed uniformly across at least one portion, but not an entire length, of a cavity length of the semiconductor device.

16. The semiconductor laser device according to claim 1, wherein:

at least one of the diffraction grating and the another diffraction grating includes at least two periods.

17. The semiconductor laser device according to claim 14, wherein:

the diffraction grating of the first light emitting stripe and the diffraction grating of the at least one other light emitting stripe are configured so that a wavelength emitted by the first light emitting stripe and a wavelength emitted by the at least one other light emitting stripe are substantially the same.

18. The semiconductor laser device according to claim 14, wherein:

the diffraction grating of the first light emitting stripe and the diffraction grating of the at least one other light emitting stripe are configured so that a wavelength emitted by the first light emitting stripe and a wavelength emitted by the at least one other light emitting stripe are different.

19. The semiconductor laser device according to claim 14, wherein:

the first light emitting stripe and the at least one other light emitting stripe are configured to be driven independently in a way that electrically insulates at least one side of a positive pole and a negative pole of the first light emitting stripe and the at least one other light emitting stripe.

20. A single semiconducting laser device, comprising:

means for producing a first laser beam from a semiconductor structure;

means for producing at least one other laser beam from the semiconductor structure; and means for stabilizing a wavelength in the first laser beam and the at least one other laser beam.

21. A single semiconducting laser device according to claim 20 further comprising:

means for producing the first laser beam and the at least one other laser beam each with a plurality of longitudinal oscillation wavelengths within a predetermined wavelength band.

22. A single semiconducting laser device according to claim 20, further comprising:

means for emitting the first laser beam and the at least one other laser beam with a wavelength substantially the same.

23. A single semiconducting laser device according to claim 20, further comprising:

means for emitting the first laser beam and the at least one other laser beam with a different wavelength.

24. A single semiconducting laser device according to claim 20, further comprising:

means for driving the first laser beam and the at least one other laser beam with a common power source.

25. A single semiconducting laser device according to claim 20, further comprising:

means for driving the first laser beam and the at least one other laser beam with different power sources.

26. An optical amplifier comprising:

a pump beam generator having a plurality of semiconductor laser modules configured to emit multiplexed laser beams, with each of the plurality of semiconductor laser modules having a single semiconductor laser device including
    a substrate,
    an active layer formed over said substrate,
    a first light emitting stripe formed over said active layer with a diffraction grating and aligned to emit a first laser beam through one edge surface of the active layer, and
    at least one other light emitting stripe having another diffraction grating and aligned to emit at least one other laser beam through the one edge surface of the active layer, and
an optical fiber positioned to receive a multiplexed laser beam produced therein; and a wave division multiplex coupler configured to synthesize the multiplexed laser beams emitted by the plurality of semiconductor laser modules.

27. The optical amplifier according to claim 26, wherein:

the plurality of semiconductor laser modules are each configured to emit the multiplexed laser beam at different control wavelengths.

28. The optical amplifier according to claim 26, wherein:

the pump beam generator is coupled to an amplification medium by a wave division multiplex coupler.

29. The optical amplifier according to claim 26, wherein:

said optical amplifier is configured for Raman amplification.

30. The optical amplifier according to claim 26, wherein:

the pump beam generator is coupled to a control mechanism including a monitor beam distribution coupler coupled to an amplification medium and a control circuit connected between the monitor beam distribution coupler and the pump beam generator, wherein the control mechanism is configured to control the output of the plurality of semiconductor laser modules.

31. The optical amplifier according to claim 26, wherein:

the semiconductor laser module further includes
    a first lens positioned so that the first laser beam and the at least one other laser beam emitted from the semiconductor laser device are incident thereon, the first lens configured to further separate the first laser beam and the at least one other laser beam, and
    a beam synthesizing member including
        a first input part on which the first laser beam is incident,
        at least one other input part on which the at least one other laser beam is incident, and
        an output part from which the first laser beam emerging from the first input part and the at least one other laser beam emerging from the at least one other input part are multiplexed and emitted as a multiplexed laser beam.

32. A semiconductor laser module, comprising:

a single semiconductor laser device having a substrate, an active layer formed over the substrate, a first light emitting stripe formed over the active layer with a diffraction grating and aligned to emit a first laser beam through one edge surface and at least one other light emitting stripe formed over the active layer having a diffraction grating and aligned to emit at least one other laser beam through the one edge surface;

a first lens positioned so that the first laser beam and the at least one other laser beam emitted from the semiconductor laser device are incident thereon, the first lens configured to further separate the first laser beam and the at least one other laser beam;

a beam synthesizing module including a prism and a beam synthesizing member having a
  first input part on which the first laser beam is incident,
  at least one other input part on which the at least one other laser beam is incident, and
  an output part from which the first laser beam emerging from the first input part and the at least one other laser beam emerging from the at least one other input part are multiplexed and emitted as a multiplexed laser beam; and an optical fiber positioned to receive the multiplexed laser beam therein.

33. The semiconductor laser module according to claim 32, further comprising:

an optical isolator positioned between the first lens and the beam synthesizing member where the first laser beam and the at least one other laser beam are parallel relative to each other, wherein the optical isolator is configured to stabilize the semiconductor module by preventing a laser beam reflection.

34. The semiconductor laser module according to claim 32, further comprising:

a cooling device configured to cool the semiconductor laser device; and a base plate module having a first base plate on which the semiconductor laser device is fixed and a second base plate disposed onto the first base plate and on which the beam synthesizing member is fixed.

35. The semiconductor laser module according to claim 32, further comprising:

a second lens configured to couple the multiplexed laser beam to the optical fiber.

* * * * *